United States Patent
Lau

(10) Patent No.: US 12,255,014 B2
(45) Date of Patent: Mar. 18, 2025

(54) NETWORKS AND TETHERS USING FIBER REINFORCED HIGH TEMPERATURE SUPERCONDUCTORS

(71) Applicant: LAU Superconductors Inc., Geneva (CH)

(72) Inventor: Wayne Chung Wei Lau, Geneva (CH)

(73) Assignee: LAU Superconductors Inc., Hunt Valley, MD (US)

( * ) Notice: Subject to any disclaimer, the term of this patent is extended or adjusted under 35 U.S.C. 154(b) by 1125 days.

(21) Appl. No.: 17/100,620

(22) Filed: Nov. 20, 2020

(65) Prior Publication Data

US 2021/0210672 A1 Jul. 8, 2021

Related U.S. Application Data

(60) Provisional application No. 62/941,410, filed on Nov. 27, 2019, provisional application No. 62/983,333, (Continued)

(51) Int. Cl.
*H01F 6/04* (2006.01)
*H01F 1/147* (2006.01)
(Continued)

(52) U.S. Cl.
CPC ............ *H01F 6/04* (2013.01); *H01F 1/147* (2013.01); *H01F 6/00* (2013.01); *H01F 6/06* (2013.01);
(Continued)

(58) Field of Classification Search
CPC ....... H01F 6/04; H10N 60/203; H10N 60/857
See application file for complete search history.

(56) References Cited

U.S. PATENT DOCUMENTS 3,673,444 A 6/1972 Kawabe
4,431,131 A * 2/1984 McInnes ............... G05D 23/24
236/11

(Continued)

FOREIGN PATENT DOCUMENTS

WO 2017092768 6/2017
WO 2020083840 4/2020

OTHER PUBLICATIONS

Namburi et al.: "A simple, reliable and robust reinforcement method for the fabrication of (RE)-Ba—Cu—O bulk superconductors", Superconductor Science and Technology, vol. 33, 054005, Mar. 30, 2020 (Mar. 30, 2020).

(Continued)

*Primary Examiner* — Paul A Wartalowicz
(74) *Attorney, Agent, or Firm* — Van Pelt, Yi & James LLP

(57) ABSTRACT

A device comprises a support net with nodes, wherein each node comprises a HTS photovoltaic-magnetic cell, wherein alignments of the HTS photovoltaic-magnetic cells are arranged with N-S in parallel alignment. A device comprises a tether comprising a plurality of HTS solenoids and a sheath, wherein a solenoid of the plurality of HTS solenoids comprises a high temperature superconducting material and reinforcing fiber. A device comprises propulsion ball or plate with tail, injected in propulsion channel; HTS solenoids disposed along walls of propulsion channel, wherein the propulsion ball or plate with tail are moved through the propulsion channel using magnetic field generated by HTS solenoids; and a collection channel.

12 Claims, 36 Drawing Sheets

Related U.S. Application Data filed on Feb. 28, 2020, provisional application No. 62/983,336, filed on Feb. 28, 2020.

(51) Int. Cl.

| | | |
|---|---|---|
| *H01F 6/00* | (2006.01) | |
| *H01F 6/06* | (2006.01) | |
| *H01L 31/04* | (2014.01) | |
| *H10N 60/01* | (2023.01) | |
| *H10N 60/20* | (2023.01) | |
| *H10N 60/83* | (2023.01) | |
| *H10N 60/85* | (2023.01) | |

(52) U.S. Cl.
CPC ......... *H01L 31/04* (2013.01); *H10N 60/0632* (2023.02); *H10N 60/0801* (2023.02); *H10N 60/20* (2023.02); *H10N 60/203* (2023.02); *H10N 60/83* (2023.02); *H10N 60/85* (2023.02); *H10N 60/857* (2023.02)

(56) References Cited

U.S. PATENT DOCUMENTS

| | | | | |
|---|---|---|---|---|
| 4,861,751 | A | | 8/1989 | Tenhover |
| 5,018,570 | A | | 5/1991 | Iversen |
| 5,250,861 | A | * | 10/1993 | Cummins ............. H02K 55/02 |
| | | | | 310/104 |
| 5,439,627 | A | | 8/1995 | De Jager |
| 5,589,441 | A | | 12/1996 | Baker |
| 5,776,864 | A | | 7/1998 | Todt |
| 6,258,753 | B1 | | 7/2001 | Bornemann |
| 8,659,377 | B1 | | 2/2014 | Cho |
| 9,343,213 | B2 | * | 5/2016 | Peng .................... H01F 7/0215 |
| 2002/0173428 | A1 | | 11/2002 | Thieme |
| 2004/0041565 | A1 | | 3/2004 | Kakugawa |
| 2004/0198610 | A1 | | 10/2004 | Weinstein |
| 2008/0036463 | A1 | | 2/2008 | Hsieh |
| 2010/0038986 | A1 | | 2/2010 | Hull |
| 2010/0058806 | A1 | * | 3/2010 | Jansen ..................... F03D 9/257 |
| | | | | 62/657 |
| 2012/0015817 | A1 | | 1/2012 | Allais |
| 2013/0037633 | A1 | | 2/2013 | Walter |
| 2013/0240068 | A1 | | 9/2013 | Samara-Rubio |
| 2015/0111752 | A1 | * | 4/2015 | Guina ..................... H02K 31/00 |
| | | | | 310/112 |
| 2016/0122252 | A1 | | 5/2016 | Garnier |
| 2016/0260527 | A1 | | 9/2016 | Otto |
| 2017/0307568 | A1 | * | 10/2017 | Humfeld ................ B06B 1/045 |
| 2018/0112798 | A1 | | 4/2018 | Junk |
| 2019/0077718 | A1 | | 3/2019 | Garnier |
| 2019/0157964 | A1 | | 5/2019 | Frank |

OTHER PUBLICATIONS

Mpulanandan et al.: "Stainless steel fibers in high temperature superconductor composite", Materials Research Bulletin, vol. 26, No. 9, Sep. 1991 (1991-09), pp. 951-958.

Kaounides, L. "New, Advanced and Improved Traditional Materials and Processes", Feb. 1996; United National Industrial Development Organization; [Retrieved Jul. 18, 2021]. Retrieved from Internet: <URL: https://open.unido.org/api/documents/4808411/download/NEW,%ADVANCED%20AND%20IMPROVED%20TRADITIONAL%20MATERIALS%20AND%20PROCESSES.%20ADVANCED%20MATERIALS%20TECHNOLOGY%202.%20EMERGING%20TECHNOLOGY%20SERIES%20(21722.EN)>; pp. 1-79.

Parinov, IA. "Microstructure and Properties of High-Temperature Superconductors", Aug. 2006; Springer Publication [online]. [retrieved Jul. 18, 2021]. Retrieved from the Internet: <URL: https://link.springer.com/content/pdf/10.1007%2F978-3-642-34441-1.pdf>; pp. 1-787 .; DOI: DOI 10.1007/978-3-642-34441-1.

Fair, "Electromagnetic Launch: Highway to the Stars", IEEE Transactions on Magnetics, vol. 24, No. 2, Mar. 1988.

Kolm et al., "Electromagnetic Launchers", IEEE Transactions on Magnetics, vol. MAG-16, No. 5, Sep. 1980.

Kolm et al., "An alternative launching medium", Advanced Technology: Space and Aeronautics, IEEE Spectrum, Apr. 1982.

\* cited by examiner

| Material | $T_c$ (K) | $\lambda(0)$, nm | $\xi(0)$, nm | $H_{c2}(T)$ |
|---|---|---|---|---|
| Nb-Ti | 9.5 | 240 | 4 | 13 |
| Nb-N | 16 | 200 | 5 | 15 |
| $Nb_3Sn$ | 18 | 65 | 3 | 30 |
| $MgB_2$(dirty) | 32-39 | 140 | 6 | 35 |
| $YBa_2Cu_3O_7$ | 92 | 150 | 1.5 | >100 |
| Bi-2223 | 108 | 200 | 1.5 | >100 |

NETWORKS AND TETHERS USING FIBER REINFORCED HIGH TEMPERATURE SUPERCONDUCTORS

CROSS REFERENCE TO OTHER APPLICATIONS

This application claims priority to U.S. Provisional Patent Application No. 62/941,410 entitled VARIOUS APPLICATIONS OF FIBER REINFORCED HIGH TEMPERATURE SUPERCONDUCTROS, filed 27 Nov. 2019 which is incorporated herein by reference for all purposes.

This application claims priority to U.S. Provisional Patent Application No. 62/983,333 entitled METHOD TO CREATE SUPERCONDUCTORS WITH LONG CONDUCTING AXIS USING LONGITUDINAL SEED CRYSTALS, filed 28 Feb. 2020 which is incorporated herein by reference for all purposes.

This application claims priority to U.S. Provisional Patent Application No. 62/983,336 entitled METHOD TO SUPPORT EARTH-SPACE TETHERS USING THE COMPRESSIVE STRENGTH OF A FILL MATERIAL WRAPPED IN A GRAPHENE CASING, filed 28 Feb. 2020 which is incorporated herein by reference for all purposes.

BACKGROUND OF THE INVENTION

The first high-temperature superconductor (HTS) was discovered in 1986. Its discoverers were immediately awarded the 1987 Nobel Prize in Physics partly because of expectations for rapid application. Superconductivity is the property of transmitting electricity with no or little resistance. In theory, superconducting materials can also create unlimitedly large magnetic fields.

The HTS break-through was the discovery of superconductivity in ceramic materials. Previously superconductivity was seen only in metallic superconductors which needed to be cooled below 30 K ($-243.2°$ C.) to achieve superconductivity. Such temperatures could in practice be obtained using liquid helium or liquid hydrogen which are expensive to use, increasingly rare in the case of helium, and/or dangerously explosive in the case of hydrogen. In contrast, HTS can achieve superconductivity at temperatures as high as 138 K ($-135°$ C.) and can be cooled using substances such as liquid nitrogen, which is commercially widely available, stable, and inexpensive.

Unfortunately after over three decades of intense experimental and theoretical research, with over 100,000 published papers on the subject and numerous early patents (nearly all expired), no widely accepted theory explains the properties of HTS materials, and no significant HTS applications have been found to be practical.

This reflects four problems: 1) unlike metals which are commonly used to transmit electricity, HTS ceramics are brittle making them expensive to manufacture and difficult to form into wires and other useful shapes; 2) highest performing HTSs are single crystals (bulk) superconductors where the entire sample is a single molecular lattice where superconductivity fails with the slightest lattice crack, 3) HTS do not form large, continuous superconducting domains, but clusters of micro-domains within which superconductivity occurs; and 4) the HTS production process is complicated requiring a multiple calcination of ingredients at high temperatures range from 800° C. to 950° C. for several hours following sintering, which is done at 950° C. in an oxygen atmosphere where oxygen stoichiometry is very crucial for obtaining the superconducting compound. Slow cooling in an oxygen atmosphere turns the material superconductive involving both the uptake and loss of oxygen.

The complex role of oxygen in production prohibits the use of most reinforcing materials to relieve the brittleness and cracking described in 1), 2), and 3) above. This is because nearly all potential materials, which are stable across this process' high temperature such as metals, carbon, composites, ceramics, etc., oxidize during this process which interferes with the creation of the HTS material. The oxidation either creates impurities or depletes oxygen at critical times in the production process and crystal formation.

Current attempts to find useful HTS materials focus on external reinforcement such as packing-in-tube (PIT) wire production, encasing HTS in durable materials like stainless steel, or additive processes such as attempting to apply HTS as a coating on film or tape substrates. Both PIT and external encasing are difficult to produce economically in shapes and constructions for practical applications. Techniques which attempt to grow HTS on reinforcement substrates are experimental and, to date, far from producing significantly robust HTS components for practical applications. Attempts have been made to use HTS in electrical applications such as transformers and Superconductor Fault Control Limiters where strength is not critical. But these have not yet resulted in widespread HTS use due to technical and economic reasons.

Attempts have been made to internally reinforce HTS using discontinuous metal fibers (also known as chopped fibers) and particles (Cu, Ag, Au, etc.). These have generally failed due to a) contamination during production as described in [0009] above and/or b) agglomeration of the discontinuous particles/fibers during the melt phase of production. In agglomeration sintering powders are melted into liquid form. While in liquid discontinuous reinforcement pieces can move and stick together (agglomerate) forming masses which disrupt crystal formation, and create crack and fault planes which reduces the strength of and disintegrates the final HTS crystal.

BRIEF DESCRIPTION OF THE DRAWINGS

Various embodiments of the invention are disclosed in the following detailed description and the accompanying drawings.

DETAILED DESCRIPTION

Figure 1:
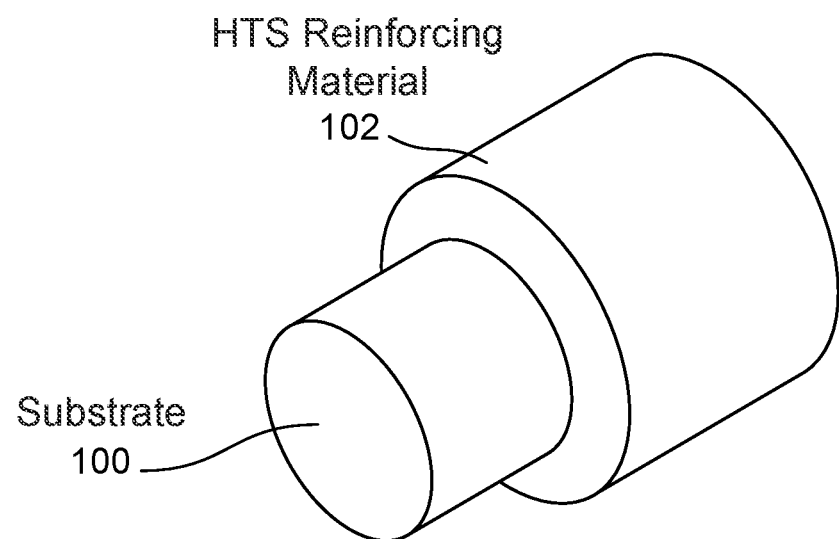
FIG. 1 is a diagram illustrating an embodiment of a composition.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A composition is disclosed. The composition comprises a plurality of continuous ordered fibers embedded in a high temperature superconducting material, wherein the plurality of continuous ordered fibers comprise a core and a reinforcing material.

A composition is disclosed. The composition comprises one or more large diameter continuous fibers embedded in a high temperature superconducting material; and one or more small diameter continuous fibers embedded in a high temperature superconducting material.

A composition is disclosed. The method comprises one or more continuous fibers embedded in a high temperature superconducting material, wherein a fiber of the one or more continuous fibers comprise a core and reinforcing material, and wherein one or more magnetic particles are embedded in the core of the fiber.

A method is disclosed. The method comprises growing a longitudinal a-b plane high temperature superconducting crystal with a long fiber reinforced seed crystal; and cutting off the long fiber reinforced seed crystal from the longitudinal a-b plane high temperature superconducting crystal.

The method is disclosed. The method comprises adding high temperature superconducting constituent powders; adding intermediate solid state powders to the high temperature superconducting constituent powders; disposing fiber reinforcement within the intermediate solid state powders and the high temperature superconducting constituent powders; compressing the intermediate solid state powders and the high temperature superconducting constituent powders with the fiber reinforcement to form a high temperature superconducting shape; and heating the high temperature superconducting shape to crystalize.

A composition is disclosed. The composition comprises a plurality HTS segments, wherein a HTS segment of the plurality of HTS segments comprises one or more continuous fibers embedded in a high temperature superconducting material; and a wire or a tape, wherein the wire or the tape is mechanically and electrically coupled between a first HTS segment of the plurality of HTS segments and a second HTS segment of the plurality of HTS segments.

A device is disclosed. The device comprises a solenoid of reinforced HTS material, wherein the solenoid of reinforced HTS material comprises a plurality continuous ordered fibers embedded in a high temperature superconducting material.

A device is disclosed. The device comprises one or more coils, wherein the one or more coils comprise HTS solenoids; an armature coupled to a stem in a control valve, wherein the armature comprises a HTS solenoid; and coolant access paths, wherein the coolant access paths enable cooling the one or more coils and the armature.

A device is disclosed. The device comprises a photovoltaic cell; and a parallel array of HTS solenoids, wherein the parallel array of HTS solenoids is coupled to the photovoltaic cell.

A device is disclosed. The device comprises a support net with nodes, wherein each node comprises a HTS photovoltaic-magnetic cell, wherein alignments of the HTS photovoltaic-magnetic cells are arranged with N-S in parallel alignment.

A device is disclosed. The device comprises a tether comprising a plurality of HTS solenoids and a sheath, wherein a solenoid of the plurality of HTS solenoids comprises a high temperature superconducting material and reinforcing fiber.

A device is disclosed. The device comprises propulsion ball or plate with tail, injected in propulsion channel; HTS solenoids disposed along walls of propulsion channel, wherein the propulsion ball or plate with tail are moved through the propulsion channel using magnetic field generated by HTS solenoids; and a collection channel.

A device is disclosed. The device comprises a tube with a tube HTS solenoid, wherein a projectile in a sabot comprising a sabot HTS solenoid.

A method is disclosed. The method comprises disposing a seed HTS crystal on a growing crystal in contact with an a-b plane of the seed HTS crystal to grow the growing crystal, wherein the a-b plane is perpendicular to a c-axis.

A method is disclosed. The method comprises disposing a seed HTS crystal on a growing crystal in contact with a b-c plane of the seed HTS crystal to grow the growing crystal, wherein the b-c plane is perpendicular to an a-axis.

A device is disclosed. The device comprises a reinforced HTS material in a graphene casing, wherein the HTS in the graphene casing includes a cooling channel and a return channel.

A number of applications for or production methods for a reinforced superconducting composition are disclosed.

A reinforced superconducting composition comprises one or more continuous fibers that is/are embedded in a high temperature superconducting (HTS) material. The fibers are of sufficiently long length or sufficiently large aspect ratio (the ratio of fiber length to width) such that the fibers do not migrate, agglomerate, nor react sufficiently during HTS sintering and crystallization to weaken the final HTS material below that of unreinforced HTS. Fibers can be connected together in structures so that they do not migrate, agglomerate nor react sufficiently during HTS sintering and crystallization to weaken the final HTS material below that of unreinforced HTS. In some embodiments, the fibers are long in the event that the fibers span the HTS from one edge to another. In various embodiments, the fibers are 3, 4, 5, 6, 7, 8, 9, 10, 20, 30, 50 mm long, or any other appropriate length. In some embodiments, the fibers are composed of multiple filaments and/or non-continuous strands which may or may not be composed as threads and/or braids.

In some embodiments, the one or more continuous fibers is/are comprised of an element which a) has a high melting point and b) forms a very durable oxide form that prevents contamination of a high temperature superconducting material. In some embodiments, the one or more continuous fibers comprise SiC fiber. In various embodiments, the one or more fibers comprise Silicon (Si), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), Aluminum Titanium Nitride (AlTiN), or any other appropriate material. These materials are referred to herein as Reinforcing Materials.

A reinforced high temperature superconducting material is disclosed. The high temperature superconducting material has zero electrical resistance at a temperature above 25° K. In various embodiments, the high temperature superconducting material comprises one or more of the following: a ceramic material, a copper oxide material, a rare earth copper oxide material (RE)BCO (e.g., (RE)$Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). These materials are typically made by heating the component powders in the appropriate proportions until they anneal and then cooling until a crystal is formed. These materials are referred to herein as High Temperature Superconductors or HTS.

The one or more continuous fibers are arranged in an array. In various embodiments, the array comprises one of the following: a one dimensional array, a two dimensional array, a three dimensional array, or any other appropriate array. In some embodiments, the two or more continuous fibers are connected or coupled to each other. In some embodiments, the two or more continuous fibers are not connected nor coupled to each other. In various embodiments, the one or more fibers are arranged in parallel lines, in parallel curves, or any other appropriate reinforcement arrangement.

In various embodiments, the high temperature superconductive material is shaped using subtractive cutting, is shaped using cutting and dividing, or any other process for creating a shape. In various embodiments, the high temperature superconductive material is produced using a batch process, a continuous process, or any other appropriate process.

In some embodiments, the one or more fibers are pre-stressed during manufacturing (e.g., put under mechanical tension—for example, by pulling on the ends of the fiber). In various embodiments, the one or more fibers are used for cooling the high temperature superconducting material, are used to heat the high temperature superconducting material, are used to transmit electrical signals into the high temperature superconducting material, or any other appropriate use within the high temperature superconducting material. In some embodiments, the fiber comprises a composite fiber, where the components of the fiber are selected to enhance or be compatible with the property desired (e.g., cooling, heating, and/or transmitting electricity, etc.).

Continuous, long fiber is used for physical internal reinforcement of an HTS material to prevent contamination during crystal formation and cracking of the final crystal which causes the superconductivity of HTS material to fail. Long continuous fiber is distributed through the HTS sintering components powder then processed with the HTS sample through a sintering, crystallization, and cooling process. The use of long continuous fiber prevents problems when fibers agglomerate and react causing weakness in HTS crystal. In some embodiments, discontinuous fibers of approximately 4 mm in length that are added to HTS component powders before sintering physically reinforce an HTS material and prevent contamination during crystal formation and cracking of the final HTS crystal. These agglomerations and reactions are especially acute during the melt phase of HTS crystal production. The length of long continuous fibers, especially when connected or held fixed, prevents the fibers from moving, clumping, and reacting unnecessarily to the detriment of HTS crystal formation. In some embodiments, the fibers are long in the event that the fibers span the HTS from one edge to another and/or just shy of or just beyond or way beyond the edge(s) of the HTS crystal. In various embodiments, the fibers are 3, 4, 5, 6, 7, 8, 9, 10, 20, 30, 50 mm long, or any other appropriate length to prevent agglomeration.

In some embodiments, carbon fiber (e.g., SiC fiber) and/or other fiber is a strong reinforcing material which is stable over the wide range of temperatures involved in sintering, crystallizing and processing bulk HTS crystal;

In some embodiments, although oxygen reacts readily with most materials, the specified fibers create a durable oxide layer that prevents contamination of a high temperature superconducting material. For example, SiC carbon fiber creates a durable layer of silicon dioxide ($SiO_2$) from a reaction of silicon Si with oxygen O during the initial heating of the HTS sintering, in which the component powders are melted into a liquid phase. This $SiO_2$ layer prohibits further reaction with oxygen during the remaining HTS production process. This process is similar to how aluminum (Al), which normally reacts readily with oxygen, forms a durable coat of aluminum oxide $Al_2O_3$, which prevents further reactions. The oxide layer allows aluminum to be used safely for foil, pots, and pans without the fear of either an explosive chemical reaction or aluminum poisoning (except in the case of highly acidic foods like rhubarb which can dissolve the $Al_2O_3$ coating during cooking).

In some embodiments, the use of continuous, long fiber permits the fiber to retain its position in the metal phase liquid and prevents the agglomeration seen with discontinuous fibers and particles, which ultimately weakens and disintegrates the HTS crystal.

In various embodiments, continuous, long fiber can be formed into a variety of simple reinforcement structures involving unconnected fibers such as single planes of one dimensional fiber arrays, two dimensional fiber arrays with alternating stacked layers of planes in orthogonal directions, full three dimensional unconnected arrays or lattices of fibers, or any other appropriate reinforcement arrangements.

By connecting continuous, long fiber, a variety of reinforcement structures like single and layered two dimensional nets as well as three dimensional connected mesh structures can be made. For example, these structures, nets, or meshes create an internal reinforcement similar to concrete reinforcement that strengthens the material by redistributing stresses and strains, which prevents cracking.

By using both linear and non-linear, unconnected and connected continuous long fiber, complex reinforcement structures can be formed for any desired geometry of HTS superconductor.

Fiber reinforcement will permit HTS components to be produced cheaply and with precision through the technique of Subtractive Sculpting (e.g., the removal of material to achieve a desired shape—for example, by cutting, carving, scraping, grinding, etc.). Until now attempts at producing usable HTS components exclusively focused on either creating thin single crystal films through two-dimensional deposition on substrates or bulk three-dimensional HTS crystals in molds or other fixed containers. These methods are expensive, restrict the shape and size of components, and require the custom manufacture of each component to exact specifications making it extremely difficult to physically modify a component after it is produced. Fiber reinforcement strengthens and reduces the brittleness of a bulk HTS allowing parts to be sculpted (i.e., carved, cut, ground or otherwise extracted away) from a block of HTS material without disrupting the superconductivity of the crystal lattice. Thus, an unlimited variety of HTS component geometries can be produced including wires, rods, spirals, films, tapes, plates, blocks, spheres and three dimensional complex forms for use in specific electric and magnetic applications. Subtractive Sculpting also allows more precise component manufacture by eliminating geometric uncertainties in thermal expansion/contraction as HTS crystallizes and cools during production. Cooling causes thermal expansion and contraction which is difficult to predict, and varies greatly depending on an HTS crystal's internal cooling temperature gradients and shape. Production using molds and film deposition are prone to such thermal uncertainties since their external reinforcement cannot be easily modified once the HTS crystal has formed. The much greater manufacturing precision provided by Subtractive Sculpting due to fiber internal reinforcement will allow much less wastage of less-than-perfectly formed HTS components. The efficiency will substantially reduce the cost of fiber reinforced HTS components leading to more commercial applications.

Fiber reinforcement allows a single production block to be cut in to a large number and/or variety of different components. This increases production efficiency and reduces costs leading to more commercial applications.

Fiber reinforcement (e.g., SiC and/or other fiber reinforcement) will also make HTS and proto-HTS materials strong enough for Continuous HTS Production which will significantly reduce manufacturing cost leading to HTS use in more applications. Currently, HTS is produced in batches where single bulk crystals or films are first sintered/deposited then allowed to cool under controlled conditions to allow crystal growth. While suitable for research, batch production is inefficient and expensive requiring considerable labor for each batch and leaving most equipment unused during each production run. Continuous HTS Production is a multi-stage process where: 1) fiber reinforcement is placed within a continuous tube sheath or are formed into a shape by compression prior to or at the entrance to the continuous production line, 2) constituent HTS chemicals in sintering powder form are mixed and place with the fiber reinforcement in the tube or shape, 3) the HTS is then packed and heated to sintering temperatures as the tube or shape is moved through a processing oven machine, 4) the tube or shape then moves through a cooling process where a single long HTS crystal continuously forms, 5) once crystallized, the continuous HTS crystal tube or shape is cooled to room temperature, and 6) the HTS tube or shape is then cut at intervals to produce individual bulk single crystal HTS blocks. The individual blocks are then Subtractively Sculpted into individual components.

Continuous production requires that the single HTS crystal be strong enough to withstand the strains and stresses of continuous movement during production. This is done by placing fiber reinforcement with the sintering component powders in the continuous tube or shape before sintering. The reinforcement reduces the brittleness of and strengthens the HTS such that the continuous tube of HTS can be transported seamlessly through mixing, packing, sintering, cooling, and cutting without breaking the HTS' essential single crystal structure.

To further strengthen HTS components against brittleness and cracking, fibers can be pre-stressed during sintering and throughout HTS production with specialized processes, equipment, and control mechanisms. The physical principle behind pre-stressing is that a compressive force (F) within the HTS crystal is created by the continuous lateral force induced by the stressed fiber reinforcement. This compressive force increases the external forces (P) which the HTS crystal can bear before cracking.

Pre-stressing involves applying carefully controlled and monitored tension at ends of individual reinforcing fibers before sintering and cooling. After the HTC crystal forms around the fibers, the crystal matrix will hold the fiber and extend the fiber's force completely through the HTS such that tension on the external fiber ends will no longer be needed. External fiber ends can then be trimmed, and the now pre-stressed strengthened HTS can be divided, cut and subtractively shaped into final component shape.

For batch production, pre-stressing forces would be applied on the external fiber ends sticking out of the HTS before the HTS component powders are added to the reinforcement in the casing at the beginning of the process. At the end of the process after HTS crystal has been formed but before production blocks are cut, lateral tension is maintained by friction rollers in contact directly with the production casing covering the now solid HTS crystal. In various embodiments, the tension is achieved by grabbing, clamping, or holding the fiber end(s) and pulling, or any other appropriate means of creating tension. Pre-stressing tension is maintained as the component powders are added then continued during the sintering and cooling phases of HTS production. Once the HTS crystal is formed, the Pre-stressing tension is released pass the friction rollers. The HTS crystal matrix will now hold the pre-stressed fibers under force throughout the HTS thereby making it much stronger than without pre-stressing.

Continuously produced Reinforced HTS can be Radially Pre-stressed by placing fibers perpendicular or at an angle to the axis of the lateral movement of the production tube casing such that individual fiber ends protrude from the casing. The tube is then be filled with HTS component sintering powder. A pre-stressing jig is then assembled around the production casing which secures the ends and provides Pre-Stressing Tension to the radial fiber extruding from the casing. This jig keeps pre-stressing tension on the radial fibers as the HTS is sintered then crystallized and cooled. Once the HTS crystal is formed, the radial fibers are held at force by the crystal matrix. The pre-stressing jig is then disassembled and taken off the casing before the final pre-stressing tension rollers for Lateral Pre-Stressing described above.

The conductivity and magnetic fields of reinforced HTS components can be controlled by varying the temperature and/or electric current at the external fiber ends of the fibers. This is because both the electrical conductivity and thermal conductivity of fiber differs from HTS. By passing different levels of heat or electric current through different fibers, individual parts of a single HTS component can be subject to more or less heat/electric current than others. This will allow superconductivity to be "turned off" or "turned on" in precise parts of any given HTS component. In addition the heat/current passed through can varied over time allowing dynamic control of micro-magnetic and micro-electric fields across the three spatial dimensions and the fourth dimension of time (i.e., 4D control of local HTS properties using a matrix of control lines that can spatially and temporally deposit or deprive heat, cooling, current, to a localized area in a HTS material).

In various embodiments, features of the reinforced HTS material include:
  using continuous, long fiber silicon carbide fiber to reinforce HTS to prevent contamination during crystal formation and cracking of the HTS crystal;
  using unconnected continuous, long fibers placed in arrays to reinforce and strengthen HTS; and
  using connected continuous, long fibers placed in two and three dimensional reinforcement structures.

In various embodiments, reinforced HTS material are produced using:
  Subtractive Sculpting, where HTS material is extracted through a sculptive process rather than the additive process of external molding and film/tape deposition which will increase production efficiency and reduce costs leading to more commercial applications;
  Cutting and dividing single HTS blocks into a large number and/or variety of different components which will increase production efficiency and reduce costs leading to more commercial applications;

Continuously Producing HTS to significantly reduce production cost and time compared to current batch production;

Pre-stressing HTC during crystal formation in batch production to increase strength;

Pre-stressing HTC laterally during crystal formation in Continuous Production to increase HTS strength; and Pre-stressing HTC radially during crystal formation in Continuous Production to increase HTS strength.

In some embodiments, reinforced HTS materials enable micro-control of electric and magnetic fields over three spatial dimensions as well as time (4D) by using a matrix of Reinforcement fibers to turn off and on individual parts of an HTS component by transmitting heat or electricity through the ends of Reinforcement fibers which extend beyond the HTS component. This will allow greater HTS use in the Electric Power industry for Superconductor Fault Current Limiters (SFCL), Superconductor Magnetic Energy Storage (SMES), Transmission Cables & Wires, Transformers, Generators/Motors, etc. where applications are challenged by Alternating Current (AC) Losses. AC Loss is a special phenomenon where alternating currents in HTS generate heat even when superconducting.

In some embodiments, reinforced HTS materials enable preventing the overheating of HTS by cooling the ends of the fiber Reinforcement fibers which extend beyond the HTS component to avoid the heating of HTS above superconducting temperatures. In some embodiments, the ends of the fiber reinforcement fibers are placed in a cooling bath and/or are configured in a radiator configuration to shed heat external to the HTS material.

In some embodiments, the systems include a processor, an interface, and a memory. In some embodiments, the systems further include a communications network (e.g., a wired network, a wireless network, or any appropriate combination of networks). The interface is configured to receive input from a user, one or more sensors (e.g., a temperature sensor, a strain sensor, an electric current sensor, a position sensor, a magnetic field sensor, a radiation sensor, a fluid flow sensor, etc.), a communications network, a computer system, a processor, or any other appropriate input. The interface is configured to provide output to a user, one or more devices (e.g., actuators, mechanical system, electrical system, switch, etc.), a communications network, a computer system, a processor, or any other appropriate output. The processor is configured to receive the input via the interface and to receive computer instructions as stored by the memory. The processor is further configured to determine appropriate output to provide based at least in part on the input received. In some embodiments, the processor is configured to provide instructions for controlling, sequencing, and/or manufacture of HTS composites including measuring process parameters (e.g., heating, timing, cooling, material inputs (e.g., composite powders, intermediate materials, fibers, magnetic particles, reinforcing sheaths, connecting materials, coating materials, cutting, separating, winding, etc.), or any other appropriate instructions. In some embodiments, the processor is configured to operate a device—for example a valve and/or actuator by providing opening instructions, closing instructions, armature position instructions, cooling instructions based in inputs including user inputs and sensor inputs. In some embodiments, aircraft subsystem instructions are provided to HTS valves and/or actuators including operating instructions (e.g., opening, closing, cooling, heating, etc.) with specific timing and/or sequencing based at least in part on user and/or sensor inputs. In some embodiments, nets or meshes in two or three dimensions and with 2 or 3 axes of symmetry are provided with instructions to maintain position, fold, turn on magnetic field generation, turn off magnetic field generation, or any other appropriate instruction based at least in part on user instructions or sensor (e.g., incoming radiation, etc.). In some embodiments, processor(s) provide instructions to tether components to stiffen, bend, compress, expand, to stabilize a tether based at least in part on sensor (e.g., position, strain, temperature, etc.) inputs. In some embodiments, a processor controls timing of a wave of magnetic field pulses to a water propulsion system based on user input speed instructions and/or fluid flow sensor readings. In some embodiments, a processor provides instructions to generate force by controlling magnetic field generation in a HTS solenoid tube and/or sabot in terms of amount, timing, etc.

Coated, Clad, and/or Composite Fiber for HTS Reinforcement

The Reinforcing Materials' main purpose is to prevent the contamination of HTS during sintering and crystallization. Coated, cladded, and/or composite HTS Reinforcing Fiber, which is cheaper, stronger, and more flexible and which conducts heat and/or electricity better, can be made by placing Reinforcing Materials on cheaper, stronger, more flexible, more heat conductive and/or more electric current conductive long continuous substrate fiber. Substrates could also comprise special materials for specific purposes—for example, ferromagnetic material for Flux Pinning. Possible substrates could include, but are not limited to, materials with melting temperatures higher than the maximum sintering temperatures for HTS such as metals and metal alloys (e.g., Tungsten), ceramics, silicon based compounds (e.g., $SiO_2$), and/or carbon based compounds (e.g., graphene). In various embodiments, the materials comprise: Aluminum, Beryllium, Boron, Carbon, Chromium, Hafnium, Indium, Iridium, Iron, Molybdenum, Nickel, Niobium, Platinum, Rhenium, Rhodium, Silicon, Titanium, Tantalum, Titanium, Tungsten, Zirconium, and their alloys, compounds, and structures such as, but not limited to, Graphene, Silicon Oxides, Silicon Carbide, Zinc Aluminum Cadmium Alloy, Aluminum Magnesium Alloy, Nickel Aluminum Alloy, Beryllium Copper Alloy, Molybdenum Rhenium Alloy, Molybdenum Lanthanum Alloy, Tungsten Rhenium Alloy, Nickel Titanium, Tantalum Niobium Alloy, Tantalum Tungsten Alloy, or any other appropriate material. Coating, cladding, and/or forming composites can be done through vapor deposition (physical and chemical), chemical and electrochemical techniques, spraying, roll-to-roll coating, and/or other physical coating means.

The thickness of the Reinforcing Material coating, cladding and/or skin of the composite fiber should great enough such to provide the creation of the durable oxide layer with the Reinforcing Material that a) will prevent further oxidation with the HTS component powders during further sintering and HTS crystal production and b) leave enough original fiber material, whether Reinforcing Material or Substrate, to provide the physical properties desired from the reinforcing fiber. These physical properties include strength, connections with other fibers, structure, pliability and flexibility, as well as flux pinning properties including ferromagnetic infusions, etc. For example, with SiC Reinforcing Material, thicknesses below 1.5 µm react too much during HTS formation. In some embodiments, a core fiber comprises a metal and a reinforcing material comprises SiC. In various embodiments, the core fiber is 5, 10, 15, 20, 30, 40, 50, 60, 70, 80, 90, 100, 150, 200, 300, 400, 500, 600, 700, 800, 900, 1000, 1500, 2000, 2500, 5000 nm, 500 um, 200 um, 100 um, 50 um, 40 um, 30 um, 20 um, 10 um, or any other appropriate in diameter. In various embodiments, the reinforcing material is 5, 10, 15, 20, 30, 40, 50, 60, 70, 80, 90, 100, 150, 200, 300, 400, 500, 600, 700, 800, 900, 1000, 1500, 2000, 2500, 5000, 10000, 50000, 100000 nm, or any other appropriate thickness around the core fiber. In various embodiments, the core fiber and the reinforcing material have a combined outer diameter of 10, 15, 20, 30, 40, 50, 60, 70, 80, 90, 100, 150, 200, 300, 400, 500, 600, 700, 800, 900, 1000, 1500, 2000, 2500, 5000, 10000, 50000, 100000, 500000 nm, or any other appropriate overall diameter. In various embodiments, the ratio of the thicknesses or diameters of core fiber and HTS reinforcing material are 1:100, 1:50, 1:20, 1:10, 1:5, 1:4, 1:3, 1:2, 1:1, 2:1, 3:1, 4:1, 5:1, 10:1, 20:1, 50:1, 100:1, or any other appropriate ratio.

FIG. 1 is a diagram illustrating an embodiment of a composition. In the example shown, a continuous fiber comprising a core (e.g., substrate 100) and a reinforcing material (e.g., HTS reinforcing material 102) is one of a plurality of continuous fiber that is embedded in a HTS superconductor material. In some embodiments, a plurality continuous ordered fibers embedded in a high temperature superconducting material, wherein the plurality of continuous ordered fibers comprise a core and a reinforcing material.

A reinforced superconducting composition comprises one or more continuous fibers (e.g., fibers made of substrate 100 and HTS reinforcing material 102) that is/are embedded in a high temperature superconducting (HTS) material. The fibers are of sufficiently long length or sufficiently large aspect ratio (the ratio of fiber length to width) such that the fibers do not migrate, agglomerate, nor react sufficiently during HTS sintering and crystallization to weaken the final HTS material below that of unreinforced HTS. Fibers can be connected together in structures so that they do not migrate, agglomerate nor react sufficiently during HTS sintering and crystallization to weaken the final HTS material below that of unreinforced HTS. In some embodiments, the fibers are long in the event that the fibers span the HTS from one edge to another. In various embodiments, the fibers are 3, 4, 5, 6, 7, 8, 9, 10, 20, 30, 50 mm long, or any other appropriate length. In various embodiments, the fibers are composed of continuous ordered multiple fiber filament bundles and/or braids, and/or non-continuous strands in multiple fiber filament bundles and/or braids, which may or may not be composed as threads and/or braids, or any other appropriate multiple fiber arrangements. In some embodiments, the multiple fiber bundles or braids enables longer or continuous production of HTS reinforced materials by not requiring that a single fiber be continuous and instead using a bundle or braid where the fibers of the bundle or braid have staggered breaks.

In some embodiments, the one or more continuous fibers is/are comprised of an element which a) has a high melting point and b) forms a very durable oxide form that prevents contamination of a high temperature superconducting material. In some embodiments, the one or more reinforcing materials of the continuous fibers (e.g., HTS reinforcing material 102) comprise SiC fiber. In various embodiments, the one or more reinforcing materials of the fibers (e.g., HTS reinforcing material 102) comprise Silicon (Si), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), Aluminum Titanium Nitride (AlTiN), or any other appropriate material. These materials are referred to herein as Reinforcing Materials.

A reinforced high temperature superconducting material is disclosed. The high temperature superconducting material has zero electrical resistance at a temperature above 25° K. In various embodiments, the high temperature superconducting material comprises one or more of the following: a ceramic material, a copper oxide material, a rare earth copper oxide material (RE)BCO (e.g., (RE)$Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). These materials are typically made by heating the component powders in the appropriate proportions until they anneal and then cooling until a crystal is formed. These materials are referred to herein as High Temperature Superconductors or HTS.

The disclosed features/characteristics of Coated, Cladded, and/or Composite Fiber for HTS Reinforcement are: a) coating, cladding, compositing Reinforcing Material on a long continuous substrate fiber, b) the substrate fiber could be cheaper, stronger, more flexible, and/or more heat/current conductive than the Reinforcing Material, and/or c) the substrate fiber could be made of special materials for a specific purpose such as Flux Pinning, and thus producing a Reinforcement Fiber with more attractive features than a fiber made of Reinforcing Material alone.

Coated, Clad, and/or Composite Heat/Current Conducting Reinforcement Fiber

Some forms of single material reinforcing fiber are already thermal conductors that can be used for 4D Control of AC Loss heat and micro-magnetic fields. As shown below, an especially conductive Coated/Clad/Composite reinforcing fiber can be made by placing Reinforcing Material (e.g., SiC) on a long continuous substrate fiber (e.g., graphene) which conducts heat and electricity better than the Reinforcing Material itself. The coating can be put in place by a number of application processes such as vapor deposition (e.g., physical and/or chemical), chemical and electrochemical techniques, spraying, roll-to-roll coating, and/or other any other appropriate physical or chemical coating manner.

Possible core materials could include, but are not limited to, materials with melting temperatures higher than the maximum sintering temperatures for HTS such as metals and metal alloys (e.g., Tungsten), ceramics, silicon based compounds (e.g., $SiO_2$), and/or carbon based compounds (e.g., graphene). In various embodiments, the materials comprise: Aluminum, Beryllium, Boron, Carbon, Chromium, Hafnium, Indium, Iridium, Iron, Molybdenum, Nickel, Niobium, Platinum, Rhenium, Rhodium, Silicon, Titanium, Tantalum, Titanium, Tungsten, Zirconium, and their alloys, compounds, and structures such as, but not limited to, Graphene, Silicon Oxides, Silicon Carbide, Zinc Aluminum Cadmium Alloy, Aluminum Magnesium Alloy, Nickel Aluminum Alloy, Beryllium Copper Alloy, Molybdenum Rhenium Alloy, Molybdenum Lanthanum Alloy, Tungsten Rhenium Alloy, Nickel Titanium, Tantalum Niobium Alloy, Tantalum Tungsten Alloy, or any other appropriate material. Coating, cladding, and/or forming composites can be done through vapor deposition (physical and chemical), chemical and electrochemical techniques, spraying, roll-to-roll coating, and/or other physical coating means.

The thickness of the Reinforcing Material coating, cladding and/or skin of the composite fiber should great enough such to provide the creation of the durable oxide layer with the Reinforcing Material that a) will prevent further oxidation with the HTS component powders during further sintering and HTS crystal production and b) leave enough original fiber material, whether Reinforcing Material or Substrate, to provide the physical properties desired from the reinforcing fiber. These physical properties include strength, connections with other fibers, structure, pliability and flexibility, as well as flux pinning properties including ferromagnetic infusions, etc. For example, with SiC Reinforcing Material, thicknesses below 1.5 μm react too much during HTS formation. In some embodiments, a core fiber comprises a metal and a reinforcing material comprises SiC. In various embodiments, the core fiber is 5, 10, 15, 20, 30, 40, 50, 60, 70, 80, 90, 100, 150, 200, 300, 400, 500, 600, 700, 800, 900, 1000, 1500, 2000, 2500, 5000 nm, 500 um, 200 um, 100 um, 50 um, 40 um, 30 um, 20 um, 10 um, or any other appropriate in diameter. In various embodiments, the reinforcing material is 5, 10, 15, 20, 30, 40, 50, 60, 70, 80, 90, 100, 150, 200, 300, 400, 500, 600, 700, 800, 900, 1000, 1500, 2000, 2500, 5000, 10000, 50000, 100000 nm, or any other appropriate thickness around the core fiber. In various embodiments, the core fiber and the reinforcing material have a combined outer diameter of 10, 15, 20, 30, 40, 50, 60, 70, 80, 90, 100, 150, 200, 300, 400, 500, 600, 700, 800, 900, 1000, 1500, 2000, 2500, 5000, 10000, 50000, 100000, 500000 nm, or any other appropriate overall diameter. In various embodiments, the ratio of the thicknesses or diameters of a core fiber and HTS reinforcing material are 1:100, 1:50, 1:20, 1:10, 1:5, 1:4, 1:3, 1:2, 1:1, 2:1, 3:1, 4:1, 5:1, 10:1, 20:1, 50:1, 100:1, or any other appropriate ratio.

Figure 2:
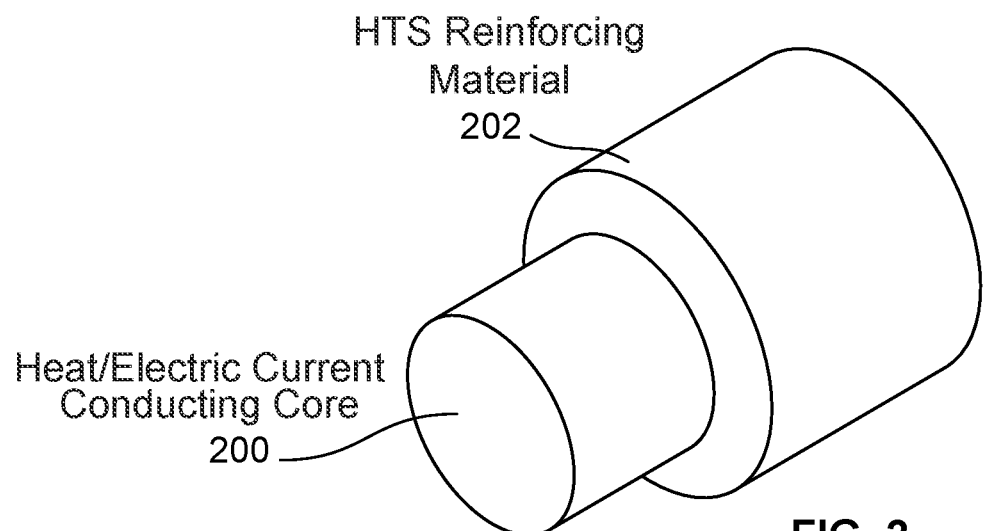
FIG. 2 is a diagram illustrating an embodiment of a composition.

FIG. 2 is a diagram illustrating an embodiment of a composition. In the example shown, a continuous fiber comprising a core (e.g., heat/electric current conducting core 200) and a reinforcing material (e.g., HTS reinforcing material 202) is one of a plurality of continuous fiber that is embedded in a HTS superconductor material. In some embodiments, a plurality continuous ordered fibers embedded in a high temperature superconducting material, wherein the plurality of continuous ordered fibers comprise a core and a reinforcing material. In the example shown, heat/electric current conducting core 200 comprises one or more of the following: a material with desired heat conduction, a material with desired electrical conduction (e.g., carbon and carbide material as well as metals and metal alloys of aluminum, silver, gold, copper, platinum, zinc, tungsten, etc.), a material with desired electrical conduction (e.g., metals and metal alloys of aluminum, silver, gold, copper, platinum, zinc, tungsten, etc.), a material with desired elasticity (e.g., metals and metal alloys of aluminum, silver, gold, copper, platinum, zinc, tungsten, etc.), a material with desired flexibility (e.g., metals and metal alloys of aluminum, silver, gold, copper, platinum, zinc, tungsten, etc.), and/or a material with desired strength (e.g., carbon and carbide material as well as metals and metal alloys of silver, gold, copper, platinum, zinc, tungsten, etc.).

A reinforced superconducting composition comprises one or more continuous fibers that is/are embedded in a high temperature superconducting (HTS) material. The fibers are of sufficiently long length or sufficiently large aspect ratio (the ratio of fiber length to width) such that the fibers do not migrate, agglomerate, nor react sufficiently during HTS sintering and crystallization to weaken the final HTS material below that of unreinforced HTS. Fibers can be connected together in structures so that they do not migrate, agglomerate nor react sufficiently during HTS sintering and crystallization to weaken the final HTS material below that of unreinforced HTS. In some embodiments, the fibers are long in the event that the fibers span the HTS from one edge to another. In various embodiments, the fibers are 3, 4, 5, 6, 7, 8, 9, 10, 20, 30, 50 mm long, or any other appropriate length. In various embodiments, the fibers are composed of continuous ordered multiple fiber filament bundles and/or braids, and/or non-continuous strands in multiple fiber filament bundles and/or braids, which may or may not be composed as threads and/or braids, or any other appropriate multiple fiber arrangements. In some embodiments, the multiple fiber bundles or braids enables longer or continuous production of HTS reinforced materials by not requiring that a single fiber be continuous and instead using a bundle or braid where the fibers of the bundle or braid have staggered breaks.

In some embodiments, the one or more continuous fibers is/are comprised of an element which a) has a high melting point and b) forms a very durable oxide form that prevents contamination of a high temperature superconducting material. In some embodiments, the one or more reinforcing materials (e.g., HTS reinforcing material 202) of the continuous fibers comprise SiC fiber. In various embodiments, the one or more reinforcing materials (e.g., HTS reinforcing material 202) of the fibers comprise Silicon (Si), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), Aluminum Titanium Nitride (AlTiN), or any other appropriate material. These materials are referred to herein as Reinforcing Materials.

In various embodiments, the high temperature superconducting material that the composite fiber is embedded in comprises one or more of the following: a ceramic material, a copper oxide material, a rare earth copper oxide material (RE)BCO (e.g., $(RE)Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). These materials are typically made by heating the component powders in the appropriate proportions until they anneal and then cooling until a crystal is formed.

The disclosed features/characteristics of Multi-Component Heat Conducting Reinforcement Fiber is that a heat/electric current conducting substrate fiber (e.g., heat/electric current conducting core 200) is coated, cladded and/or composited with Reinforcing Material (e.g., HTS reinforcing material 202) to produce a mixed HTS reinforcing fiber, which conducts heat and electric current more efficiently than single compound reinforcing fibers (e.g., SiC). This will allow better 4D Control of AC Loss heat and micromagnetic fields.

In various embodiments, the current conducting core fiber is 5, 10, 15, 20, 30, 40, 50, 60, 70, 80, 90, 100, 150, 200, 300, 400, 500, 600, 700, 800, 900, 1000, 1500, 2000, 2500, 5000 nm, 500 um, 200 um, 100 um, 50 um, 40 um, 30 um, 20 um, 10 um, or any other appropriate in diameter. In various embodiments, the reinforcing material is 5, 10, 15, 20, 30, 40, 50, 60, 70, 80, 90, 100, 150, 200, 300, 400, 500, 600, 700, 800, 900, 1000, 1500, 2000, 2500, 5000, 10000, 50000, 100000 nm, or any other appropriate thickness around the core fiber. In various embodiments, the current conducting core fiber and the reinforcing material have a combined outer diameter of 10, 15, 20, 30, 40, 50, 60, 70, 80, 90, 100, 150, 200, 300, 400, 500, 600, 700, 800, 900, 1000, 1500, 2000, 2500, 5000, 10000, 50000, 100000, 500000 nm, or any other appropriate overall diameter. In various embodiments, the ratio of the thicknesses or diameters of a current conducting core fiber and HTS reinforcing material are 1:100, 1:50, 1:20, 1:10, 1:5, 1:4, 1:3, 1:2, 1:1, 2:1, 3:1, 4:1, 5:1, 10:1, 20:1, 50:1, 100:1, or any other appropriate ratio.

Fiber for Flux Pinning

Reinforcement fiber can improve HTS performance by Flux Pinning. Flux Pinning raises the maximum current/magnetic field/voltage an HTS can carry before it quenches (stops superconducting). Flux Pinning involves stopping the movement of microscopic magnetic Flux Vortices which pass through an HTS in its most useful superconducting state. A current in an HTS, puts force on these vortices. If the vortices move, resistance to the current is created, heat is generated, and the HTS eventually quenches. Impurities and defects in HTS crystal create non-superconducting areas. Vortices stick to these areas because less energy is needed to keep their magnetic flux under control. These pinned vortices need larger forces to move them which raise the maximum current/magnetic field the HTS can withstand before quenching. Experiments to create impurities/defects in HTS include adding particles to HTS component powder before sintering, gas diffusion, and irradiation. These are challenged by the delicate nature of HTS crystallization and structure. No Flux Pinning method has seen widespread commercial use. In various embodiments, Reinforcement Fiber improves Flux Pinning by one or more of the following: 1) physically as an impurity defect, 2) strength-wise by allowing the use of Flux Pinning improvement methods which normally weaken HTS, and 3) magnetically when the fiber is infused with ferromagnetic particles, or any other appropriate manner.

I. Fiber Flux Pinning: Physical

Figures 3, 4:
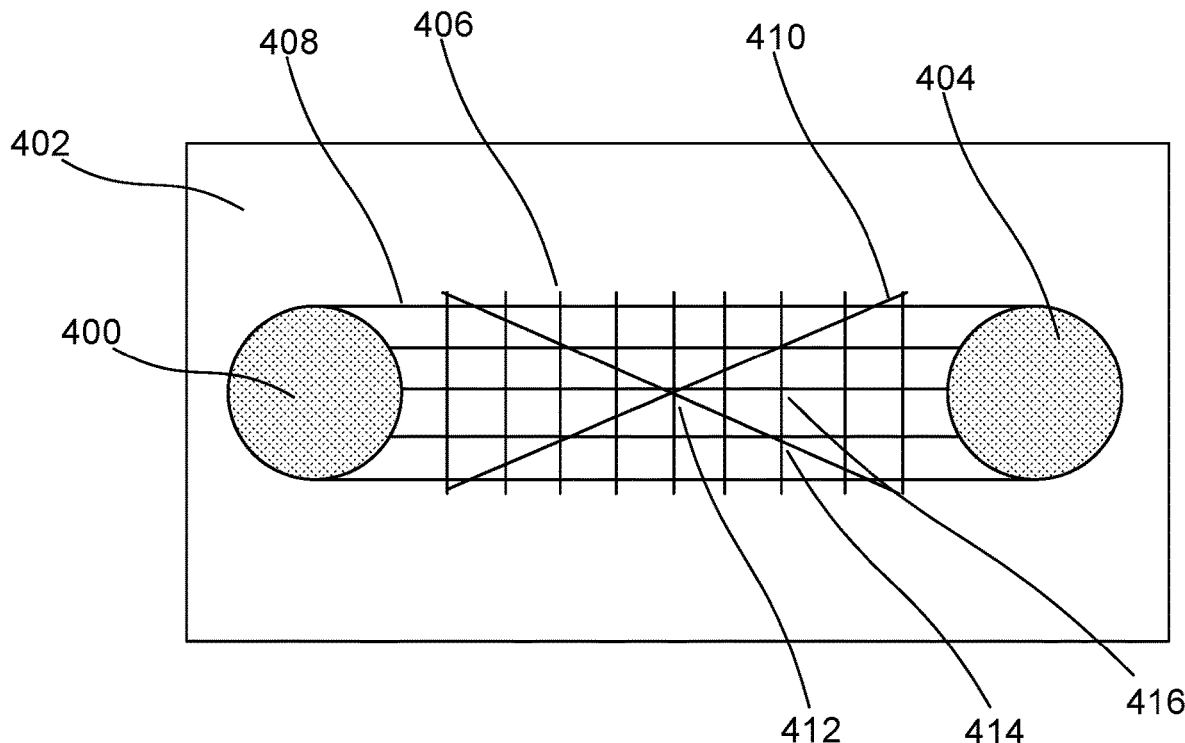
FIG. 3 is a table illustrating an embodiment of materials for flux pinning.
FIG. 4 is diagram illustrating an embodiment of composition.

FIG. 3 is a table illustrating an embodiment of materials for flux pinning. In the example shown, materials that can be added to HTS materials as defects. In some embodiments, a small diameter fiber is added for flux pinning purposes. In various embodiments, one or more materials (e.g., Nb—Ti, Nb—N, $Nb_3Sn$, MgB2, $YBa_2Cu_3O_7$, Bi-2223, etc.), as shown in column 300, are used for flux pinning by embedding the one or more materials into the HTS material, the HTS reinforcing material, or a core material.

Fiber itself creates non-superconducting zones (defects) for Flux Pinning. Defects pin flux when they are tiny—on the same order as $\xi$ and $\lambda$ shown in the table of FIG. 3 (e.g., column 302 and column 304, respectively). Though fiber diameters are larger than the defects, fibers can create small defects on the order $\xi$ (tens of nanometers) at the fiber-HTS boundaries.

Flux Pinning is more effective when the number of pin sites approaches the large number of vortices (which are tiny on the order of $\lambda$ above). More fiber surface area for a given volume of HTS is provided by smaller fibers. Thus an efficient arrangement of reinforcement fiber would be a mix of larger fibers for strength and smaller fibers for Flux Pinning. For example, a set of fibers as small in diameter as 1.5 μm and a set of larger fibers as large in diameter as 100 μm could be intermixed inside an HTS material.

In some embodiments, the small diameter fiber is added in addition to large diameter fiber. In various embodiments, the large diameter fiber is 2×, 3×, 4×, 5×, 6×, 7×, 8×, 9×, 10×, 15×, 20×, 30×, 50×, 100×, or any other appropriate multiplier in diameter compared to the small diameter fiber.

FIG. 4 is diagram illustrating an embodiment of composition. In the example shown, one or more large diameter continuous fibers (e.g., fiber 400 or fiber 404) are embedded in a high temperature superconducting material (e.g., material 402) and one or more small diameter continuous fibers (e.g., horizontal fiber 408, vertical fiber 406, or diagonal fiber 410) are embedded in a high temperature superconducting material (e.g., material 402). In some embodiments, a small diameter fiber is added for flux pinning purposes. In some embodiments, the small diameter fiber is added in addition to large diameter fiber. In various embodiments, the large diameter fiber is 2×, 3×, 4×, 5×, 6×, 7×, 8×, 9×, 10×, 15×, 20×, 30×, 50×, 100×, or any other appropriate multiplier in diameter compared to the small diameter fiber. In various embodiments, the one or more small diameter continuous fibers are 1 um, 1.5 um, 2 um, 5 um, 10 um in diameter or any other appropriate diameter. In various embodiments, the one or more small large continuous fibers are 100 um, 200 um, 500 um, 1000 um in diameter, or any other appropriate diameter. The multiple strands of the small diameter continuous fibers (e.g., horizontal fiber 408, vertical fiber 406, or diagonal fiber 410) create flux pinning nodes (e.g., node 412, node 414, node 416, etc.) in multiple dimensions in the volume of the high temperature superconducting material (e.g., material 402).

In various embodiments, the high temperature superconducting material (e.g., material 402) comprises one or more of the following: a ceramic material, a copper oxide material, a rare earth copper oxide material (RE)BCO (e.g., $(RE)Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, the one or more large continuous fibers (e.g., fiber 400 or fiber 404) and/or the one or more small continuous fibers (e.g., horizontal fiber 408, vertical fiber 406, or diagonal fiber 410) is/are comprised of one or more of the following: Silicon (Si), Silicon Carbide (SiC), Silicon Nitride ($Si_3N_4$), Silicates including Silicon Dioxide ($SiO_2$), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), Aluminum Titanium Nitride (AlTiN), and/or any other appropriate material.

In some embodiments, the large diameter fibers (e.g., fiber 400 or fiber 404) comprise bundles or braids of fibers either with a core or without a core. In some embodiments, the fibers of the bundle are continuous or are discontinuous with the breaks of the fibers staggered with respect to one another.

II. Fiber Flux Pinning: Strength for Flux Pinning Improvement

Figure 5:
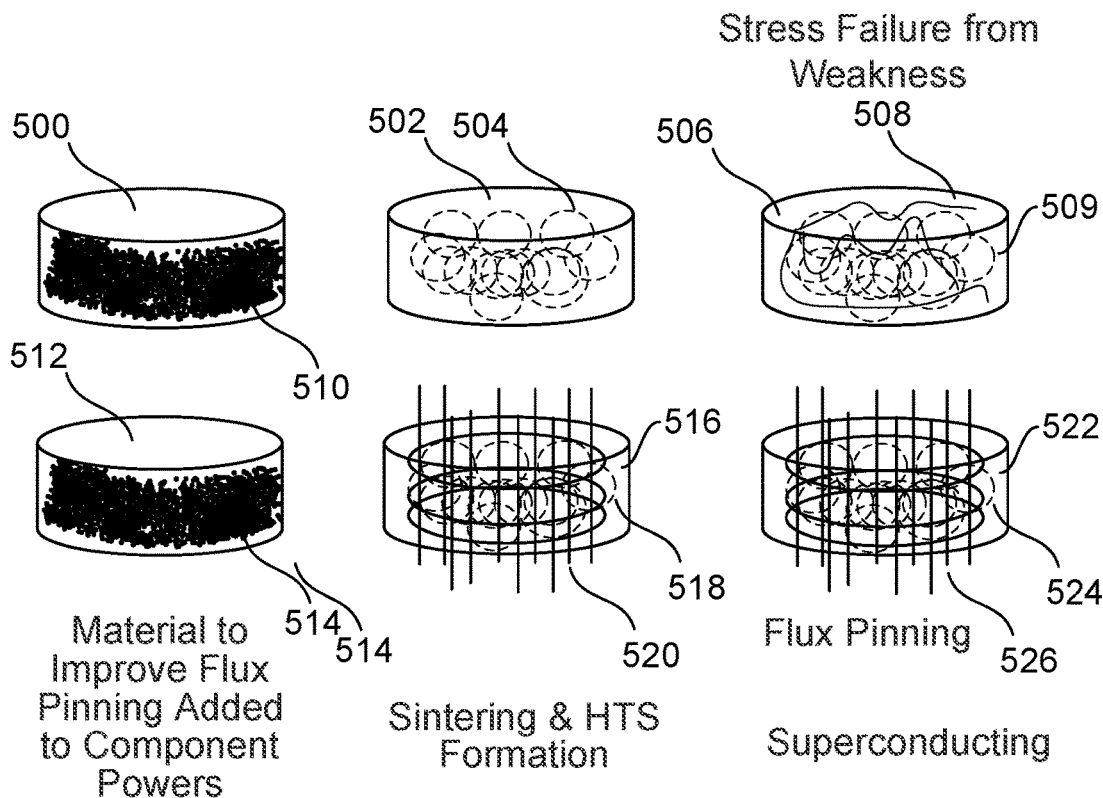
FIG. 5 is diagram illustrating an embodiment of composition.

FIG. 5 is diagram illustrating an embodiment of composition. In the example shown, a flux pinning defect material (e.g., flux pinning material 510 and flux pinning material 514) is added to a HTS material (e.g., HTS material 500, HTS material 502, HTS material 506, HTS material 512, HTS material 516, and HTS material 522) and fiber reinforcement material (e.g., fiber 520 and fiber 526) is added to the HTS material. Flux pinning material 510 and flux pinning material 514 causes weakness in the HTS material that is counteracted by the fiber reinforcement material. In the example shown, in the top row of FIG. 5 pinning material 510 is added to HTS material 500, which creates defect sites 504 in HTS material 502 during sintering and HTS formation. Without fiber reinforcement, in the HTS material 506 after sintering defect 509 and others formed in HTS material 506 cause stress failure from weakness 508 in HTS material 506. In the example shown, in the bottom row of FIG. 5 pinning material 514 is added to HTS material 512, which creates defect sites 518 in HTS material 516 during sintering and HTS formation. With fiber reinforcement from fibers (e.g., fiber 520), in the HTS material 516 after sintering defect 524 and others formed in HTS material 522 do not cause stress failure from weakness in HTS material 522. In various embodiments, the pinning material 514 comprises 10%, 5%, 4%, 3%, 2%, 1%, 0.5%, 0.1%, 0.05%, 0.01%, or any other appropriate percentage of the overall material forming the final HTS crystal.

Flux pinning sites can be created by adding materials to HTS component powder before sintering. The materials either become impurity defects (e.g., defect 504, defect 509, defect 518, and defect 524) or react to create impurity defects for Flux Pinning sites. However, a major challenge is that the added material agglomerates and/or reacts with HTS components causing the resultant HTS crystal to be much weaker (and fail sooner) than without the additional material.

Reinforcement fiber (e.g., fiber 520 and fiber 526) boosts Flux Pinning by providing strength to offset the weakness caused by the added material. For example, in some embodiments, non-superconducting $Y_2Ba_4CuMO_x$ (Y-2411(M)), where M=Nb, Ta, Mo, W, Ru, Zr, Bi and Ag, forms flux nano-sized pinning centers in HTS YBaCuO. However, adding M and/or Y-2411(M) to HTS component powders complicates sintering and crystallization resulting in an HTS crystal which is significantly weaker with a consequent reduction in the critical current ($J_c$) which an HTS can carry before failing. When used in a multi-step process involving M and/or Y-2411(M), reinforcement fiber increases strength producing an HTS crystal with both better Flux Pinning and improved strength with higher $J_c$ and performance.

In various embodiments, the flux pinning defect material comprises: Nb—Ti, Nb—N, $Nb_3Sn$, $MgB_2$, $YBa_2Cu_3O_7$, Bi-2223, or any other appropriate material. These include both non-magnetic as well as magnetic materials such as ferromagnetic iron particles, cobalt particles, nickel particles, alnico magnet particles, samarium-cobalt magnet particles, neodymium-iron-boron (NIB) magnet particles, or any other appropriate ferromagnetic particles, as well as diamagnetic materials such as water or water based materials, copper, mercury, gold, bismuth, and pyrolytic carbon or any other appropriate magnetic particles.

In some embodiments the flux pinning defect material can be coated with protective materials which oxidizes at the high temperatures of HTS sintering forming a protective durable layer which prevents further oxidation. This protective layer prevents further oxidation and other chemical reactions with the flux pinning material thus reducing contamination. In various embodiments, this protective material can be Silicon (Si), Silicon Carbide (SiC), Silicon Nitride ($Si_3N_4$), Silicates including Silicon Dioxide ($SiO_2$), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), Aluminum Titanium Nitride (AlTiN), or any other appropriate material.

In various embodiments, the high temperature superconducting material comprises one or more of the following: a ceramic material, a copper oxide material, a rare earth copper oxide material (RE)BCO (e.g., $(RE)Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In some embodiments, the fiber is comprised of a reinforcing material and in some cases a core material different from the reinforcing material. In various embodiments, the reinforcing material comprises one or more of the following: Silicon (Si), Silicon Carbide (SiC), Silicon Nitride ($Si_3N_4$), Silicates including Silicon Dioxide ($SiO_2$), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, Cr$_2$N), Hafnium Carbide (HfC), Zirconium Carbide (ZrC), Zirconium Nitride (ZrN), Zirconium Diboride (ZrB$_2$), Titanium (Ti), Titanium Carbide (TiC), Titanium nitride (TiN), Tungsten Carbide (WC), Aluminum (Al), Alumina (Al$_2$O$_3$), Aluminum Carbide (Al$_4$C$_3$), Aluminum Nitride (AlN), Titanium Aluminum Nitride (TiAlN), Aluminum Titanium Nitride (AlTiN), and/or any other appropriate material.

III. Fiber Flux Pinning: Magnetic

Figure 6:
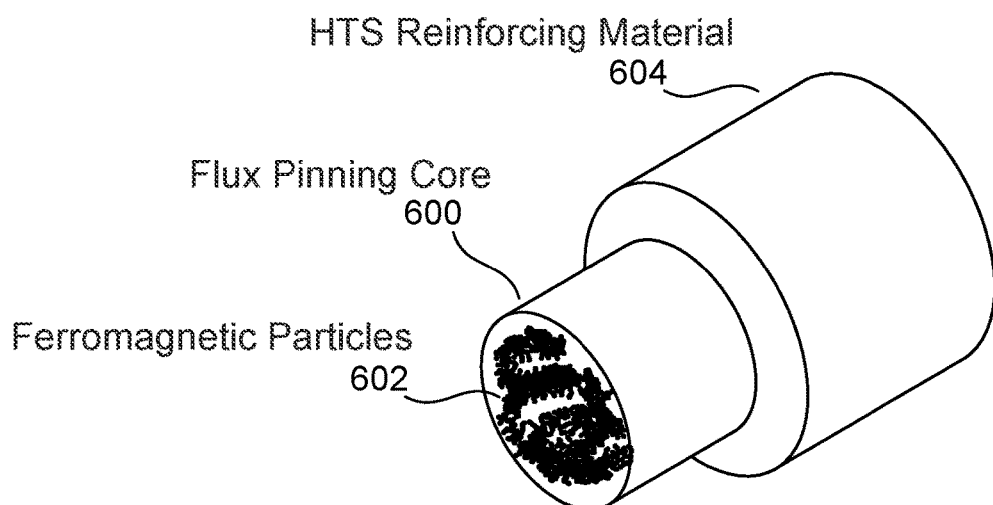
FIG. 6 is a diagram illustrating an embodiment of magnetic particle flux pinning.

FIG. 6 is a diagram illustrating an embodiment of magnetic particle flux pinning. In the examples shown, one or more continuous fibers embedded in a high temperature superconducting material, wherein a fiber of the one or more continuous fibers comprise flux pinning core 600 and HTS reinforcing material 604, and wherein one or more ferromagnetic particles 602 are embedded in the flux pinning core 600 of the fiber. In various embodiments, the ferromagnetic particles comprises 10%, 5%, 4%, 3%, 2%, 1%, 0.5%, 0.1%, 0.05%, 0.01%, or any other appropriate percentage of the overall material forming the flux pinning core 600 of the fiber.

Figure 7:
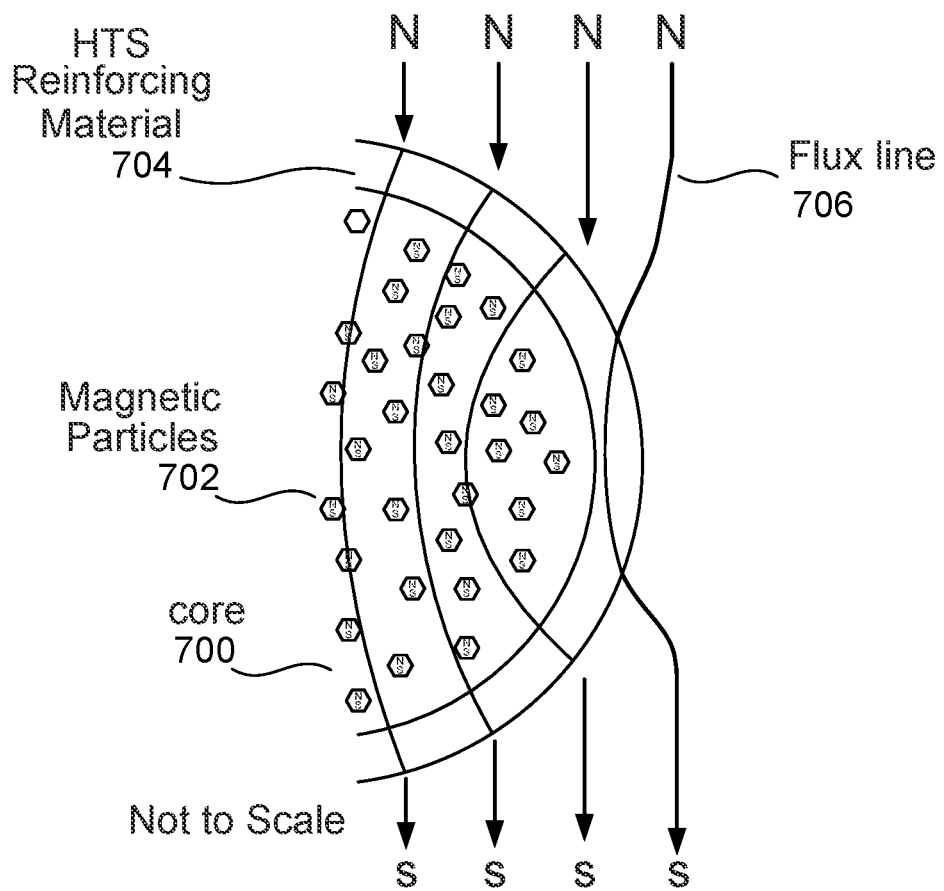
FIG. 7 is a diagram illustrating an embodiment of magnetic particle flux pinning.

FIG. 7 is a diagram illustrating an embodiment of a magnetic particle flux pinning. In the example shown, magnetic material (e.g., magnetic particles 702) embedded in core 700 boosts flux pinning in HTS reinforcing material 704. It will also boost flux pinning by a) using magnetic forces to pin magnetic flux vortices, which come in contact with such magnetic particles, and b) repulsive magnetic forces between magnetic materials will prevent agglomeration leading to less strength reduction in HTS single crystal. In the example shown, although finished HTS single crystal does not contain magnetic flux lines, magnetic particles whether as particles, coated particles, or within Reinforcement Material can form magnet flux lines (e.g., flux line 706) within these materials. Thus any flux vortices in contact with such materials would be subject to magnetic forces which will bind the flux vortices to the materials as shown in FIG. 7. In various embodiments, magnetic particles 702 comprise one or more of the following: ferromagnetic iron particles, cobalt particles, nickel particles, alnico magnet particles, samarium-cobalt magnet particles, neodymium-iron-boron (NIB) magnet particles, as well as diamagnetic materials such as water or water based materials, copper, mercury, gold, bismuth, and pyrolytic carbon or any other appropriate magnetic particles. In various embodiments, magnetic particles 702 comprises 10%, 5%, 4%, 3%, 2%, 1%, 0.5%, 0.1%, 0.05%, 0.01%, or any other appropriate percentage of the overall material forming core 700 of the fiber.

In some embodiments, small particles of magnetic material are infused into a fiber core coated, cladded, or composited with HTS Reinforcing Material. The layer of Reinforcing Material prevents contamination of the HTS during crystal formation. The ferromagnetic particles become magnetic near the magnetic flux lines of vortices. This attracts the vortices to the particles adding magnetic attraction to the flux pinning caused by impurity/defect non-superconducting spots.

In various embodiments, the high temperature superconducting material comprises one or more of the following: a ceramic material, a copper oxide material, a rare earth copper oxide material (RE)BCO (e.g., (RE)Ba$_2$Cu$_3$O$_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, the reinforcing material comprises one or more of the following: Silicon (Si), Silicon Carbide (SiC), Silicon Nitride (Si$_3$N$_4$), Silicates including Silicon Dioxide (SiO2), Boron (B), Boron Carbide (B$_4$C), Boron Nitride (BN), Chromium (Cr), Chromium Carbides (Cr$_3$C$_2$, Cr$_7$C$_3$, Cr$_{23}$C$_6$), Chromium Nitrides (CrN, Cr$_2$N), Hafnium Carbide (HfC), Zirconium Carbide (ZrC), Zirconium Nitride (ZrN), Zirconium Diboride (ZrB$_2$), Titanium (Ti), Titanium Carbide (TiC), Titanium nitride (TiN), Tungsten Carbide (WC), Aluminum (Al), Alumina (Al$_2$O$_3$), Aluminum Carbide (Al$_4$C$_3$), Aluminum Nitride (AlN), Titanium Aluminum Nitride (TiAlN), Aluminum Titanium Nitride (AlTiN), or any other appropriate material.

The disclosed features/characteristics are that reinforcement fiber can be used for improved Flux Pinning of HTS by a) the fiber itself acting as a micro-defect and/or creating micro-defects at fiber-HTS boundaries which attract vortices, b) combining thin fiber for Flux Pinning with thicker fiber for reinforcement in HTS fiber reinforcement structures to increase the number of flux pinning spots in an HTS, c) improved HTS strength with fiber reinforcement allowing the use of added material and procedures which increase Flux Pinning sites but would weaken the final HTS crystal without fiber reinforcement, and d) infusing ferromagnetic particles in the core of a coated, clad, or composite Reinforcement Fiber for magnetic Flux Pinning in addition to physical flux pinning.

Fiber Reinforced HTS with Longitudinal a-b Axis

Figure 8:
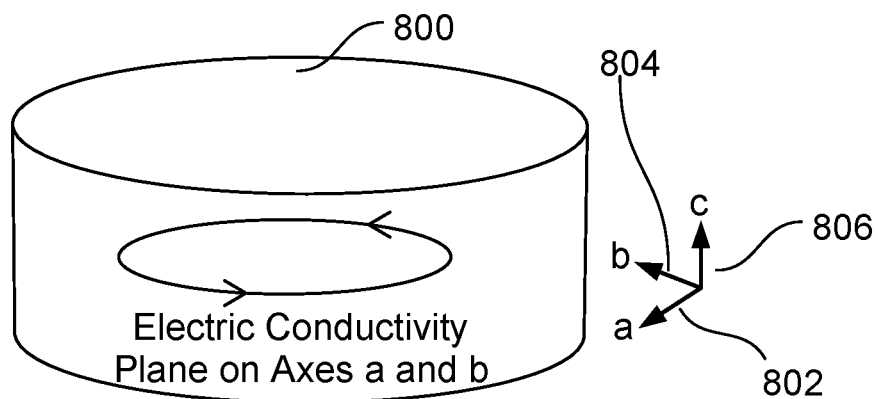
FIG. 8 is a diagram illustrating axes in an HTS material.

FIG. 8 is a diagram illustrating axes in an HTS material. In the example shown, an HTS crystal 800 has a cylindrical shape. C-axis 806 is along the axis of the cylindrical shape of HTS crystal 800 (e.g., up and down in FIG. 8). A-axis 802 and b-axis 804 are in a plane perpendicular to the axis of the cylindrical shape of HTS crystal 800 and parallel to the ends of the cylinder. Electrical superconductivity occurs in the plane defined by a-axis 802 and b-axis 804.

For most HTS applications superconductivity along a longitudinal axis is needed similar to how electric currents travels along a metallic wire. But current bulk HTS batch processing production relies on crystal growth from a seed crystal along its c-axis (e.g., the direction associated with c-axis 806).

Figure 9:
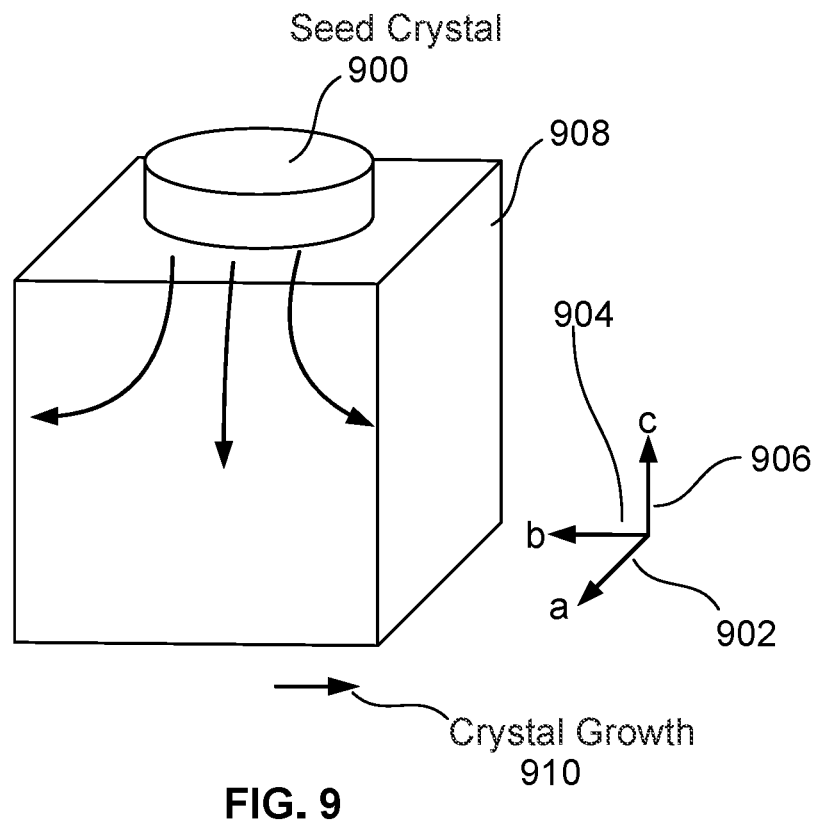
FIG. 9 is diagram illustrating a process for seeding HTS crystal growth.

FIG. 9 is diagram illustrating a process for seeding HTS crystal growth. In the example shown, seed crystal 900 with orientation of c-axis 906 going up and down along the cylinder axis of seed crystal 900 and a-axis 902 and b-axis 904, which are both perpendicular to the cylinder axis of seed crystal 900 (e.g., in a horizontal plane) are shown. Seed crystal 900 is put in contact (e.g., on a surface that is approximately an a-b plane) with HTS component materials 908 that are heated and allowed to crystalize. The seed crystal acts to orient the HTS component material crystallization so that the axes are similar in the growing crystal in orientation to seed crystal 900. In the example shown in FIG. 9, crystal growth 910 is along the b-axis. After crystallization is complete seed crystal 900 is detached from the grown HTS crystal by cleaving, cutting, or any other separating method.

In some embodiments, the HTS process for growing a HTS crystal includes growing a longitudinal a-b plane high temperature superconducting crystal with long fiber reinforced seed crystal (e.g., seed crystal 900); and cutting off the long fiber reinforced seed crystal from the longitudinal a-b plane high temperature superconducting crystal. In some embodiments, the seed crystal is placed in contact with HTS constituent component powders or compressed component powders, heated to allow the component powders to anneal or melt and crystalize into a crystal, and then the seed crystal is removed from contact with the newly annealed or crystalized crystal for reuse. In various embodiments, removal comprises cutting, cleaving, sawing, laser cutting, or any other appropriate separation technique.

In various embodiments, the high temperature superconducting material or component powders for the high temperature superconducting material comprises one or more of the following: a ceramic material, a copper oxide material, a rare earth copper oxide material (RE)BCO (e.g., (RE)$Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other high temperature superconducting material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, the seed crystal includes fibers comprising one or more of the following: Silicon (Si), Silicon Carbide (SiC), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), and/or Aluminum Titanium Nitride (AlTiN), and/or any other appropriate material.

In various embodiments, the fiber reinforced seed crystal (e.g., seed crystal 900) comprises a cylinder seed crystal, a rectangular crystal, a wheel shaped crystal, or any appropriate shaped crystal.

Figure 10:
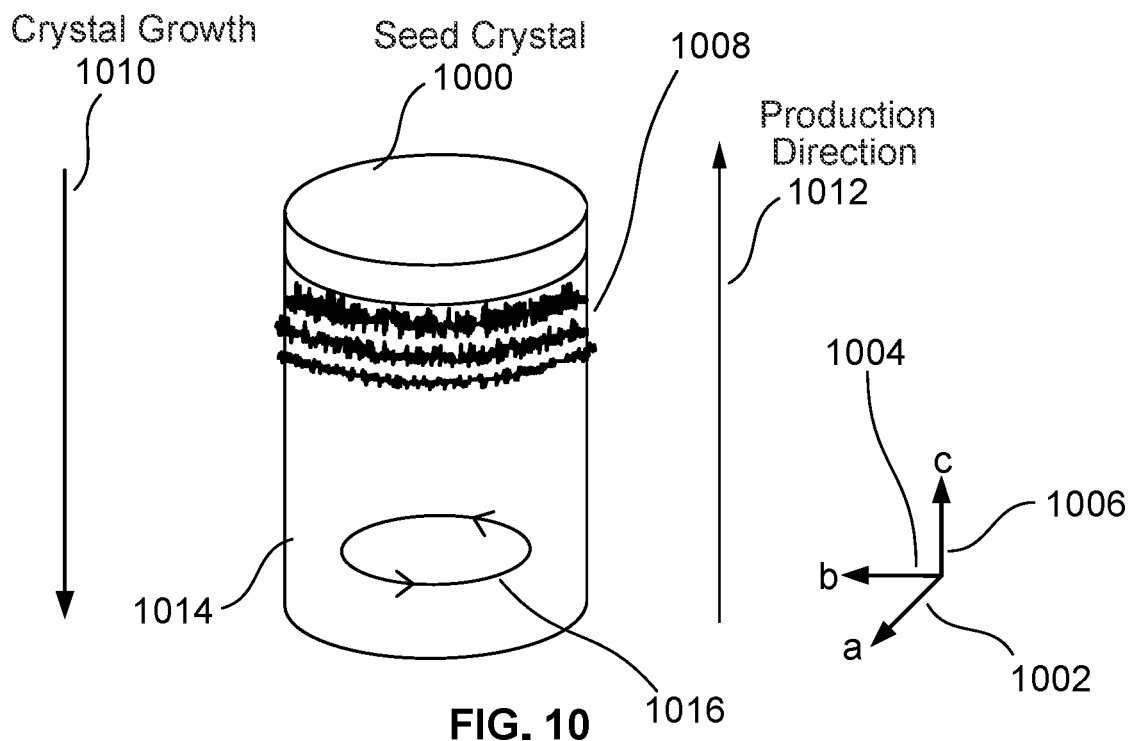
FIG. 10 is diagram illustrating a process for seeding HTS crystal growth.

FIG. 10 is diagram illustrating a process for seeding HTS crystal growth. In the example shown, seed crystal 1000 with the orientation of c-axis 1006 going up and down along the cylinder axis of seed crystal 1000 and a-axis 1002 and b-axis 1004 being perpendicular to the cylinder axis (e.g., in a horizontal plane) of seed crystal 1000 are shown. Seed crystal 1000 is put in contact (e.g., on a surface that is approximately an a-b plane) with HTS component materials that are heated and allowed to crystalize in zone 1008. Seed crystal 1000 acts to orient the HTS component material crystallization so that the axes are similar in the growing crystal in orientation to seed crystal 1000. In the example shown in FIG. 10, crystal growth 1010 is along a direction aligned with c-axis 1006. After crystallization is complete seed crystal 1000 is detached from grown HTS crystal 1014 by cleaving, cutting, or any other separating method. In some embodiments, the continuous production method creates a long HTS crystal with a longitudinal c-axis (e.g., with production direction 1012). Superconductivity currents within grown HTS crystal 1014 would be limited to the short radial distance from the crystal's center to its sides as shown by arrows 1016—in other words within a given a-b plane.

In some embodiments, the HTS process for growing a HTS crystal includes growing a longitudinal c-axis high temperature superconducting crystal with long fiber reinforced seed crystal; and cutting off the long fiber reinforced seed crystal (e.g., seed crystal 1000) from the longitudinal a-b plane high temperature superconducting crystal. In some embodiments, seed crystal 1000 is placed in contact with HTS constituent component powders or compressed component powders, heated to allow the component powders to anneal or melt and crystalize into a crystal, and then seed crystal 1000 is removed from contact with the newly annealed or crystalized crystal for reuse. In various embodiments, removal comprises cutting, cleaving, sawing, laser cutting, or any other appropriate separation technique.

In various embodiments, the high temperature superconducting material or component powders for the high temperature superconducting material comprises one or more of the following: a ceramic material, a copper oxide material, a rare earth copper oxide material (RE)BCO (e.g., (RE)$Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other high temperature superconducting material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, seed crystal 1000 includes fibers comprising one or more of the following: Silicon (Si), Silicon Carbide (SiC), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), and/or Aluminum Titanium Nitride (AlTiN), and/or any other appropriate material.

In various embodiments, the fiber reinforced seed crystal comprises a cylinder seed crystal, a rectangular crystal, a wheel shaped crystal, or any appropriate shaped crystal.

Figure 11A:
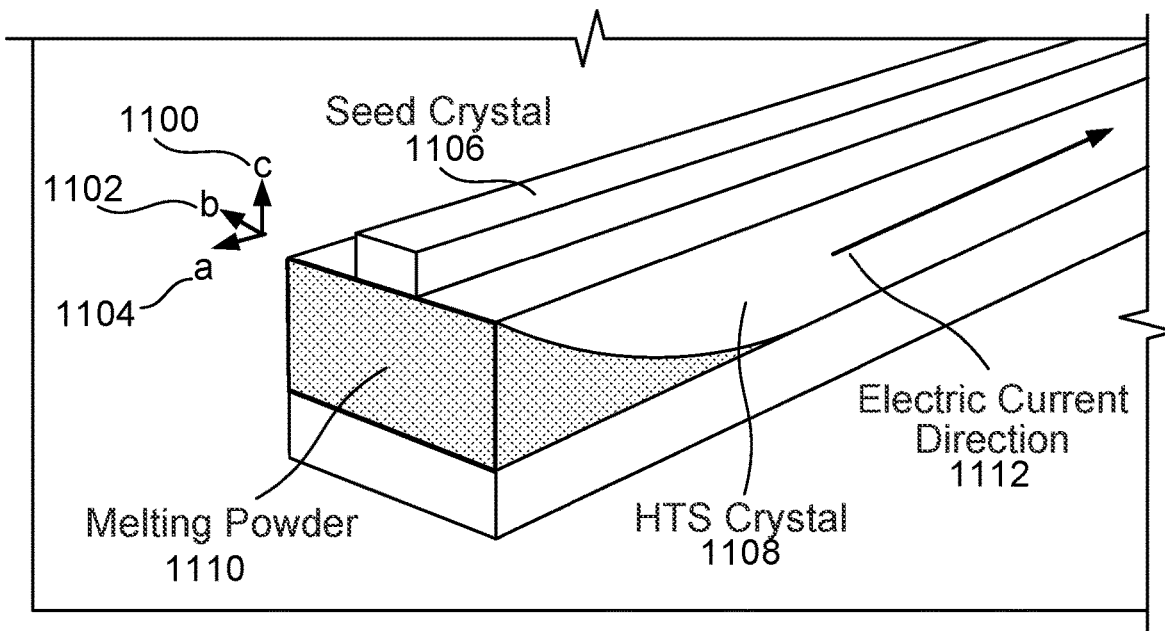
FIG. 11A is a diagram illustrating a process for seeding HTS crystal growth.

FIG. 11A is a diagram illustrating a process for seeding HTS crystal growth. In the example shown, seed crystal 1106 (e.g., an HTS seed crystal) with the orientation along c-axis 1100 going up and down is shown. Seed crystal 1106 is put in contact (e.g., on surface that is approximately a plane defined by a-axis 1104 and b-axis 1102) with HTS component materials that are heated/melted into melting powder 1110 and allowed to crystalize into HTS crystal

1108. Seed crystal 1106 acts to orient the HTS component material crystallization so that the axes are similar in the growing crystal in orientation to seed crystal 1106. In the example shown in FIGS. 11A and 11B, the crystal growth is along the a-axis. After crystallization is complete, seed crystal 1106 is detached from the grown HTS crystal 1108 by cleaving, cutting, or any other separating method. HTS crystal 1108 is able to carry current in electric current direction 1112.

In some embodiments, a fiber reinforced HTS crystal (e.g., seed crystal 1106) is grown with a longitudinal a-b plane by using a long fiber reinforced seed crystal. After HTS crystal 1108 formation and cooling, seed crystal 1106 is cut off and recycled for further use. The resulting HTS crystal 1108 will be much stronger for physical manipulation such as winding, and can carry much more current than exiting solutions using Powder-in-tube (PIT) or Coated HTS materials.

In some embodiments, the HTS process for growing HTS crystal 1108 includes growing a longitudinal a-axis high temperature superconducting crystal using seed crystal 1106 with long fiber reinforcement; and cutting off seed crystal 1106 from the longitudinal a-b plane grown HTS crystal 1108. In some embodiments, seed crystal 1106 is placed in contact with HTS constituent component powders or compressed component powders, heated to allow the component powders to anneal or melt into melting powder 1110 and crystalize into HTS crystal 1108, and then seed crystal 1106 is removed from contact with the newly annealed or crystalized crystal for reuse. In various embodiments, removal comprises cutting, cleaving, sawing, laser cutting, or any other appropriate separation technique.

In various embodiments, the high temperature superconducting material or component powders for the high temperature superconducting material in melting powder 1110 comprises one or more of the following: a ceramic material, a copper oxide material, a rare earth copper oxide material (RE)BCO (e.g., $(RE)Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsB material, a YbPdBC material, a NbGe material, and/or any other high temperature superconducting material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, seed crystal 1106 includes fibers comprising one or more of the following: Silicon (Si), Silicon Carbide (SiC), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), and/or Aluminum Titanium Nitride (AlTiN), and/or any other appropriate material.

In various embodiments, the fiber reinforced seed crystal comprises a rectangular crystal or any appropriate shaped crystal.

Figure 11B:
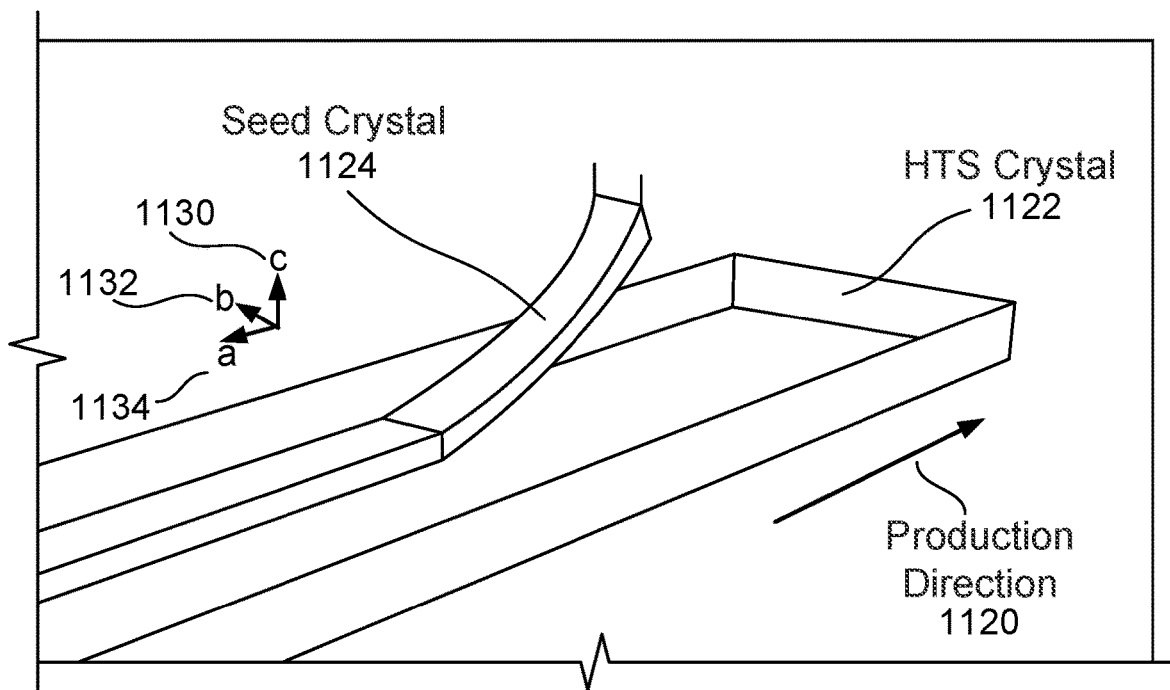
FIG. 11B is a diagram illustrating an embodiment of a process producing HTS crystals.

FIG. 11B is a diagram illustrating an embodiment of a process producing HTS crystals. In the example shown, HTS crystal 1122 is grown in production direction 1120. Seed crystal 1124 is separated after HTS crystal 1122 is formed to be reused for other HTS crystal formation. Production direction 1120 is along a-axis direction 1134. Seed crystal 1124 sits on top of HTS crystal 1122 in c-axis 1130 direction on a plane defined by a-axis 1134 and b-axis 1132.

The disclosed features/characteristics of Fiber Reinforced HTS with Longitudinal a or b Axis are: a) using seed crystal 1106 or seed crystal 1124 to grow a long HTS crystal with a longitudinal electricity conductive a or b axis, b) seed crystal 1106 or seed crystal 1124 can be cut off grown HTS crystal 1108 or HTS crystal 1122 and reused, and c) HTS crystal 1108 or HTS crystal 1122 will be cheaper, stronger, higher capacity, and more capable of 4D Control of Heat and Micro-magnetic Fields than PIT and Coated HTS wires and tapes.

Continuous Production of Fiber Reinforced HTS with Longitudinal a-b Axis

Figure 12:
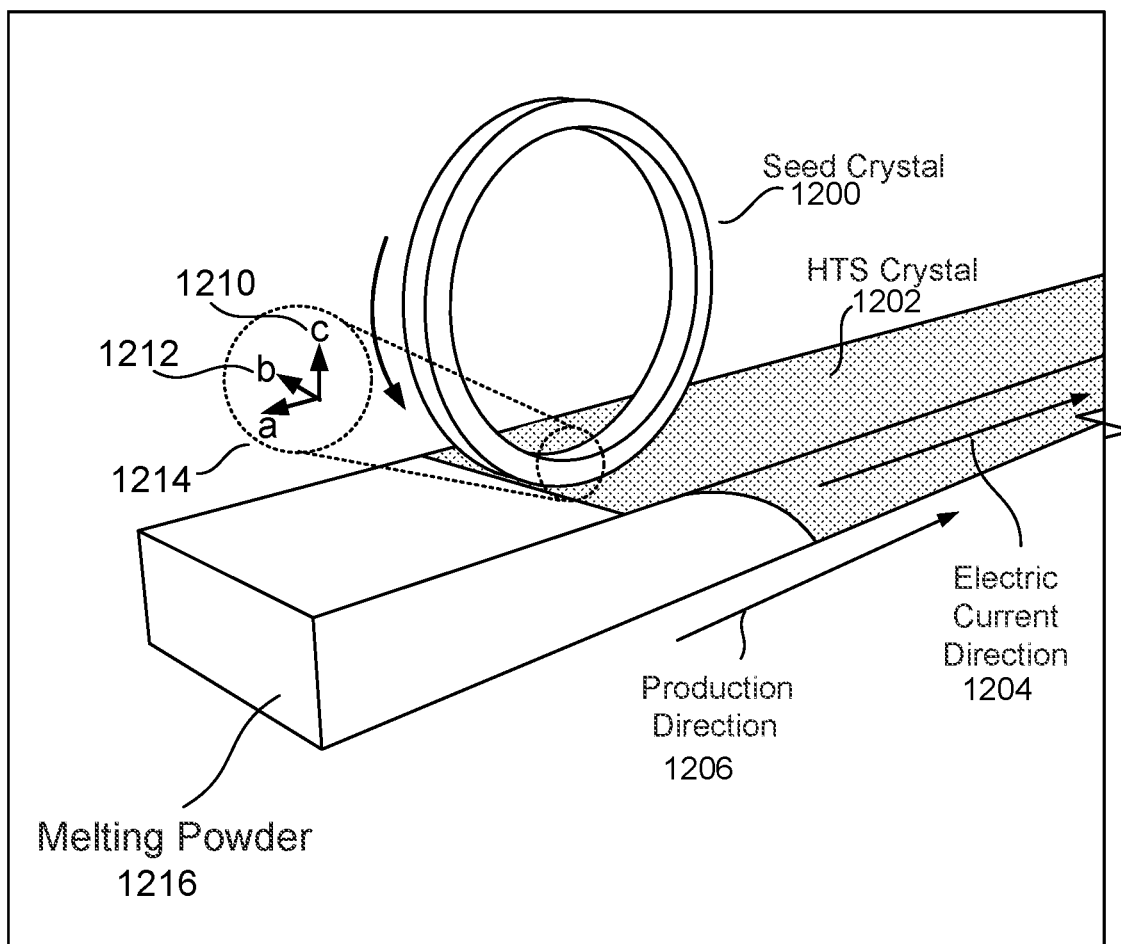
FIG. 12 is a diagram illustrating a process for seeding HTS crystal growth.

FIG. 12 is a diagram illustrating a process for seeding HTS crystal growth. In the example shown, seed crystal 1200 is shown with the orientation of c-axis 1210 of seed crystal 1200 going up and down when in contact with the growing HTS crystal 1202. Seed crystal 1200 is a wheel and when put in contact (e.g., on surface that is approximately a plane defined by a-axis 1214 and b-axis 1212 of crystal at bottom of seed crystal 1200) with HTS component materials that are heated and allowed to crystalize. Seed crystal 1200 is wheel shaped with c-axis of seed crystal 1200 pointed along a radius of the wheel shape of seed crystal 1200. Seed crystal 1200 acts to orient the HTS component material crystallization so that the axes are similar in the growing crystal in orientation to seed crystal 1200. In the example shown in FIGS. 12, the crystal growth is along production direction 1206 (e.g., along a-axis 1214). After crystallization is complete seed crystal 1200 is detached (e.g., rolled off or rolled off or cut or scraped off) from the grown HTS crystal 1202 by cleaving, cutting, or any other separating method. HTS crystal 1202 is able to carry electric current in electric current direction 1204.

Continuous production of fiber reinforced HTS with longitudinal a-b axis uses a rolling, fiber reinforced HTS Seed Crystal Wheel (e.g., seed crystal 1200) during crystallization in Continuous Production. The Wheel's speed matches the speed of the production line. After crystallization, the wheel is separated/cut from the complete HTS single crystal (e.g., HTS crystal 1202) which results in a reinforced HTS single crystal with longitudinal a-b axis. The Wheel rotates its seed crystal rim back to the point of sintering and crystallization in the production line for reuse.

With special HTS reinforcement fiber structures, continuous production can produce continuous HTS Wire/tape with superconducting a-b axis that is sufficiently strong and flexible for applications that previously used electricity conducting wire and/or tape.

In some embodiments, the HTS process for growing HTS crystal 1202 includes growing a longitudinal a-axis high temperature superconducting crystal with long fiber reinforced wheel seed crystal (e.g., seed crystal 1200); and cutting off the long fiber reinforced wheel seed crystal from the longitudinal a-b plane high temperature superconducting crystal. In some embodiments, the wheel seed crystal is placed in contact with HTS constituent component powders or compressed component powders, heated to allow the component powders to anneal or melt into melting powder 1216 and crystalize into a crystal, and then seed crystal 1200 is removed from contact with the newly annealed or crystalized HTS crystal 1202 for reuse. In various embodiments, removal comprises cutting, cleaving, sawing, laser cutting, or any other appropriate separation technique.

In various embodiments, the high temperature superconducting material or component powders for the high temperature superconducting material in melting powder 1216 comprises one or more of the following: a ceramic material, a copper oxide material, a rare earth copper oxide material (RE)BCO (e.g., $(RE)Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other high temperature superconducting material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, seed crystal 1200 includes fibers comprising one or more of the following: Silicon (Si), Silicon Carbide (SiC), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), and/or Aluminum Titanium Nitride (AlTiN), and/or any other appropriate material.

In various embodiments, the fiber reinforced seed crystal comprises a segmented crystal (e.g., a polygon, a hexagon, an octagon, a decagon, etc.), or any appropriate shaped crystal.

The disclosed features/characteristics of Continuous Production of Fiber Reinforced HTS With Longitudinal a or b Axes are: a) using a rolling, fiber reinforced HTS Seed Crystal Wheel during sintering and crystallization in Continuous Production, b) fiber reinforcement will give the Seed Crystal Wheel strength to withstand cutting and rotation reuse, and c) Continuous Production of Fiber Reinforced HTS With Longitudinal a or b Axes will significantly raise production efficiency and reduce costs for discrete HTS components and continuous HTS Wire/tapes.

Figure 13A:
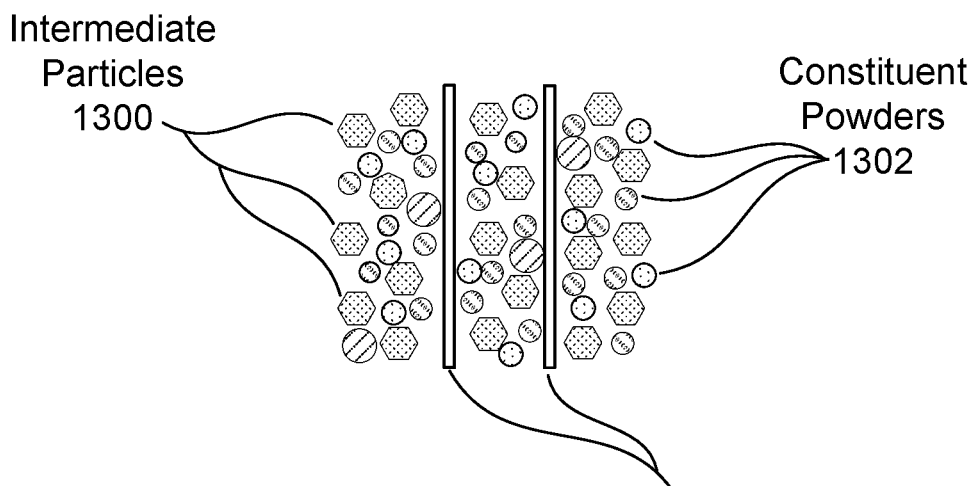
FIGS. 13A, 13B, and 13C are diagrams illustrating embodiments of a process for making a process for producing a HTS composition.
Figure 13B:
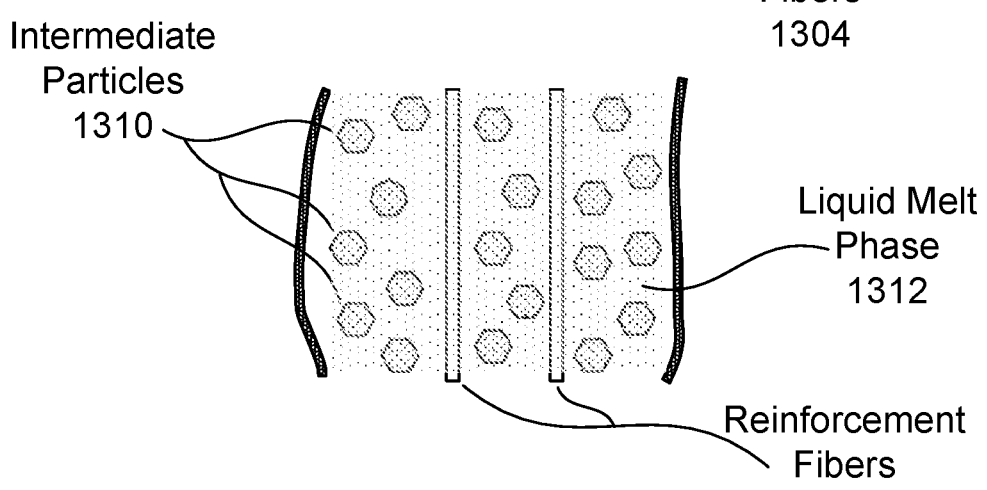
Figure 13C:
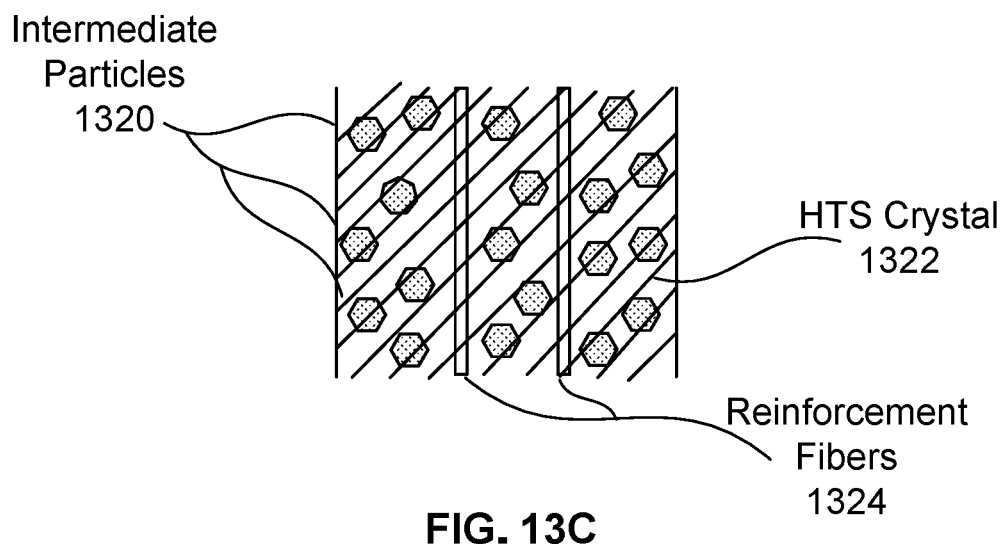

Using Intermediate Material with Fiber Reinforcement for Melt Phase Stability in HTS Production FIGS. 13A, 13B, and 13C are diagrams illustrating embodiments of a process for making a process for producing a HTS composition. In the examples shown, intermediate solid state powders and/or particles (e.g., intermediate particles 1300 of FIG. 13A) as well as high temperature superconducting constituent powder particles (e.g., constituent powders 1302 or FIG. 13A) for a HTS material are added to a mixture. Reinforcement fibers (e.g., reinforcement fibers 1304 or FIG. 13A) are placed or disposed within the powders. In some embodiments, the intermediate solid state powders, high temperature superconducting constituent powders, and the fiber reinforcement are compressed to form a high temperature superconducting shape. The high temperature superconducting shape is heated to crystallize the high temperature superconducting material. During the melt phase (e.g., liquid melt phase 1312 of FIG. 13B) the constituent powders liquefy but the reinforcement fibers (e.g., reinforcement fibers 1314 of FIG. 13B) stabilize the materials including the intermediate particles (e.g., intermediate particles 1310 of FIG. 13B). As shown in FIG. 13C when the constituent powders crystalize to create HTS crystal 1322, reinforcement fibers 1324 reinforce the HTS crystal material with the intermediate particles 1320 remaining within HTS crystal 1322.

In various embodiments, the high temperature superconducting constituent powders (e.g., constituent powders 1302) are used to make a high temperature superconducting material comprising one or more of the following: a ceramic material, a copper oxide material, a rare earth copper oxide material (RE)BCO (e.g., $(RE)Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, the reinforcement fiber (e.g., reinforcement fibers 1304, reinforcement fibers 1314, and reinforcement fibers 1324) comprises one or more of the following: Silicon (Si), Silicon Carbide (SiC), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), Aluminum Titanium Nitride (AlTiN), and/or any other appropriate material.

In some embodiments, the intermediate solid state powders comprise Y-211 powders.

Intermediate, non-superconducting solid states (e.g., intermediate particles 1320) can be added and compressed with fiber reinforcement and constituent powders efficiently to preform HTS shape before sintering. The Intermediate state particles together with the fiber reinforcement and careful heat control will contain the liquid melt phase within the shape as the constituent powders melt and crystalize as a solid HTS. For example, powder made of non-superconducting intermediates $Y_2BaCuO_5$ (Y-211), $(RE)_2BaCuOx$, (RE)BaCuO, $(RE)Ba_2Cu_3O_{7-x}$ can be used with fiber reinforcement for the production of HTS $YBa_2Cu_3O_{7-x}$ (Y-123) and more generally $(RE)Ba_2Cu_3O_{7-x}$ where RE stands for the various Rare Earth elements, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). Fiber reinforcement together with the added Y-211 will act to retain the liquid melt phase within the compacted shape of presintered HTS even as the constituent powders melt and then crystallize as a solid HTS crystal.

Using the above process, the final HTS size will not suffer as much from shrinkage and other defects.

The fiber will stablize Y-211 or other intermediates drifting causing better distribution and less agglomeration of remaining Y-211 particles or other intermediates for better Flux Pinning.

The disclosed features/characteristics of using Intermediate Material with fiber reinforcement for melt phase stability in HTS production are: a) mixing and compressing Intermediate Material particles with fiber reinforcement and constituent powders to preform HTS shape before sintering, b) the Intermediate state particles together with the fiber reinforcement and careful heat control will contain the liquid melt phase within the shape as the constituent powders melt and then crystalize as a solid HTS, c) final HTS size will not suffer as much from shrinkage and other defects, and d) the fiber will stablize Y-211 or other intermediates drifting causing better distribution and less agglomeration of remaining Y-211 particles or other intermediates for better Flux Pinning.

Segmented Fiber Reinforced HTS Wire/Tape: Batch Produced Segments

Segments of fiber reinforced HTS can be linked along their longitudinal superconducting a-b axis with malleable electrically conducting wire. In some embodiments, the malleable electrically conducting wire comprises the one or more continuous fibers.

The resulting chain of HTS segments can be wound and manipulated into shapes and forms such as cables, buses, shunts, solenoids, etc. due to the flexibility of the connecting wire without excessively straining HTS segment crystals.

The disclosed features/characteristics of making Segmented Fiber Reinforced HTS Wire/tape with batched produced segments are a) producing a chain of single crystal HTS reinforced segments linked along their a-b axis by linking batch produced HTS segments with malleable electrically conducting wire, and b) the HTS Wire/tape can be wound and manipulated into shapes and forms such as cables, solenoids, etc. due to the flexibility of the connecting wire without excessively straining HTS segment crystals. This will make HTS Wire/tape which is stronger, higher capacity, and more capable of 4D Control of Heat and Micro-magnetic Fields than PIT and Coated HTS.

Segmented Fiber Reinforced HTS Wire/Tape: Continuously Produced Segments

Figure 14A:
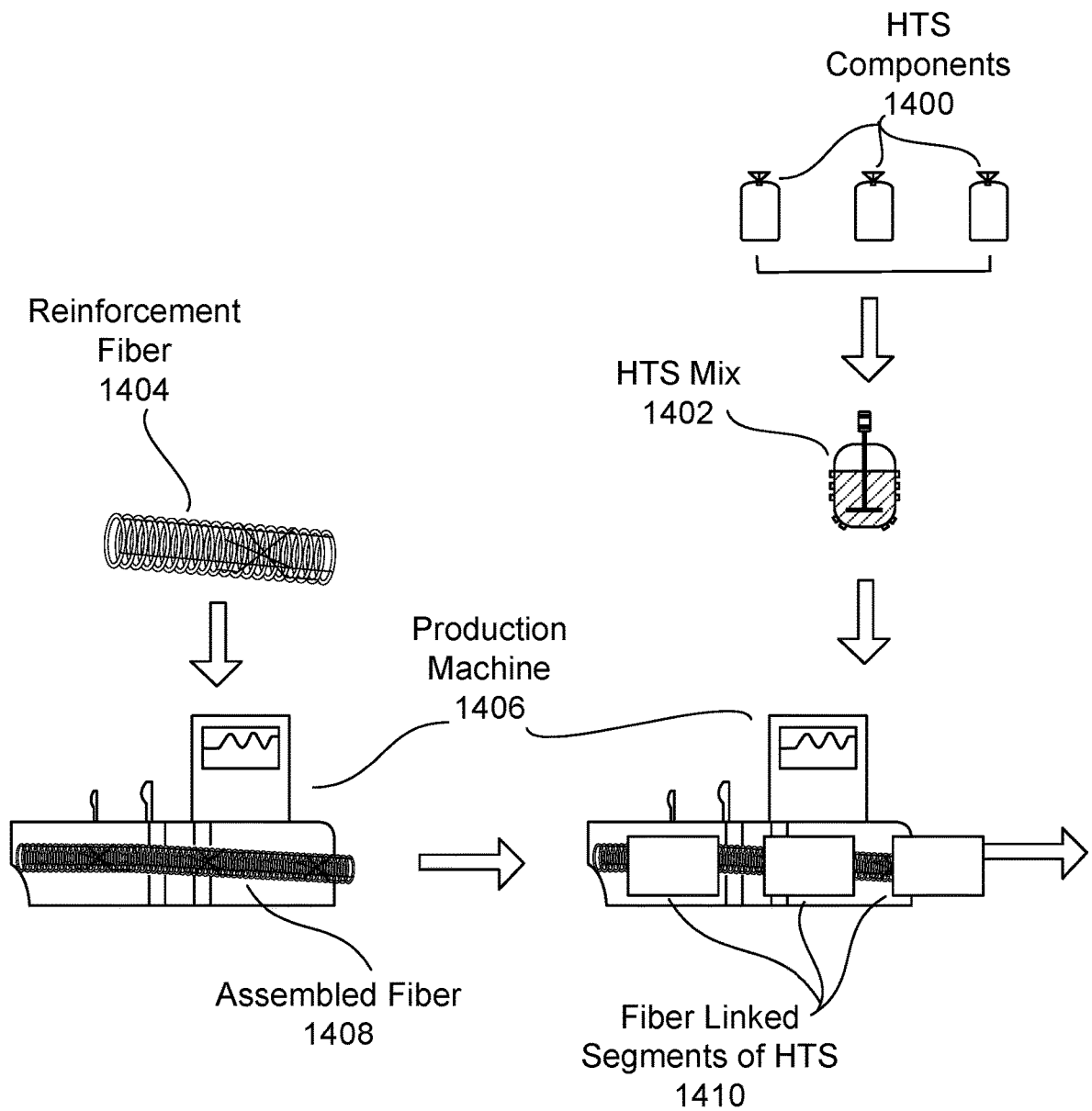
FIG. 14A is a diagram illustrating an embodiment of a process for producing a HTS reinforced composition.

FIG. 14A is a diagram illustrating an embodiment of a process for producing a HTS reinforced composition. In the example shown, reinforcement fiber 1404 are assembled to create assembled fiber 1408 by production machine 1406. In some embodiments, assembled fiber 1404 comprises one type of fiber (e.g., reinforcement fiber is made of one type of material). In some embodiments, assembled fiber 1404 comprises multiple types of fiber (e.g., reinforcement fiber is made of one type of material that is to be within HTS segments and one type of material that is to be between HTS segments). For example, the assembled fiber 1404 has strengthening fibers for HTS segments and flexible fibers between HTS segments. Assembled fiber 1408 is used to create fiber linked segments of HTS 1410. Production machine 1406 receives HTS components 1400 which are transformed into HTS mix 1402 by grinding HTS components 1400 into powders and mixing. HTS mix 1402 is used to create a segment shape. The segment shape is heated to melt HTS mix 1402 and then allowed to cool to crystallize into an HTS material with reinforcement fibers inside the HTS material and reinforcement fibers between the segment shapes. In various embodiments, the reinforcement fibers are in the shape of wires and/or tape, meshes, nets, or any other appropriate structure or shape. In some embodiments, between the segments of HTS material there is an intermediate material (e.g., comprising a conducting material) along with the fiber reinforcement material.

In various embodiments, the high temperature superconducting material (e.g., the HTS material of fiber linked segments of HTS) made from the HTS component powders comprises one or more of the following: a ceramic material, a copper oxide material, a rare earth copper oxide material (RE)BCO (e.g., (RE)Ba$_2$Cu$_3$O$_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, the reinforcement fibers (e.g., reinforcement fiber 1404 that are assembled into assembled fiber 1408 and link segments of fiber linked segments of HTS 1410) comprise one or more of the following: Silicon (Si), Silicon Carbide (SiC), Silicon Nitride (Si$_3$N$_4$), Silicates including Silicon Dioxide (SiO2), Boron (B), Boron Carbide (B$_4$C), Boron Nitride (BN), Chromium (Cr), Chromium Carbides (Cr$_3$C$_2$, Cr$_7$C$_3$, Cr$_{23}$C$_6$), Chromium Nitrides (CrN, Cr$_2$N), Hafnium Carbide (HfC), Zirconium Carbide (ZrC), Zirconium Nitride (ZrN), Zirconium Diboride (ZrB$_2$), Titanium (Ti), Titanium Carbide (TiC), Titanium nitride (TiN), Tungsten Carbide (WC), Aluminum (Al), Alumina (Al$_2$O$_3$), Aluminum Carbide (Al$_4$C$_3$), Aluminum Nitride (AlN), Titanium Aluminum Nitride (TiAlN), Aluminum Titanium Nitride (AlTiN), and/or any other appropriate material.

In continuous production, reinforcement fibers 1404 used to reinforce the HTS can be extended beyond the segment's ends in the longitudinal a-b lane to form the next HTS segment in a chain. In practice, this means that a continuous production line has regular intervals where component powders are not added to the reinforcement in a production casing. In some embodiments, the HTS segment form is maintained by using Intermediate Material with Fiber Reinforcement for melt phase stability. The intermediate material can be removed after HTS crystal formation. For example, the intermediate material can have a higher melt temperature than HTS components 1400 and not be melted and crystalized by production machine 1406. This creates a gap between HTS segments bridged by reinforcement fiber. If needed, electricity conducting material can then be deposited on the bridging fiber and exposed HTS segment ends through sputtering or other coating processes.

The disclosed features/characteristics of making Segmented Fiber Reinforced HTS Wire/tape with batched produced segments are a) producing a chain of single crystal HTS reinforced segments linked along their a-b axis by creating intervals in a continuous production line where HTS component powder is NOT deposited into the reinforcement+production casing before sintering creating gaps which are bridged by reinforcing fiber, b) HTS segment form is maintained by using Intermediate Material with Fiber Reinforcement for melt phase stability, c) once sintering and crystallization are complete, deposit conducting material in the gaps between segments on the bridging reinforcement fibers and the exposed segment ends, and d) the HTS Wire/tape can be wound and manipulated into shapes and forms such as cables, solenoids, etc. due to the flexibility of the connecting wire without excessively straining HTS segment crystals. Continuous production will increase production efficiency and lower costs significantly. This will make HTS Wire/tape which is cheaper, stronger, higher capacity, and more capable of 4D Control of Heat and Micro-magnetic Fields than PIT and Coated HTS.

HTS Solenoids

Fiber Reinforced HTS can be used to make solenoids. Solenoids are the most widely used form of non-permanent magnets. Attempts to use unreinforced HTS in solenoids fail because brittle, single crystal unreinforced HTC is difficult to wrap or wind metallic wires without cracking.

The below disclosure describes three different processes to make Solenoids from Fiber Reinforced HTS.

I. Winding Fiber Reinforced HTS Wire a. Continuous

Continuous Fiber Reinforced HTS Wire/tape produced by continuous production is wound into a Solenoid coil with or without a ferromagnetic core. In some embodiments, braided or multi-stranded HTS structures are wound or formed into a coil form in order to create a solenoid. In some embodiments, braided or multi-stranded HTS structures include staggered lengths of individual fibers to create the braided or multi-stranded HTS structures.

The disclosed features/characteristics of making HTS Solenoids by winding continuous Fiber Reinforced HTS Wire/tape are that fiber reinforcement in continuous production gives HTS sufficient strength and flexibility to be wound into solenoids without cracking.

b. Segmented

Figure 14B:
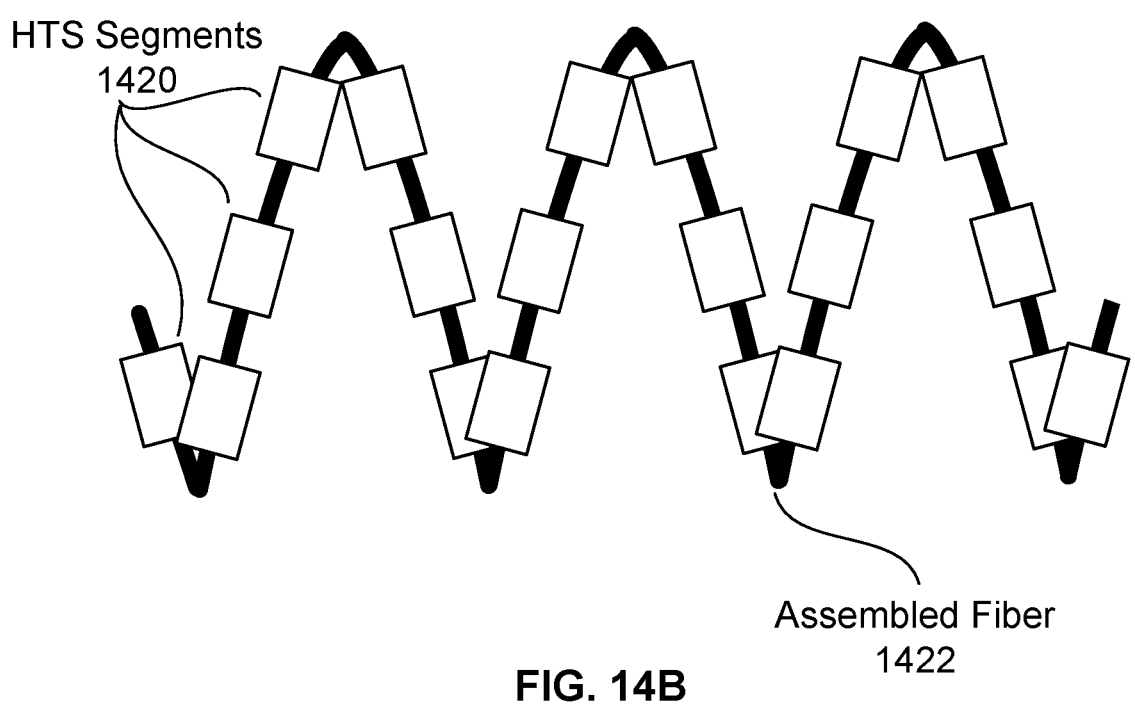
FIG. 14B is a diagram illustrating an embodiment of a wound solenoid.

FIG. 14B is a diagram illustrating an embodiment of a wound solenoid. In the example shown, HTS segments 1420 that are attached via assembled fiber 1422 are wound into a solenoid. Assembled fiber enables flexibility to the series of HTS segments 1420. In some embodiments, assembled fiber 1422 enables strengthening of HTS segments 1420 as well as electrical conductivity between segments.

In various embodiments, HTS segments 1420 comprises one or more of the following: a ceramic material, a copper oxide material, a rare earth copper oxide material (RE)BCO (e.g., (RE)Ba$_2$Cu$_3$O$_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, assembled fiber 1422 comprise one or more of the following: Silicon (Si), Silicon Carbide (SiC), Silicon Nitride (Si$_3$N$_4$), Silicates including Silicon Dioxide (SiO2), Boron (B), Boron Carbide (B$_4$C), Boron Nitride (BN), Chromium (Cr), Chromium Carbides (Cr$_3$C$_2$, Cr$_7$C$_3$, Cr$_{23}$C$_6$), Chromium Nitrides (CrN, Cr$_2$N), Hafnium Carbide (HfC), Zirconium Carbide (ZrC), Zirconium Nitride (ZrN), Zirconium Diboride (ZrB$_2$), Titanium (Ti), Titanium Carbide (TiC), Titanium nitride (TiN), Tungsten Carbide (WC), Aluminum (Al), Alumina (Al$_2$O$_3$), Aluminum Carbide (Al$_4$C$_3$), Aluminum Nitride (AlN), Titanium Aluminum Nitride (TiAlN), Aluminum Titanium Nitride (AlTiN), and/or any other appropriate material.

In some embodiments, assembled fiber 1422 is coated after HTS segments 1420 are formed. In some embodiments, the coating comprises an electrically conductive coating.

Segmented Fiber Reinforced HTS Wire/tape produced by batch or continuous production is wound into a Solenoid coil with or without a ferromagnetic core.

The disclosed features/characteristics of making HTS Solenoids by winding Segmented Fiber Reinforced HTS Wire/tape are a) connecting small, fiber reinforced HTS segments along their a-b planes with malleable, conducting wire or reinforcing fiber coated with electric conducting material into a chain which mimics wire/tape, and b) winding the HTS segment chain into a spiral to form an HTS Solenoid. The malleable conducting wire/conductor coated reinforcing fiber allows the chain to be wound into a Solenoid while the HTS reinforcement provides strength so that a) individual HTS single crystal segments can be physically wound without cracking and b) individual segments can be large/long enough to be economically and technically viable for Solenoid use without cracking. This will make HTS Solenoids which are cheaper, stronger, higher capacity, and more capable of 4D Control of Heat and Micro-magnetic fields than PIT and Coated HTS.

II. Bore and Cut Process

FIGS. 15A-E are diagrams illustrating a process for creating a HTS solenoid structure. In the example shown, seed crystal 1500 of FIG. 15A runs down the bore of the solenoid structure. The process includes the following steps:

1) form a reinforced fiber structure (e.g., fiber reinforcement 1502 of FIG. 15A) in the shape of a spiral to produce long a-b axis Reinforced HTS crystal with a radial c axis (e.g., in close up view seed crystal c-axes 1501 are shown pointed out along the radius of the wire or rod). The HTS crystal is seeded from a thin radial c-axis, pre-crystallized HTS wire or rod situated in the middle of the constituent powder and reinforcement spiral. In various embodiments, fiber reinforcement 1502 comprises a single fiber, a braided fiber, a multi-stranded fiber, or any other appropriate reinforcement fiber. Fiber reinforcement 1502 and seed crystal 1500 are embedded in HTS component powders and then melted and allowed to cool to form an HTS crystal.

Figure 15A:
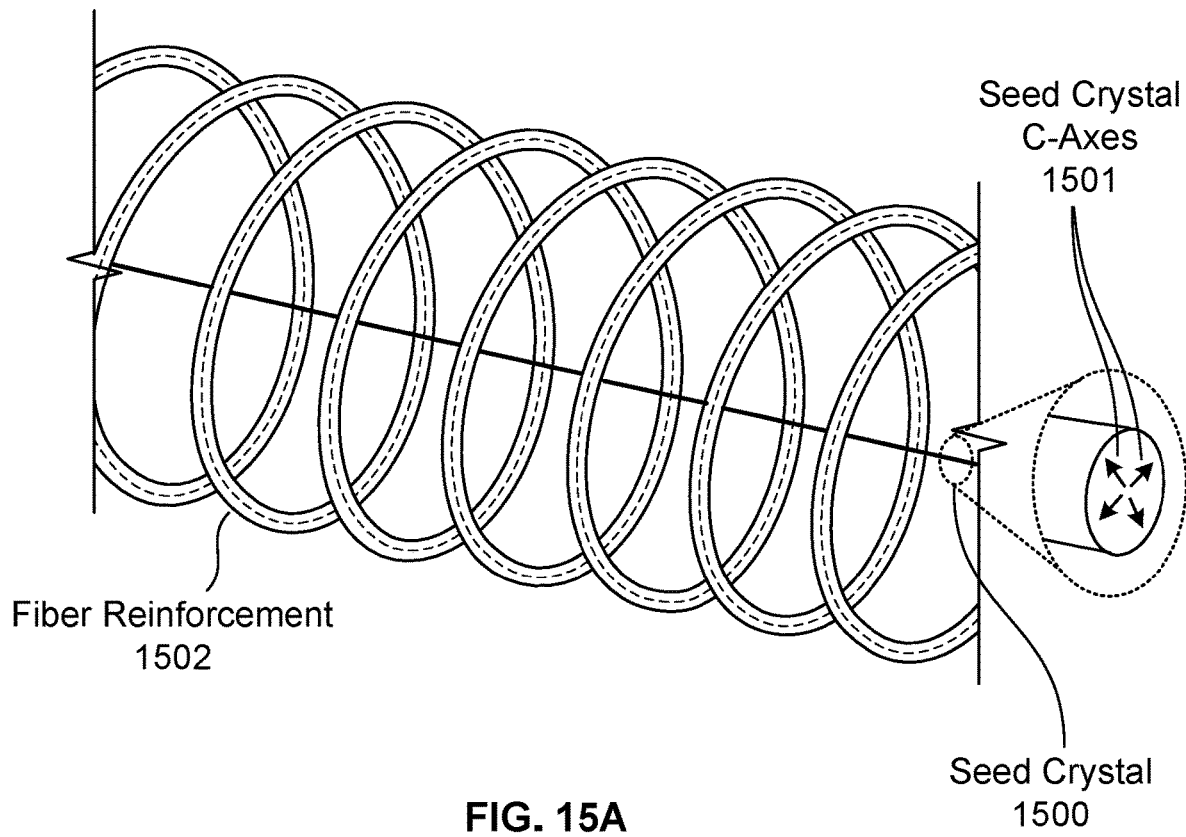
FIGS. 15A-E are diagrams illustrating a process for creating a HTS solenoid structure.
Figure 15B:
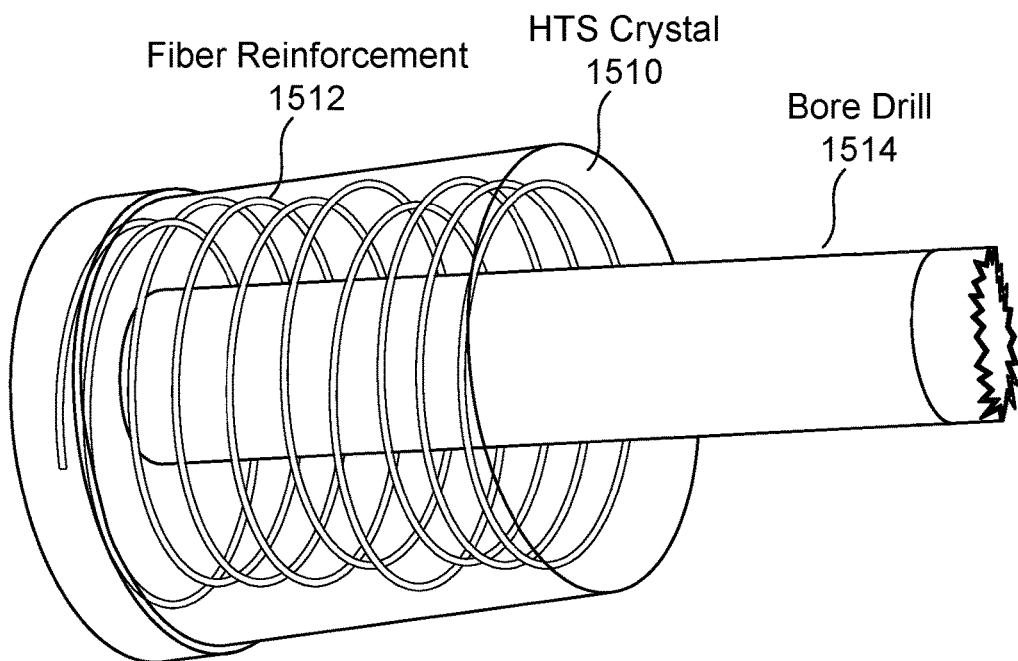
Figure 15C:
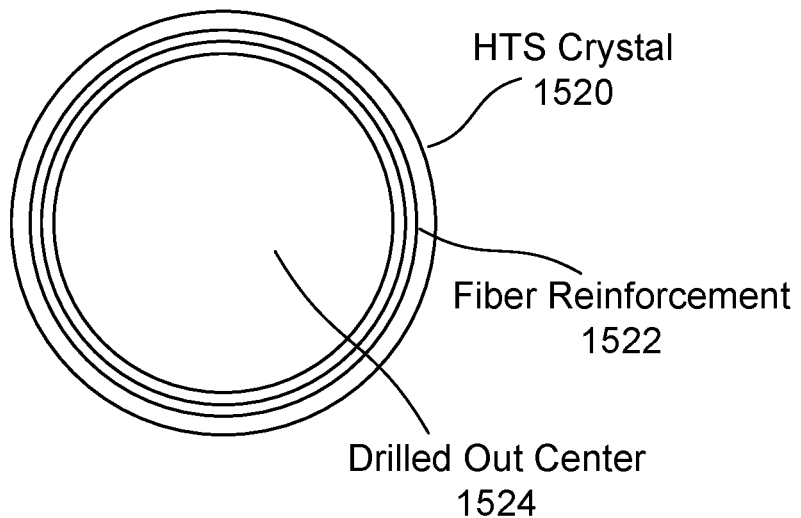

2) bore out the internal core of the HTS crystal using bore drill 1514 of FIG. 15B to form a hollow column within HTS crystal 1510 of FIG. 15B to form a cylinder with spiral fibers (e.g., fiber reinforcement 1512 of FIG. 15B) that are reinforcing the walls of the cylinder. FIG. 15C shows an axial view of HTS crystal 1520 with drilled out center (e.g., drilled out center 1524) and with fiber reinforcement 1522 in the walls.

Figure 15D:
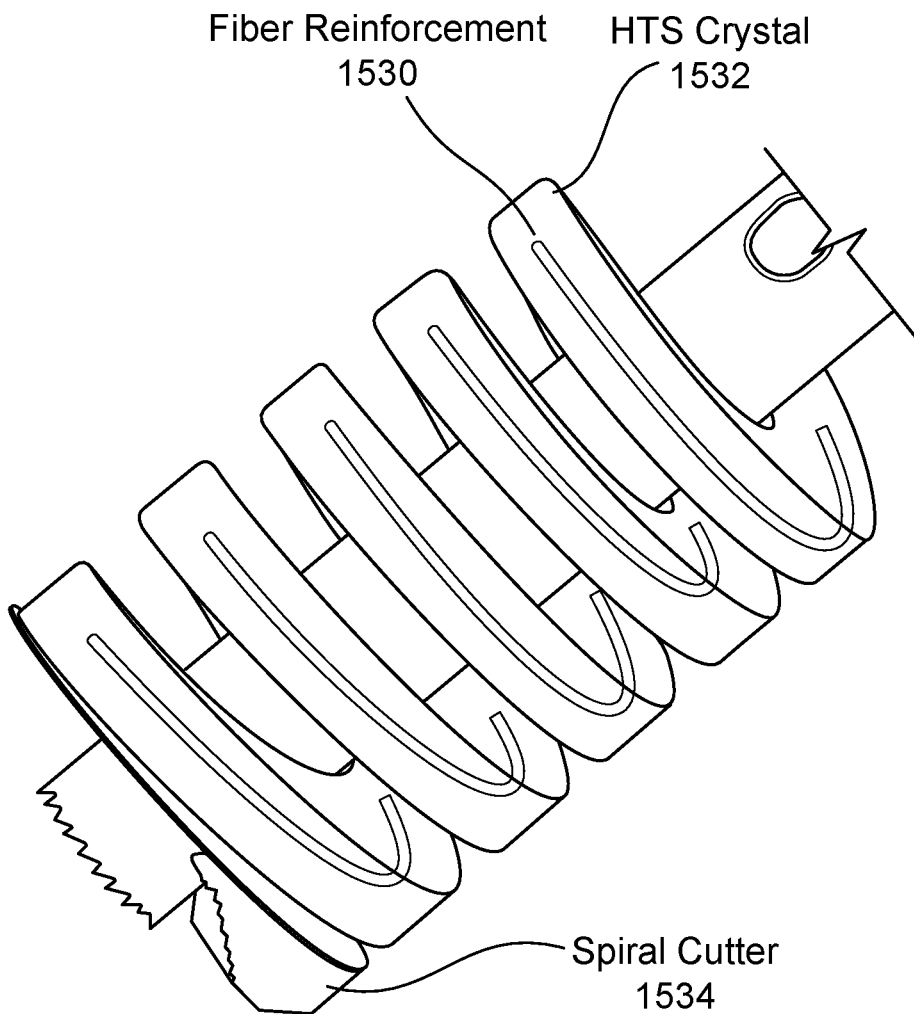
Figure 15E:
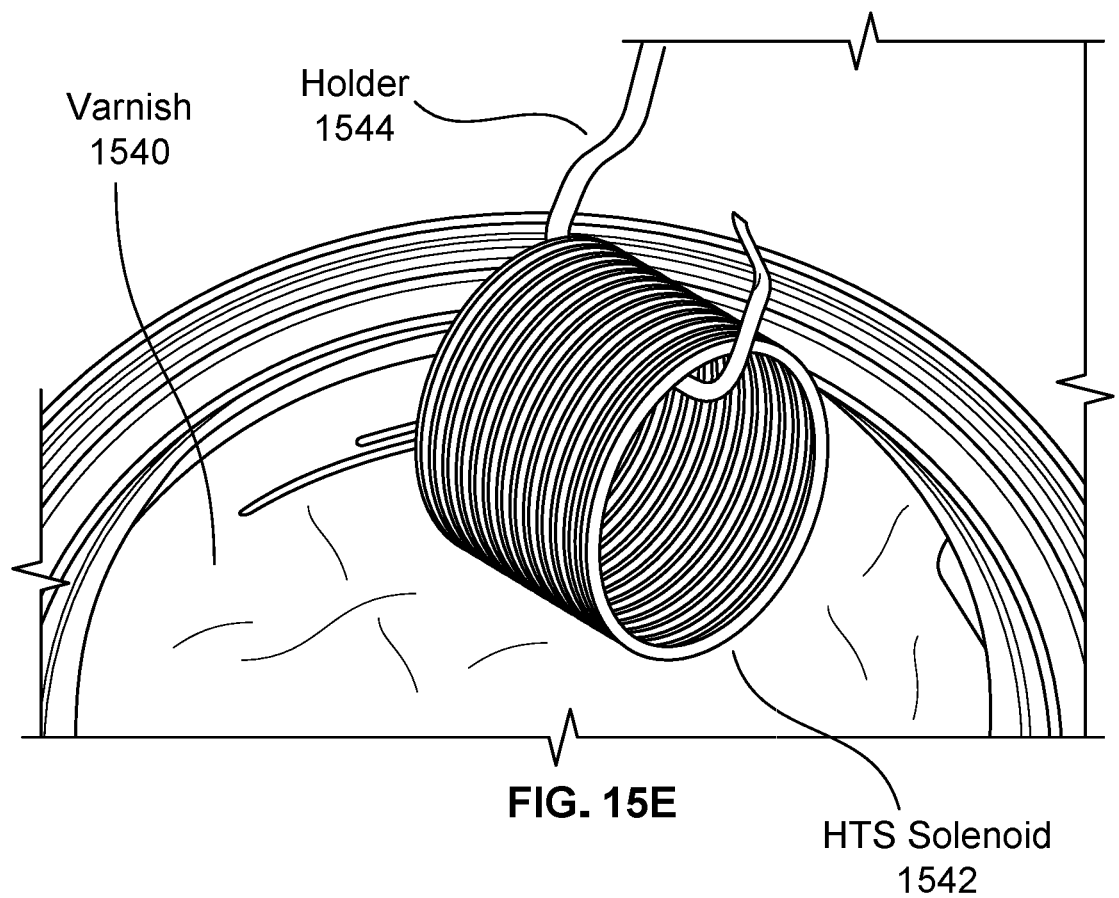

3) cut the Reinforced HTS column using spiral cutter 1534 of FIG. 15D radially in the gap between individual reinforcement spirals to produce spiral solenoid HTS crystal 1532 with fiber reinforcement 1530 of FIG. 15D. Spiral solenoid comprises a Reinforced HTS Solenoid with a-b axis along the solenoid's spirals.

4) Fill the gap cut and coat the HTS solenoid coil with insulation varnish. For example, HTS Solenoid 1542 is held using holder 1544 and dipped in varnish 1540 (see FIG. 15E). In various embodiments, varnish is applied using a sprayer, coater, mister, or any other appropriate manner for insulating the solenoid coil. For solenoid applications requiring a magnetic core, ferromagnetic material is then placed in the HTS Solenoid coil.

In various embodiments, HTS seed crystal or HTS crystal (e.g., seed crystal 1500, HTS crystal 1510, HTS crystal 1520, HTS crystal 1532, or HTS solenoid 1542) comprises one or more of the following: a ceramic material, a copper oxide material, a rare earth copper oxide material (RE)BCO (e.g., $(RE)Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, fiber reinforcement (e.g., fiber reinforcement 1502, fiber reinforcement 1512, fiber reinforcement 1522, or fiber reinforcement 1530) comprise one or more of the following: Silicon (Si), Silicon Carbide (SiC), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), Aluminum Titanium Nitride (AlTiN), and/or any other appropriate material.

The disclosed features/characteristics of making HTS Solenoids by the Bore and Cut Process are a) using spiral form reinforcement structure made out of Reinforcing Fiber to create Fiber Reinforced HTS With Longitudinal a-b Axis, b) boring/drilling out the core of the Reinforced HTS crystal leaving a hollow HTS crystal column with spirally reinforced walls, c) coating all surfaces of the HTS crystal spiral with insulation material, and d) if a magnetic core is desired, place a ferromagnetic core in the solenoid. This will produce an HTS Solenoid coil without the need to wind HTS wire or tape as required for PIT and Coated HTS. This will also make HTS Solenoids which are cheaper, stronger, higher capacity, and more capable of 4D Control of Heat and Micro-magnetic Fields than PIT and Coated HTS.

III. Seed Crystal Wheel Process

Figure 16A:
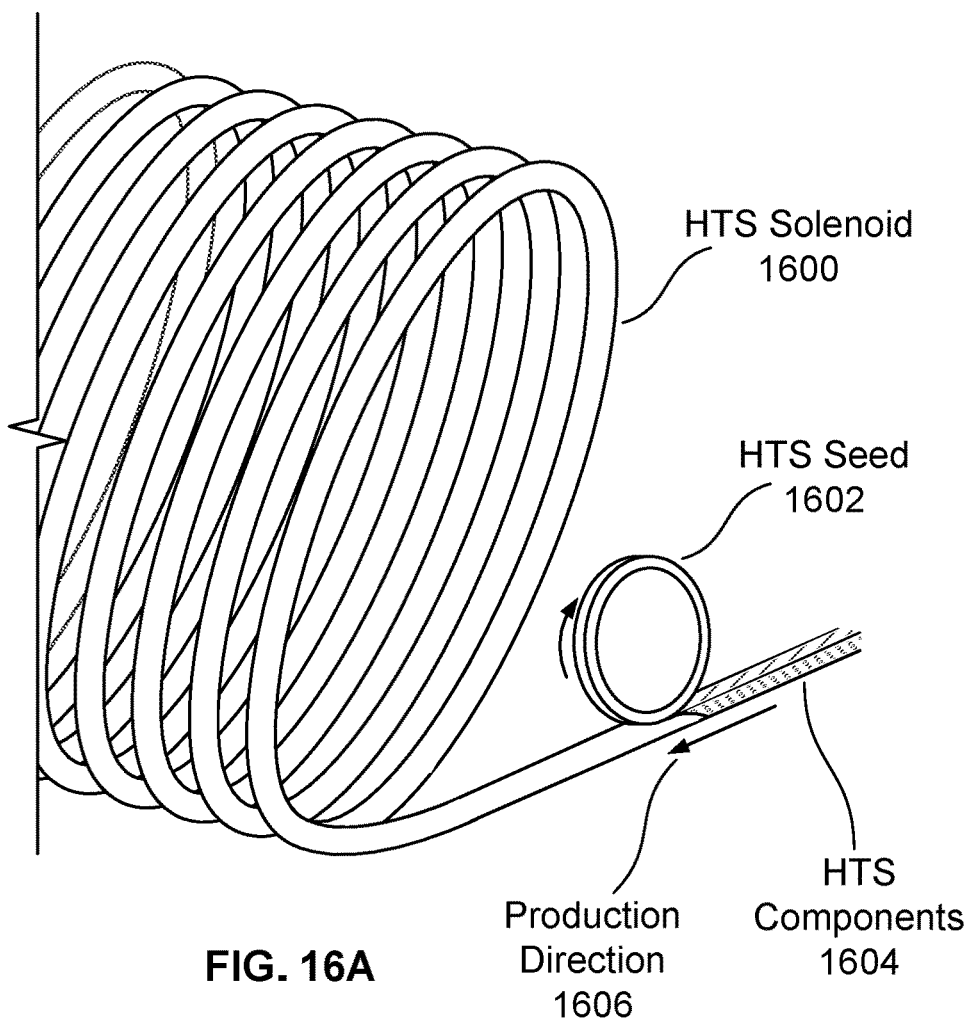
FIGS. 16A-B are diagrams illustrating a process for creating a spiral.
Figure 16B:
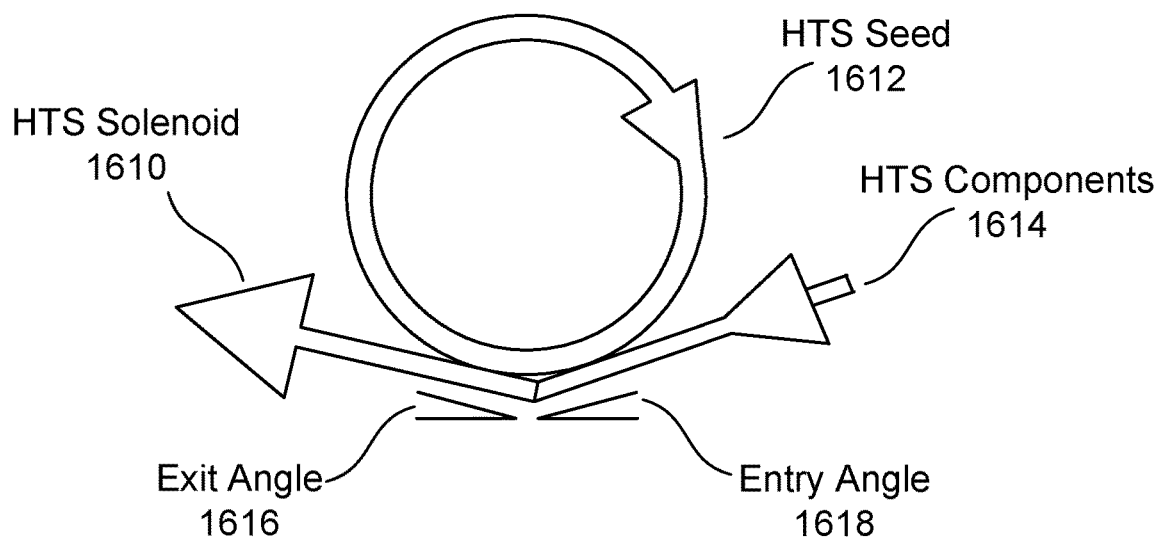

FIGS. 16A-B are diagrams illustrating a process for creating a spiral. In the examples shown, HTS components 1604 or HTS components 1614 (e.g., powders and fiber reinforcement within a casing or powders compressed into a form with fiber reinforcement) are heated to melting while in contact with HTS seed 1602 or HTS seed 1612 and allowed to crystalize to create HTS solenoid 1600 or HTS solenoid 1610. The continuous production is in production direction 1606 and creates a curvature in the produced HTS material resulting in a spiral (e.g., to produce HTS solenoid 1600 or HTS solenoid 1610). The curvature is created at least in part using entry angle 1618 and exit angle 1616 in conjunction with HTS seed 1612 wheel shape.

This method introduces curvature along the HTS crystal's longitudinal axis by varying entry angle 1618 and exit angle 1616 when the HTS production tube is in contact with the rolling HTS Seed Crystal Wheel (e.g., HTS seed 1602 or HTS seed 1612) during crystallization. This angle differential will naturally produce a continuous circular single HTS crystal during Continuous Production. Varying the angle differential will create different circle radiuses. The larger the differential, the small the radius of the crystal circle. The creation of a spiral can be created by bending (e.g., perpendicular to the HTS seed wheel—not shown in FIG. 16A or FIG. 16B).

In various embodiments, HTS components, crystals, and seed material (e.g., materials for HTS seed 1602, HTS components 1604, HTS solenoid 1600, HTS seed 1612, HTS solenoid 1610, or HTS components 1614) comprise one or more of the following: a ceramic material, a copper oxide material, a rare earth copper oxide material (RE)BCO (e.g., $(RE)Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, reinforcement fiber within HTS materials above comprise one or more of the following: Silicon (Si), Silicon Carbide (SiC), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), Aluminum Titanium Nitride (AlTiN), and/or any other appropriate material.

Figure 17:
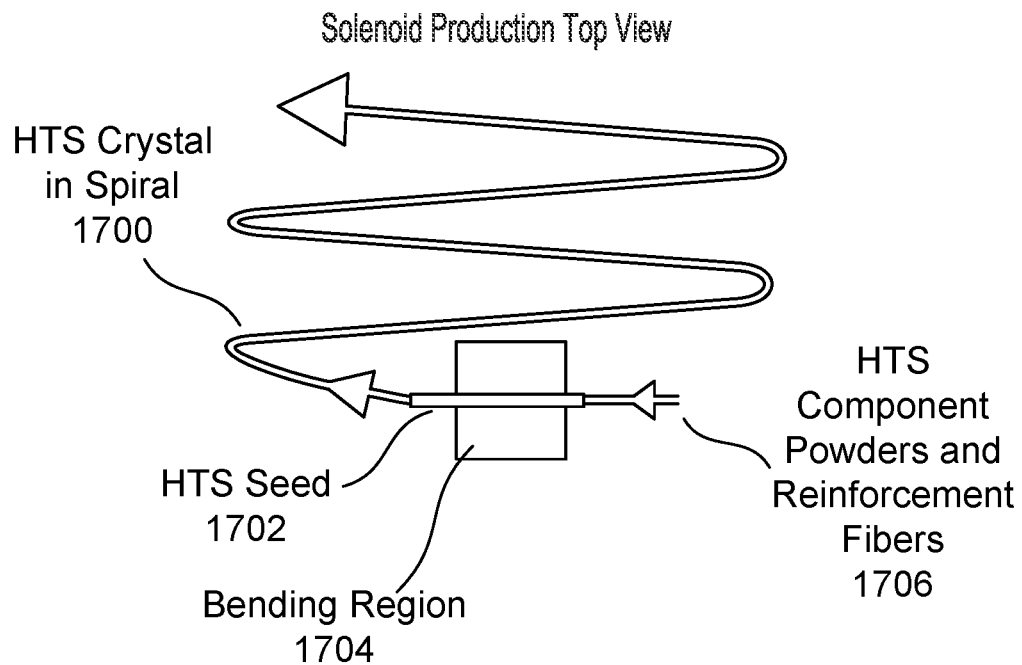
FIGS. 17 is a diagram illustrating a process for creating a spiral using bending.

FIGS. 17 is a diagram illustrating a process for creating a spiral using bending. In the example shown, HTS component powders and reinforcement fibers 1706 (e.g., powders and fiber reinforcement within a casing or powders compressed into a form with fiber reinforcement) are heated to melting while in contact with HTS seed 1702 (e.g., a seed crystal wheel shown from a top view) and allowed to crystalize to create HTS crystal in spiral 1700. The continuous production creates a curvature in the produced HTS material resulting in a spiral (e.g., to produce HTS solenoid).

The curvature is created in bending region 1704 in conjunction with the wheel shape of HTS seed 1702.

In various embodiments, HTS materials (e.g., materials made from HTS component powders, materials in HTS seed 1702, or HTS crystal in spiral 1700) comprise one or more of the following: a ceramic material, a copper oxide material, a rare earth copper oxide material (RE)BCO (e.g., (RE)Ba$_2$Cu$_3$O$_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, reinforcement fibers (e.g., in HTS component powders and reinforcement fibers 1706) comprise one or more of the following: Silicon (Si), Silicon Carbide (SiC), Silicon Nitride (Si$_3$N$_4$), Silicates including Silicon Dioxide (SiO2), Boron (B), Boron Carbide (B$_4$C), Boron Nitride (BN), Chromium (Cr), Chromium Carbides (Cr$_3$C$_2$, Cr$_7$C$_3$, Cr$_{23}$C$_6$), Chromium Nitrides (CrN, Cr$_2$N), Hafnium Carbide (HfC), Zirconium Carbide (ZrC), Zirconium Nitride (ZrN), Zirconium Diboride (ZrB$_2$), Titanium (Ti), Titanium Carbide (TiC), Titanium nitride (TiN), Tungsten Carbide (WC), Aluminum (Al), Alumina (Al$_2$O$_3$), Aluminum Carbide (Al$_4$C$_3$), Aluminum Nitride (AlN), Titanium Aluminum Nitride (TiAlN), Aluminum Titanium Nitride (AlTiN), and/or any other appropriate material.

The Solenoid's spiral shape is formed by slightly bending the production tube laterally during crystal formation in bending region 1704. This bend will cause the circular crystal to form a natural spiral. Spacing between spirals will be adjusted by the degree of lateral bending: the larger the bend the greater the spacing. This rigid preformed Solenoid will not need the physical manipulation of winding. The bend during crystallization can be induced by: a) Speed, b) Temperature, and/or c) Casing Geometry.

Figure 18:
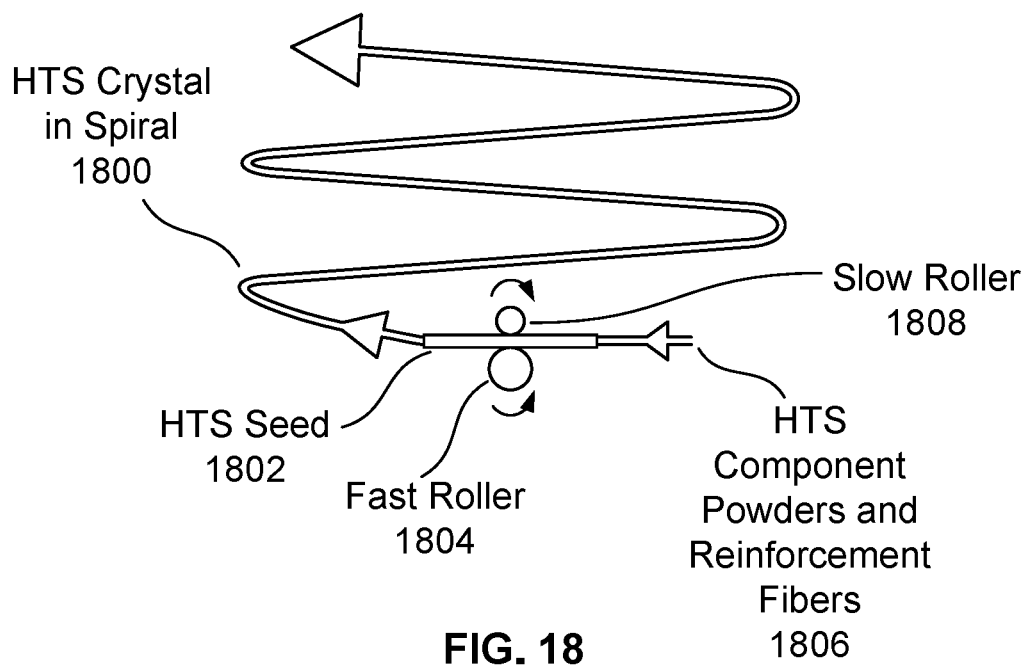
FIGS. 18 is a diagram illustrating a process for creating a spiral using bending.

FIGS. 18 is a diagram illustrating a process for creating a spiral using bending. In the example shown, HTS component powders and reinforcement fibers 1806 (e.g., powders and fiber reinforcement within a casing or powders compressed into a form with fiber reinforcement) are heated to melting while in contact with HTS seed 1802 (e.g., a seed crystal wheel shown from a top view) and allowed to crystalize to create HTS crystal in spiral 1800. The continuous production creates a curvature in the produced HTS material resulting in a spiral (e.g., to produce HTS solenoid). The curvature is created using fast roller 1804 and slow roller 1808 to cause bending in conjunction with the wheel shape of HTS seed 1802.

Fast roller 1804 and slow roller 1808 will vary slightly the speed between sides of the HTS casing tube (e.g., the crystalizing HTS component powders and reinforcement fibers 1806) as it passes under HTS Seed 1802 (e.g., a HTS Seed Crystal Wheel) during sintering and crystal formation. This will cause the tube naturally to bend slightly laterally to the left or right. Roller angular velocity will be the same because different velocities result from using different roller radii.

In various embodiments, HTS materials (e.g., materials made from HTS component powders, materials in HTS seed 1802, or HTS crystal in spiral 1800) comprise one or more of the following: a ceramic material, a copper oxide material, a rare earth copper oxide material (RE)BCO (e.g., (RE)Ba$_2$Cu$_3$O$_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, reinforcement fibers (e.g., in HTS component powders and reinforcement fibers 1806) comprise one or more of the following: Silicon (Si), Silicon Carbide (SiC), Silicon Nitride (Si$_3$N$_4$), Silicates including Silicon Dioxide (SiO2), Boron (B), Boron Carbide (B$_4$C), Boron Nitride (BN), Chromium (Cr), Chromium Carbides (Cr$_3$C$_2$, Cr$_7$C$_3$, Cr$_{23}$C$_6$), Chromium Nitrides (CrN, Cr$_2$N), Hafnium Carbide (HfC), Zirconium Carbide (ZrC), Zirconium Nitride (ZrN), Zirconium Diboride (ZrB$_2$), Titanium (Ti), Titanium Carbide (TiC), Titanium nitride (TiN), Tungsten Carbide (WC), Aluminum (Al), Alumina (Al$_2$O$_3$), Aluminum Carbide (Al$_4$C$_3$), Aluminum Nitride (AlN), Titanium Aluminum Nitride (TiAlN), Aluminum Titanium Nitride (AlTiN), and/or any other appropriate material.

Figure 19:
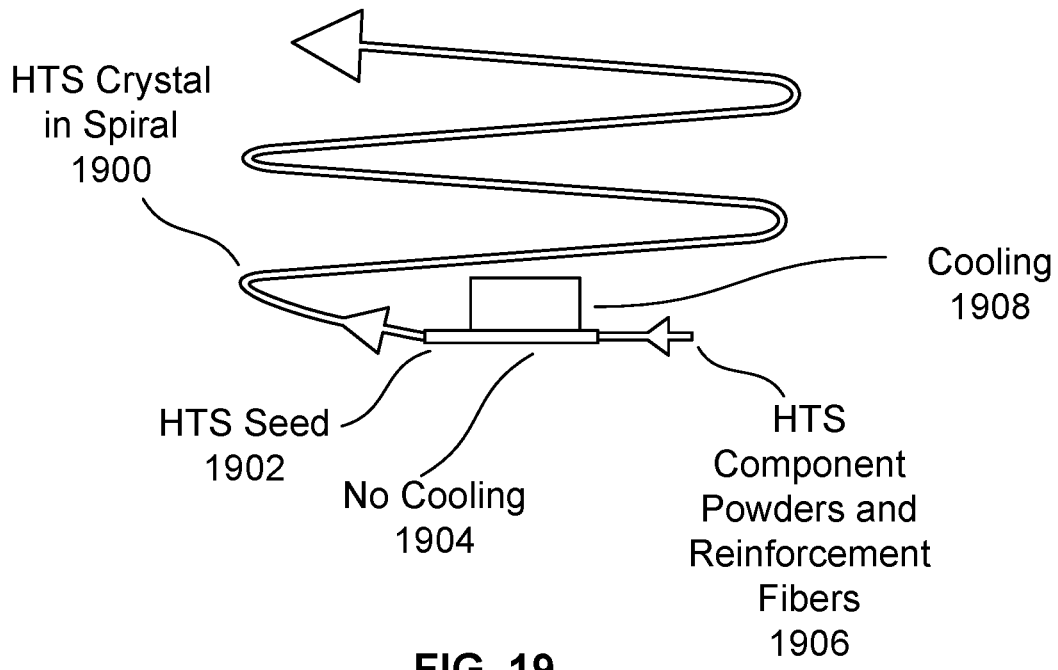
FIGS. 19 is a diagram illustrating a process for creating a spiral using bending.

FIG. 19 is a diagram illustrating a process for creating a spiral using bending. In the example shown, HTS component powders and reinforcement fibers 1906 (e.g., powders and fiber reinforcement within a casing or powders compressed into a form with fiber reinforcement) are heated to melting while in contact with HTS seed 1902 (e.g., a seed crystal wheel shown from a top view) and allowed to crystalize to create HTS crystal in spiral 1900. The continuous production creates a curvature in the produced HTS material resulting in a spiral (e.g., to produce HTS solenoid). The curvature is created using no cooling 1904 and cooling 1908 to cause bending in conjunction with the wheel shape of HTS seed 1902.

Cooling (e.g., using cooling 1908) one side of the HTS casing tubing slightly faster than the other as it passes through sintering and crystal formation. The temperature differential will cause one side's crystal structure to form before the other side leading to laterally biased crystal growth. This biased crystal growth will cause the overall crystal to bend in its production casing forming the desired solenoid coil shape.

In various embodiments, HTS materials (e.g., materials made from HTS component powders, materials in HTS seed 1902, or HTS crystal in spiral 1900) comprise one or more of the following: a ceramic material, a copper oxide material, a rare earth copper oxide material (RE)BCO (e.g., (RE)Ba$_2$Cu$_3$O$_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, reinforcement fibers (e.g., in HTS component powders and reinforcement fibers 1906) comprise one or more of the following: Silicon (Si), Silicon Carbide (SiC), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), Aluminum Titanium Nitride (AlTiN), and/or any other appropriate material.

Figure 20:
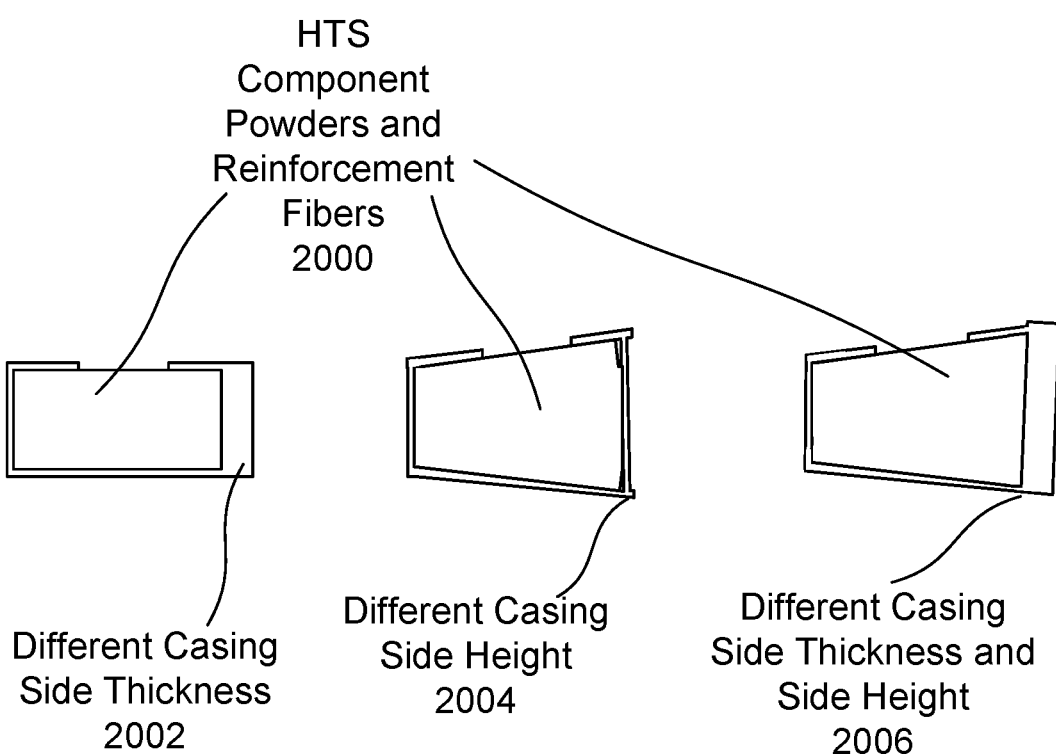
FIGS. 20 is a diagram illustrating a process for creating a spiral using bending.

FIG. 20 is a diagram illustrating a process for creating a spiral using bending. In the example shown, HTS component powders and reinforcement fibers 2000 (e.g., powders and fiber reinforcement within a casing) are heated to melting while in contact with HTS seed and allowed to crystalize to create HTS crystal in spiral. The continuous production creates a curvature in the produced HTS material resulting in a spiral (e.g., to produce HTS solenoid). The curvature is created using casing geometry to cause bending in conjunction with the wheel shape of HTS seed 1902.

Crystal bending can be caused using casings with asymmetric profiles such as thicker lateral casing sides (e.g., different casing side thickness 2002) which will provide lateral temperature differentials, different lateral heights (e.g., different casing side heights 2004) which alters the timing of HTS crystal growth from one side to the other, or a combination of the different side thickness and height (e.g., different casing side thickness and side height).

In various embodiments, HTS materials (e.g., materials made from HTS component powders) comprise one or more of the following: a ceramic material, a copper oxide material, a rare earth copper oxide material (RE)BCO (e.g., (RE)$Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, reinforcement fibers (e.g., in HTS component powders and reinforcement fibers 2000) comprise one or more of the following: Silicon (Si), Silicon Carbide (SiC), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), Aluminum Titanium Nitride (AlTiN), and/or any other appropriate material.

HTS Solenoids can be built with standard electromagnet material encasing the HTS Solenoids or in parallel with individual HTS Solenoid windings along with an automatic switch based on Fault Current Limiters (FCL) to divert electric current to the electromagnets if the superconductors quench. This would provide back up in case cooling systems fail or $J_c$ is breached.

The disclosed features/characteristics of making HTS Solenoids by the Seed Crystal Wheel Process are: a) set different angles of entry and exit when the production line is beneath the Seed Crystal Wheel during sintering and crystallization to form a circular single HTS crystal, b) the radius of the circular single HTS crystal can be varied by changing the angle differential, c) use speed, differential temperature, and/or asymmetric casing geometry during crystallization to create a spiral form from the circular HTS crystal. This will continuously produce HTS Solenoids which do not require winding. Such HTS Solenoids are cheaper, stronger, higher capacity, and more capable of 4D Control of Heat and Micro-magnetic Fields than PIT and Coated HTS, and d) HTS Solenoids can be built with back up electromagnetic material in case of superconductor quenching.

HTS Actuators/Valves

Figure 21:
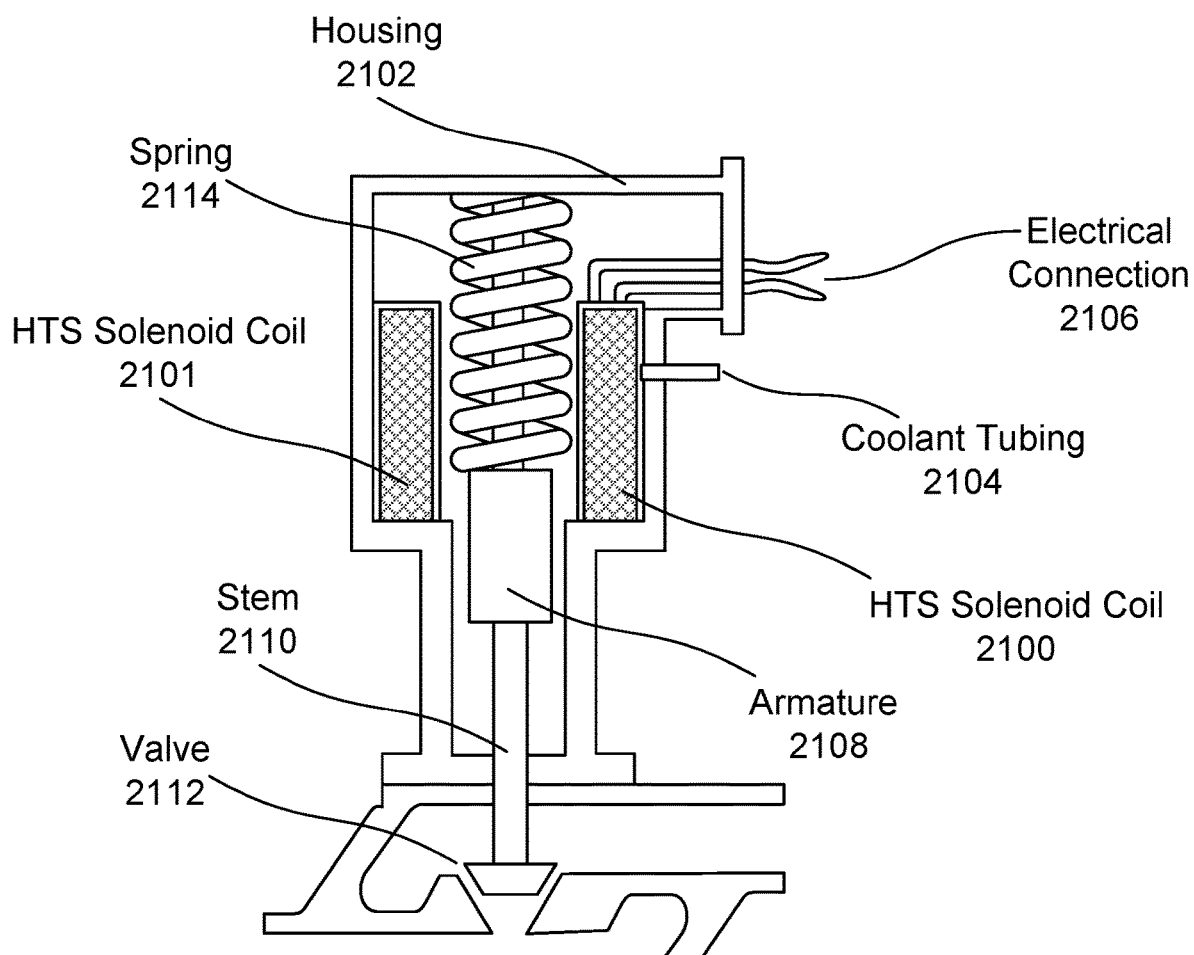
FIG. 21 is a diagram illustrating an embodiment of an actuator/valve.

FIG. 21 is a diagram illustrating an embodiment of an actuator/valve. In the example shown, HTS solenoid coil 2100 and HTS solenoid coil 2101 are disposed in housing 2102 and cooled with coolant in coolant tubing 2104. For example, coolant access paths enable cooling of HTS solenoid coil 2100 and HTS solenoid coil 2101. In some embodiments, coolant is held or cooled in a coolant reservoir. Electrical connection 2106 is used to activate HTS solenoid coil 2100 to cause armature 2108 to move and cause stem 2110 to open or close valve 2112. Spring 2114 provides a force to push armature 2108 to close valve 2112 when HTS solenoid coil 2100 and HTS solenoid coil 2101 are not activated. HTS Solenoid Coil 2100 and HTS solenoid coil 2101 comprise HTS solenoid coil with reinforcement fiber within HTS material that make up the coil. HTS solenoid coil 2100 and HTS solenoid coil 2101 can be used to make Actuators/Valves make precise movements. The HTS Actuators/Valves have chambers (not shown) and tubing for coolant to keep the HTS at superconducting temperature.

Figure 22:
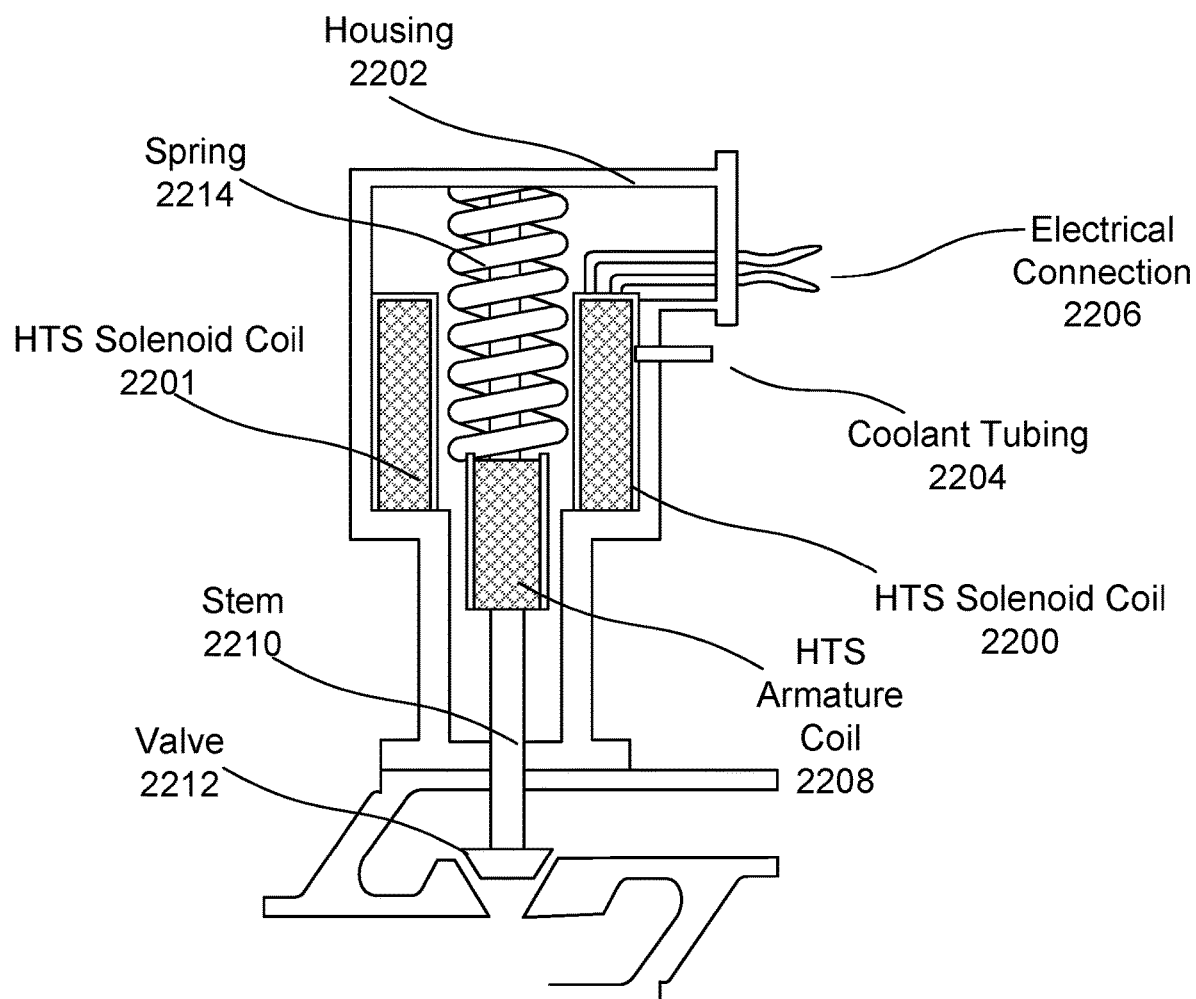
FIG. 22 is a diagram illustrating an embodiment of an actuator/valve.

FIG. 22 is a diagram illustrating an embodiment of an actuator/valve. In the example shown, HTS solenoid coil 2200 and HTS solenoid coil 2201 are disposed in housing 2202 and cooled with coolant in coolant tubing 2204. For example, coolant access paths enable cooling of HTS solenoid coil 2200, HTS solenoid coil 2201, and HTS armature coil 2208. In some embodiments, coolant is held or cooled in a coolant reservoir. Electrical connection 2206 is used to activate HTS solenoid coil 2200 to cause HTS armature coil 2208 to move and cause stem 2210 to open or close valve 2212. Spring 2214 provides a force to push HTS armature coil 2208 to close valve 2212 when HTS solenoid coil 2200 and HTS solenoid coil 2201 are not activated. HTS Solenoid Coil 2200 and HTS solenoid coil 2201 comprise HTS solenoid coil with reinforcement fiber within HTS material that make up the coil. HTS solenoid coil 2200 and HTS solenoid coil 2201 can be used to make Actuators/Valves make precise movements. The HTS Actuators/Valves have chambers (not shown) and tubing for coolant to keep the HTS at superconducting temperature.

In various embodiments, the high temperature superconducting material of the HTS solenoid coils and/or HTS armature coil comprise(s) one or more of the following: a ceramic material, a copper oxide material, a rare earth copper oxide material (RE)BCO (e.g., $(RE)Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate material. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, a fiber reinforcing the high temperature superconducting material of a solenoid coil or an armature coil comprises one or more of the following: Silicon (Si), Silicon Carbide (SiC), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide ($ZrC$), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), Aluminum Titanium Nitride (AlTiN), and/or any other appropriate material.

For some applications, a powerful double HTS Actuator/Valve with both an external HTS Solenoid Coil and an HTS Solenoid Armature can be used. Both the external coil and Armature would need coolant chambers and tubing.

HTS Actuator/Valves can be built with standard electromagnet material encasing the HTS solenoids or in parallel with individual HTS solenoid windings along with an automatic switch based on Fault Current Limiters (FCL) to divert electric current to the electromagnets in response to the superconductors quenching. This would provide back up in case cooling systems fail or $J_c$ is breached.

The disclosed features/characteristics of making HTS Actuators/Valves are a) actuators and valves can be made using HTS Solenoid coils and/or HTS armature coil along with cooling systems if needed, b) these HTS Actuators/Valves would be much stronger, smaller, lighter, faster and precise in movement than electromagnetic or hydraulic actuators and valves, c) HTS solenoid coils and/or HTS armature coil can be built with back up electromagnetic material in case of superconductor quenching and d) they are especially appropriate for use in outer space where low temperatures eliminate the need for cooling systems.

HTS Avionics

HTS Solenoids and Actuators/Valves can be used to create Superconductor Actuator/Valve Systems (SAS) to replace the hydraulic control systems now used in aircraft. Electric wires and thin, low pressure coolant tubes would replace heavy pressurized pipes. Lighter, smaller, and easier to control coolant pumps would replace hydraulic oil pumps. Weight savings means lower aircraft operating costs. Space savings mean better aircraft design and improved safety.

Figure 23:
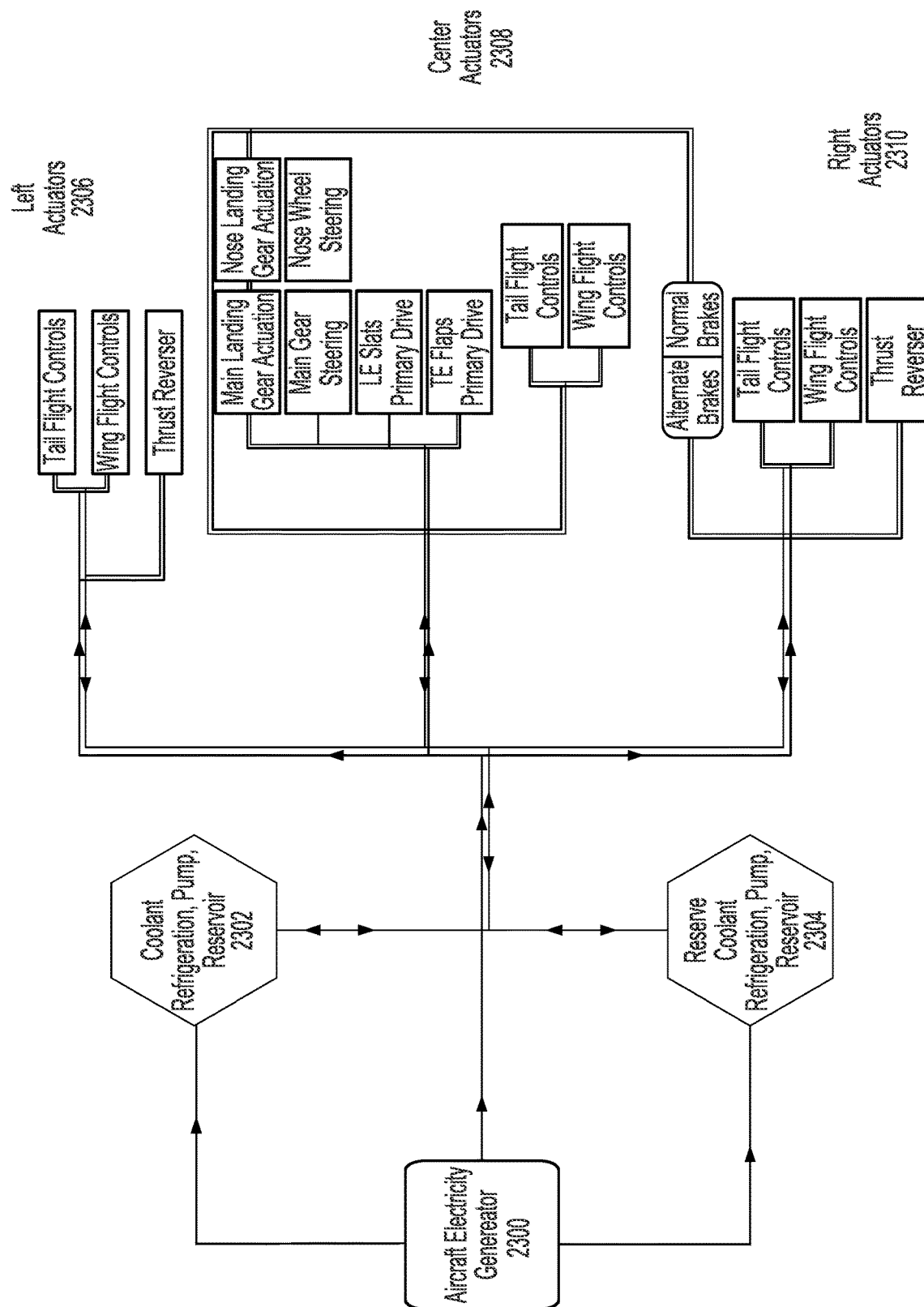
FIG. 23 is a diagram illustrating an embodiment of HTS solenoids and actuators/valves used in avionics.

FIG. 23 is a diagram illustrating an embodiment of HTS solenoids and actuators/valves used in avionics. In the example shown, avionics are shown for an aircraft. Avionics include aircraft electricity generator 2300 that connects to coolant refrigeration, pump, reservoir 2302 and reserve coolant refrigeration, pump, reservoir 2304, left actuators 2306 (e.g., tail flight controls, wing flight controls, and thrust reverser), center actuators 2308 (e.g., main landing gear actuation, nose landing gear actuation, main gear steering, nose wheel steering, LE slats primary drive, TE flaps primary drive, tail flight controls, and wing flight controls), and right actuators 2310 (e.g., alternate brakes, normal brakes, tail flight controls, wing flight controls, wing flight controls, and thrust reverser). In some embodiments, hydraulics avionics with their fluid, reservoirs, valves and pumps are replaced with HTS solenoids and actuators/valves as well as cooling system for the HTS solenoids and actuators/valves. In some embodiments, coolant reservoir, pump, and refrigeration comprise plane coolant reservoir, pump, and refrigeration, and the HTS solenoids are coupled to the plane coolant reservoir, pump, and refrigeration and to a plane electrical signal source.

HTS Solenoids and Actuators/Valves used to replace hydraulics can be built with standard electromagnet material encasing the HTS Solenoids or in parallel with individual HTS Solenoid windings along with an automatic switch based on Fault Current Limiters (FCL) to divert electric current to the electromagnets if the superconductors quench. This would provide back up in case cooling systems fail or $J_c$ is breached.

The disclosed features/characteristics of HTS Avionics using HTS in actuators and valves to replace hydraulic systems in aircraft are a) traditional hydraulic control systems in aircraft are heavy, occupy space, deal with dangerous flammable liquid under pressure with basic technology that is nearly a century old; HTS Avionics are lighter and smaller replacing large tubes of pressurized oil with electric wires and thin low pressure coolant tubes, b) HTS Avionics are electric current based which can be more precise and faster than hydraulics which are based on physically moving fluids, c) the savings in space, weight, performance and the lack of flammable fluids under pressure will significantly improve aircraft efficiency and safety resulting in revolutionary aircraft design improvements, and d) the HTS Solenoids and Actuators/Valves in SAS can be built with back up electromagnetic material in case of cooling system failure leading to superconductor quenching.

HTS Voltaic-Magnetic Cells

Figure 24:
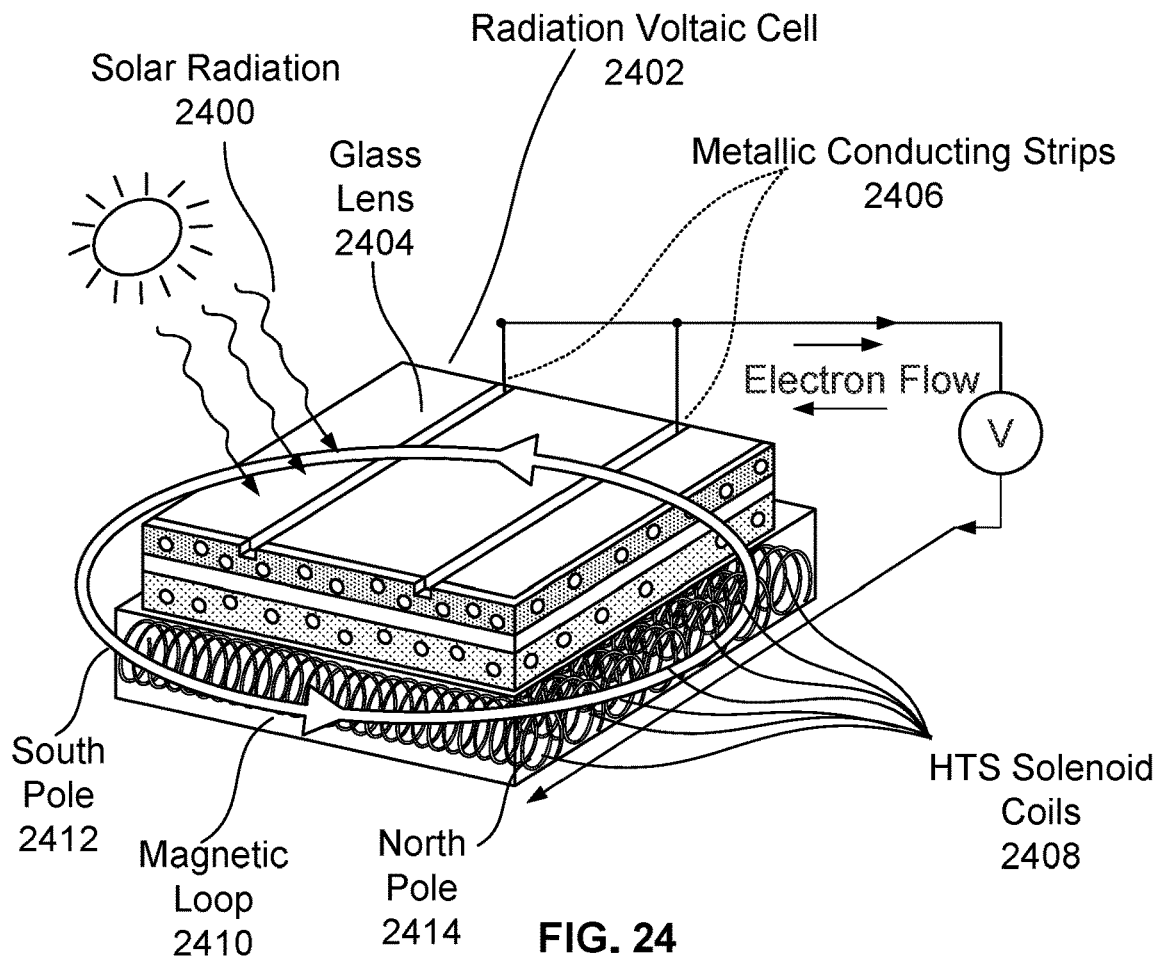
FIG. 24 is a diagram illustrating an embodiment of an HTS voltaic-magnetic cell.

FIG. 24 is a diagram illustrating an embodiment of an HTS voltaic-magnetic cell. In the example shown, reinforced HTS solenoid coils 2408 can be used to make HTS Voltaic-Magnetic Cells by attaching radiation voltaic cell 2402 to a parallel array of reinforced HTS solenoids coils 2408 with or without magnetic cores. When radiation hits the voltaic it generates electric current in the solenoids which generate a magnetic field. Solar radiation 2400 impinges on the radiation voltaic cell 2402 through glass lens 2404. This causes a current to be generated that is directed using metallic conducting strips 2406 to flow along reinforced HTS solenoid coils 2408. The current flowing in reinforced HTS solenoid coils 2408 causes a magnetic field to be generated (e.g., magnetic loop 2410 is shown with north pole 2414 and south pole 2412 as generated by an HTS solenoid coil of HTS solenoid coils 2408).

In various embodiments, a high temperature superconducting material of HTS solenoid coils 2408 comprises one or more of the following: a ceramic material, a copper oxide material, a rare earth copper oxide material (RE)BCO (e.g., (RE)Ba$_2$Cu$_3$O$_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate materials. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, a fiber reinforcing the high temperature superconducting material of solenoid coils 2408 comprises one or more of the following: Silicon (Si), Silicon Carbide (SiC), Silicon Nitride (Si$_3$N$_4$), Silicates including Silicon Dioxide (SiO2), Boron (B), Boron Carbide (B$_4$C), Boron Nitride (BN), Chromium (Cr), Chromium Carbides (Cr$_3$C$_2$, Cr$_7$C$_3$, Cr$_{23}$C$_6$), Chromium Nitrides (CrN, Cr$_2$N), Hafnium Carbide (HfC), Zirconium Carbide (ZrC), Zirconium Nitride (ZrN), Zirconium Diboride (ZrB$_2$), Titanium (Ti), Titanium Carbide (TiC), Titanium nitride (TiN), Tungsten Carbide (WC), Aluminum (Al), Alumina (Al$_2$O$_3$), Aluminum Carbide (Al$_4$C$_3$), Aluminum Nitride (AlN), Titanium Aluminum Nitride (TiAlN), Aluminum Titanium Nitride (AlTiN), and/or any other appropriate material.

Figure 25:
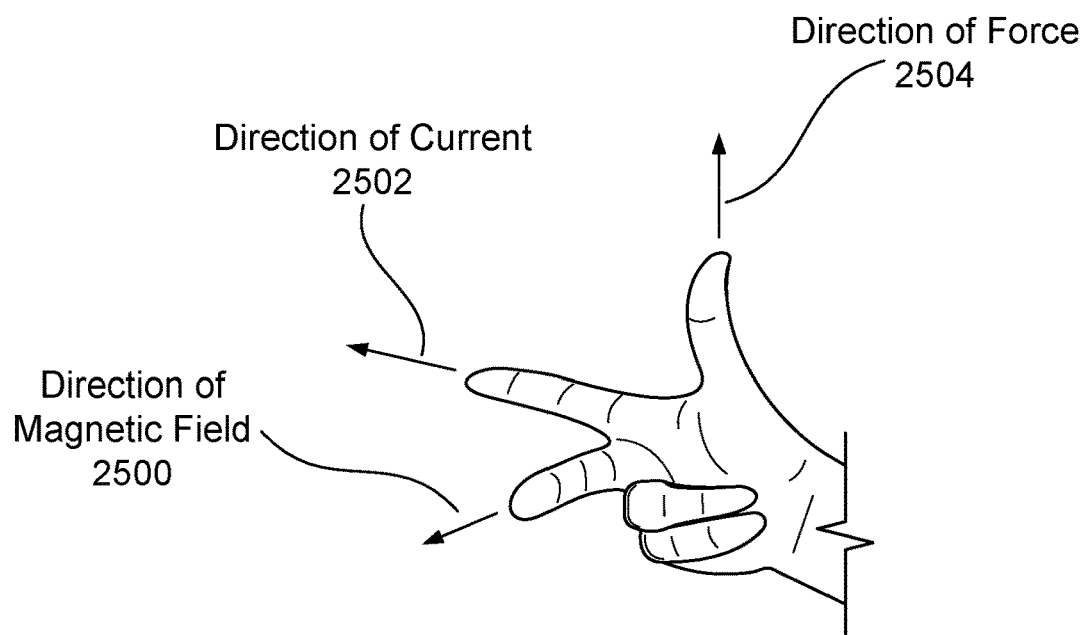
FIG. 25 is a diagram illustrating a force direction on a charge in a magnetic field.

FIG. 25 is a diagram illustrating a force direction on a charge in a magnetic field. In the example shown, for direction of current 2502 in direction of magnetic field 2500 experiences direction of force 2504. The magnetic field with direction of magnetic field 2500 diverts charged particle radiation (e.g., charged particles moving in direction of current 2502) according to Fleming's Rules.

The disclosed features/characteristics of HTS Voltaic-Magnetic Cells are a) they are made by attaching a radiation voltaic cell to a parallel array of Reinforced HTS Solenoids, b) when radiation strikes the voltaic cell it creates an electric current which passes through the solenoids creating a magnetic field. The magnetic field diverts charged particle radiation incident on the device.

Radiation Shields

Figure 26:
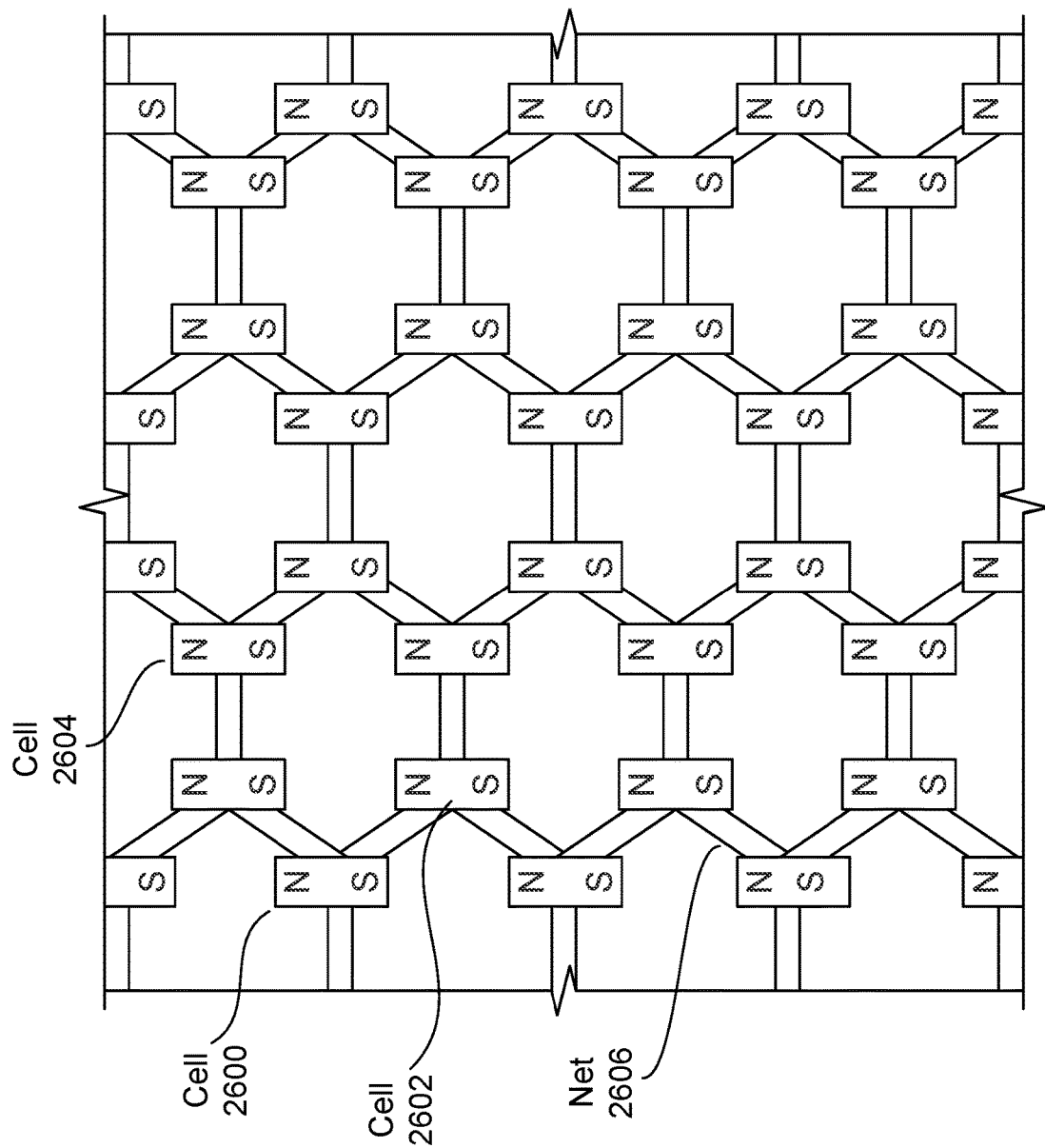
FIG. 26 is a diagram illustrating an embodiment of a radiation shield.

FIG. 26 is a diagram illustrating an embodiment of a radiation shield. In the example shown, a plurality of HTS photovoltaic-magnetic cells (e.g., cell 2600, cell 2602, cell 2604, etc.) are disposed in a parallel arrangement with their magnetic fields aligned. The arrangement is enforced by net 2606 with the HTS photovoltaic-magnetic cells at each node of net 2606. Net 2606 holds HTS photovoltaic-magnetic cells by having strength and/or stiffness to keep HTS photovoltaic-magnetic cells apart. Radiation shields are made by placing HTS photovoltaic-magnetic cells at the nodes of a net 2606 aligned in the same N-S magnetic axis with voltaic side of each HTS photovoltaic-magnetic cell facing the same direction.

In various embodiments, the high temperature superconducting material of HTS solenoid coils in the HTS photovoltaic-magnetic cells comprises one or more of the following: a ceramic material, a copper oxide material, a rare earth copper oxide material (RE)BCO (e.g., (RE)Ba$_2$Cu$_3$O$_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, a NbGe material, and/or any other appropriate materials. Note that RE stands for a rare earth element, where the rare earth elements include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

In various embodiments, a fiber reinforcing the high temperature superconducting material of solenoid coils comprises one or more of the following: Silicon (Si), Silicon Carbide (SiC), Silicon Nitride (Si$_3$N$_4$), Silicates including Silicon Dioxide (SiO2), Boron (B), Boron Carbide (B$_4$C), Boron Nitride (BN), Chromium (Cr), Chromium Carbides (Cr$_3$C$_2$, Cr$_7$C$_3$, Cr$_{23}$C$_6$), Chromium Nitrides (CrN, Cr$_2$N), Hafnium Carbide (HfC), Zirconium Carbide (ZrC), Zirconium Nitride (ZrN), Zirconium Diboride (ZrB$_2$), Titanium (Ti), Titanium Carbide (TiC), Titanium nitride (TiN), Tungsten Carbide (WC), Aluminum (Al), Alumina (Al$_2$O$_3$), Aluminum Carbide (Al$_4$C$_3$), Aluminum Nitride (AlN), Titanium Aluminum Nitride (TiAlN), Aluminum Titanium Nitride (AlTiN), and/or any other appropriate material.

Figure 27:
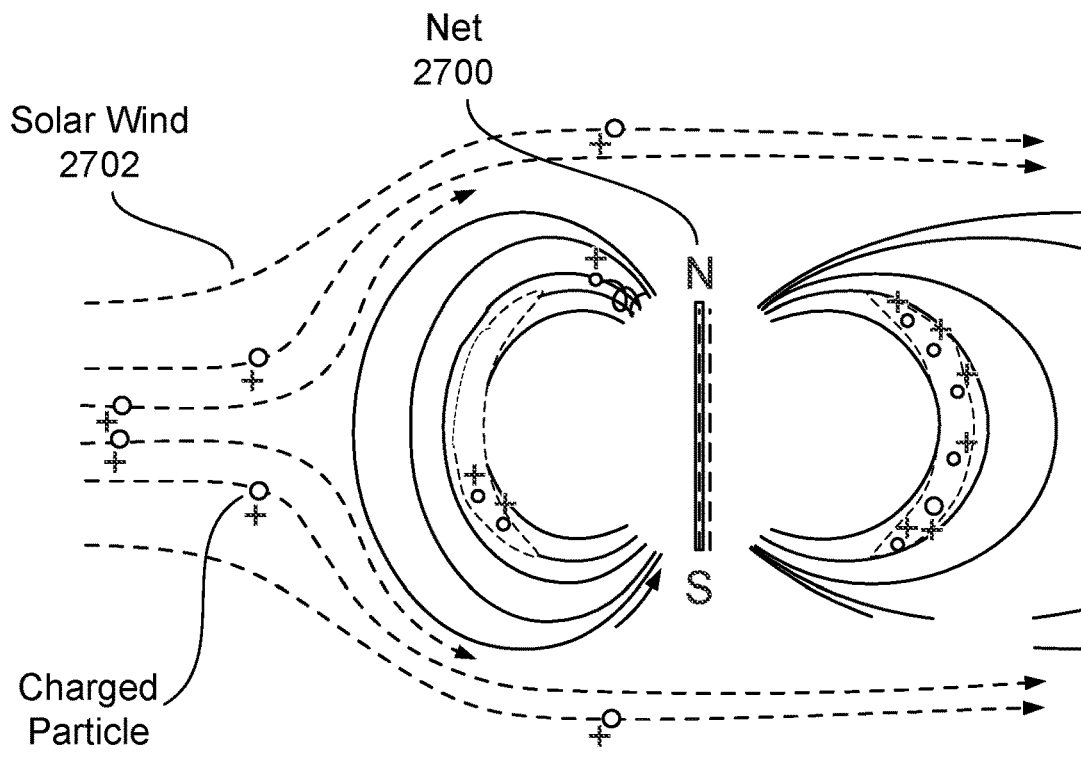
FIG. 27 is a diagram illustrating an embodiment of a shield.

FIG. 27 is a diagram illustrating an embodiment of a shield. In the example shown, net 2700 with HTS photovoltaic-magnetic cells at each node of net 2700. Solar wind 2702 has a bunch of charged particles (e.g., charged particle 2704) that are moving toward net 2700 are diverted by the magnetic field generated by HTS photovoltaic-magnetic cells. This diversion can protect objects behind net 2700 such as satellites, stations, and astronauts.

Figure 28:
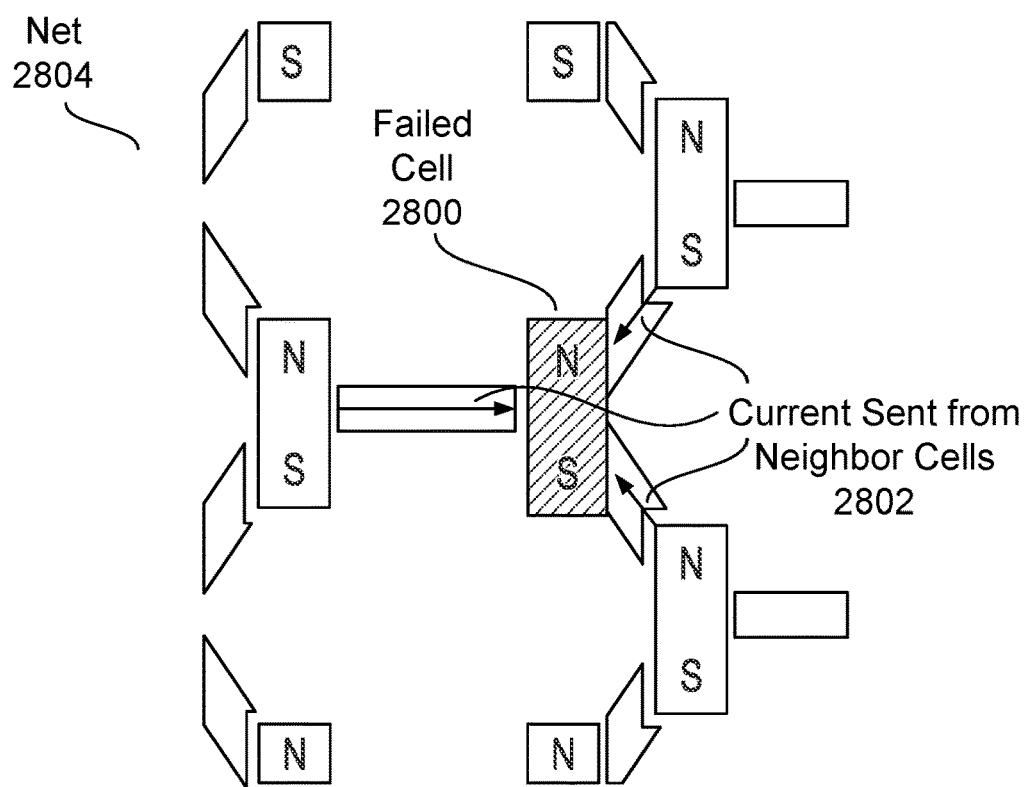
FIG. 28 is a diagram illustrating an embodiment of a shield with a failed cell.

FIG. 28 is a diagram illustrating an embodiment of a shield with a failed cell. In the example shown, net 2804 includes nodes of HTS photovoltaic-magnetic cells. Failed cell 2800 receives current from neighbor cells 2802. Net 2804 support threads include multiple strands which conduct electricity. This allows cells to share electricity adding redundancy in case of voltaic failure in an individual cell. In some embodiments, a failed cell (e.g., failed cell 2800) detects failure of current generation capability. Failed cell 2800 indicates to one or more neighbors that current generation is impaired. In some embodiments, one or more neighbors provide(s) current to failed cell 2800 so that failed cell 2800 can generate a magnetic field.

Figure 29:
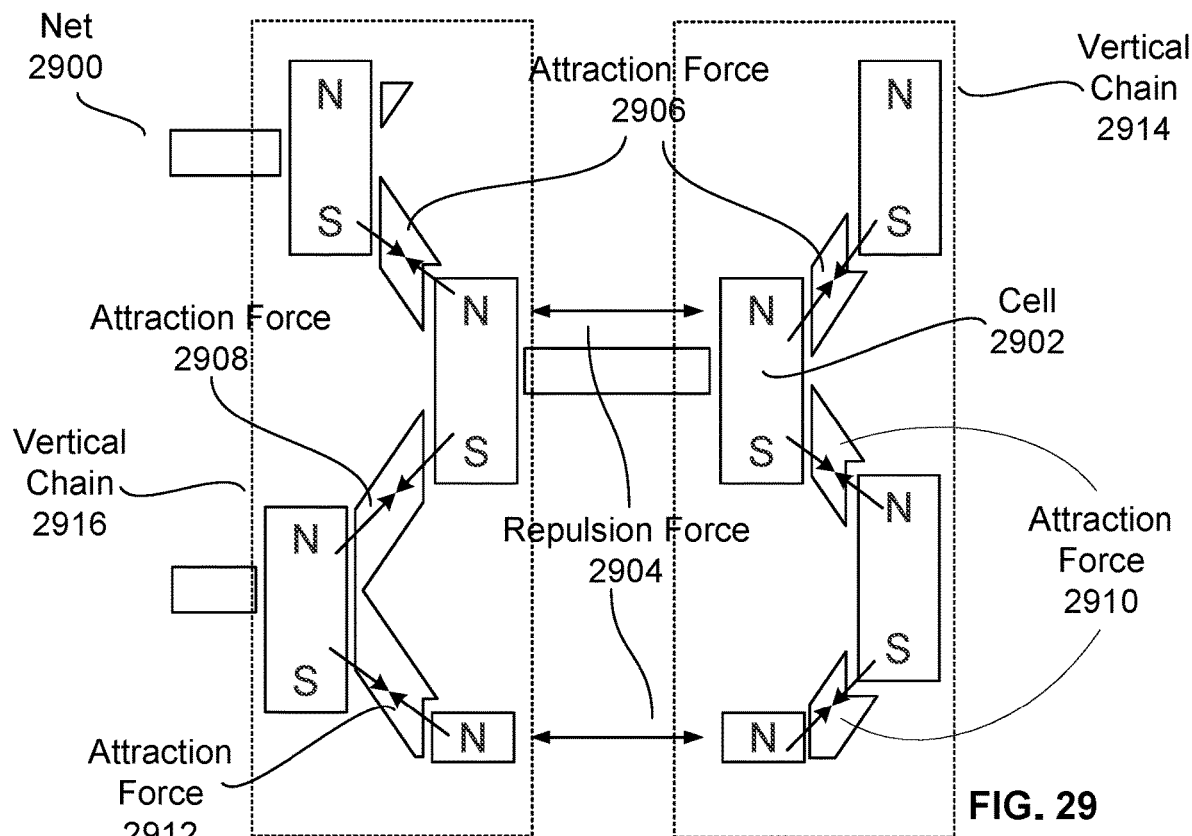
FIGS. 29 and 30 are diagrams illustrating an embodiment of a shield with a cell in a net.
Figure 30:
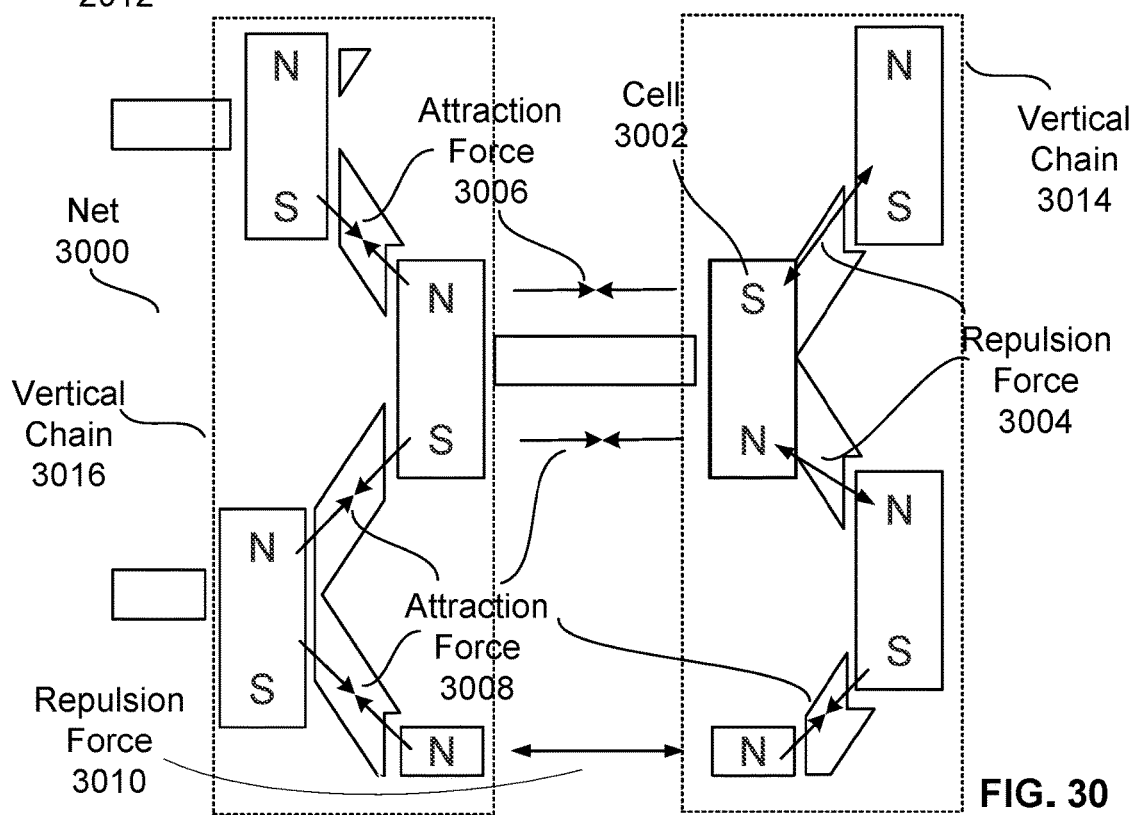

FIGS. 29 and 30 are diagrams illustrating an embodiment of a shield with a cell in a net. In the example shown in FIG. 29, net 2900 includes cells (e.g., cell 2902) with parallel alignment of magnetic fields. This leads to attraction force 2906, attraction force 2908, attraction force 2912, and attraction force 2910 in vertical chains (e.g., vertical chain 2914 and vertical chain 2916) of net 2900 and repulsion force 2904 between vertical chains (e.g., vertical chain 2914 and vertical chain 2916). Net 2900 provides structural support and holds positions of cells fixed. External electric current will also be sent to individual cells replacing, intensifying, or reversing the current provided by a cell's voltaic or signaling to the cell to switch on, off, or reverse the cell. This allows the temporary intensification or reversal or removing of a cell's magnetic N-S polarity allowing further 4D Control of micro-magnetic fields in addition to 4D control through HTS reinforcement fiber.

For example, under normal voltaic current the supporting net will have a natural imbalance in magnetic force between cells. But passing an external current via the Net's threads to a cell can change or intensify the cell's polarity, changing magnetic forces between cells. Changing enough cells temporarily allows the Net's structure to be manipulated (folded, rolled, etc.) for deployment, maintenance and retrieval.

In the example shown in FIG. 30, net 3000 includes cells with parallel alignment of magnetic fields except cell 3002 which has a changed orientation compared to the example shown in FIG. 29. This leads to different forces compared to net 2900 in FIG. 29. Net 3000 has repulsion force 3004 within vertical chain 3014 and a localized attraction force between vertical chain 3014 and vertical chain 3016. The pattern of forces is different between FIG. 29 and FIG. 30 as shown with attraction force 3006, attraction force 3008, and repulsion force 3004 and repulsion 3010. Localized changes in the pattern forces can lead to manipulation of the net (e.g., folding, rolling, bending, etc.).

Figure 31:
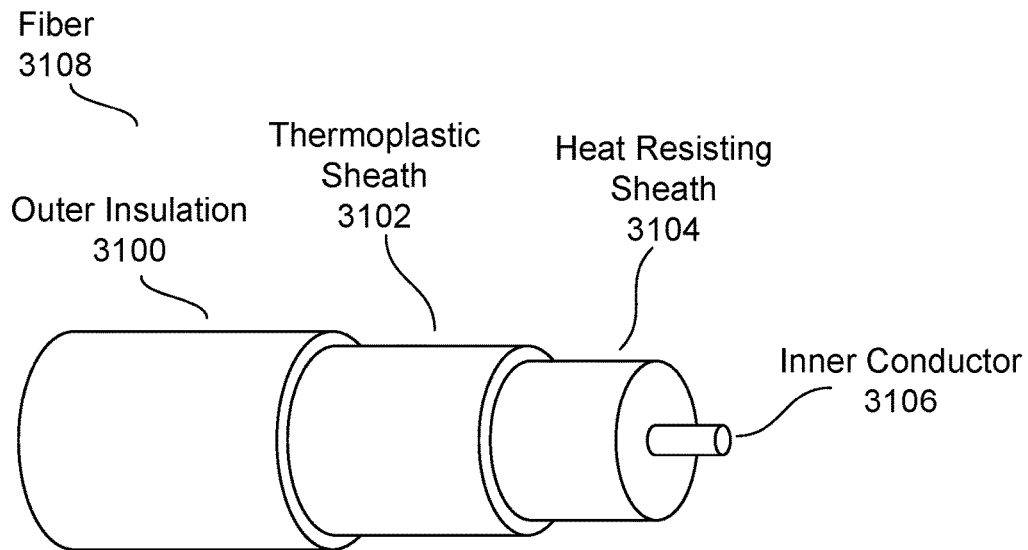
FIG. 31 is a diagram illustrating an embodiment of a fiber in a net.

FIG. 31 is a diagram illustrating an embodiment of a fiber in a net. In the example shown (not to scale), fiber 3108 includes outer insulation 3100, thermoplastic sheath 3102, heat resisting sheath 3104, and inner conductor 3106 going from outer concentric cylindrical shell (e.g., outer insulation 3100) going to the innermost cylinder (e.g., inner conductor 3106). Structural control of a radiation shield will be further enhanced by using heat resisting thermoplastic sheaths on the conducting fibers in the support net.

When external current is passed through these special structural strands, the heat resisting sheath 3104 will convert electricity to heat, the heat will make the thermoplastic sheath 3102 pliant and flexible allowing the fiber to bend. The now pliant net can now be manipulated by temporarily changing the polarity/intensity of individual cells to control magnetic forces between cells. When the net is in its operating geometry, the heating current is stopped. Cooling temperatures will solidify the thermoplastic making the net rigid. The process can be repeated as often as needed if the net needs to be manipulated again for maintenance, retrieval or redeployment. A net could even unfold and fold itself upon an indication of a command.

The disclosed features/characteristics of radiation shields are a) they are made by placing HTS voltaic-magnetic cells at the nodes of a support net with magnetic polarities aligned and voltaic faces in the same direction, b) when struck by radiation, the magnetic fields created by the HTS voltaic-magnetic cells will divert charged particle radiation around the radiation shield net protecting anything behind it, c) electrically conducting strands in the net's threads allow current to pass from active cells to other cells thus allowing redundancy in case a particular cell's voltaic fails, d) external current can also reduce magnetic strength or reverse the magnetic polarity of individual cells and solenoids, e) this control through external currents adds to the 4D control of micro-magnetic fields through HTS reinforcement fiber, f) 4D control of micro-magnetic fields allows the radiation shield net to be manipulated/folded for deployment, maintenance, and retrieval, and g) heat resisting thermoplastic sheaths on the net's conducting threads will further allow further control over the pliability and flexibility individual net fibers for deployment, maintenance, and retrieval.

HTS Tethers

Figure 32:
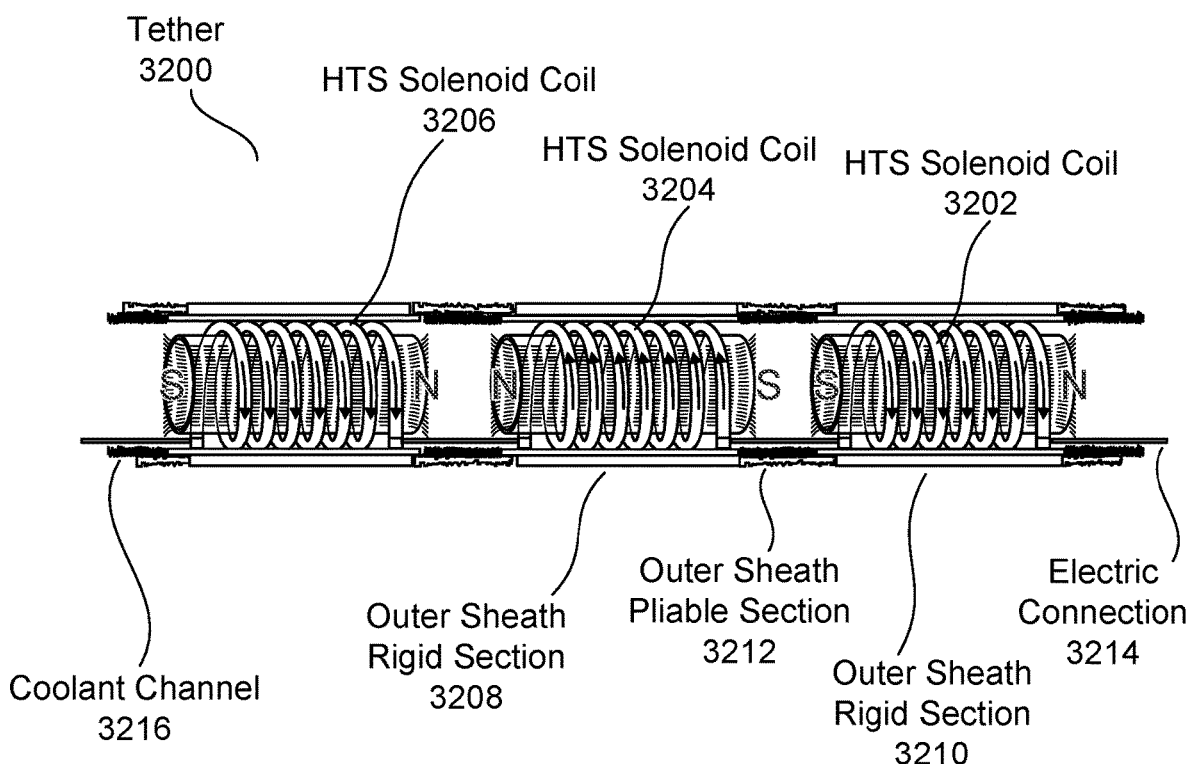
FIG. 32 is a diagram illustrating an embodiment of a tether.

FIG. 32 is a diagram illustrating an embodiment of a tether. In the example shown, tether 3200 is kept rigid by tension from opposing magnetic solenoid coil segments (e.g., HTS solenoid coil 3202, HTS solenoid coil 3204, and HTS solenoid coil 3206). Outer sheath rigid sections (e.g., outer sheath rigid section 3208 and outer sheath rigid section 3210) are a load bearing material for tether 3200 that are coupled together by outer sheath pliable sections (e.g., outer sheath pliable section 3212) that are made of a strong tensile load bearing material. HTS solenoid coil 3202, HTS solenoid coil 3204, and HTS solenoid coil 3206 are connected using electric connection 3214 that includes multiple connections enabling selectively activating the HTS solenoid coils. HTS solenoid coil 3202, HTS solenoid coil 3204, and HTS solenoid coil 3206 are arranged with opposing polarities to provide force to make tether 3200 rigid with the outer tension sheath (e.g., an outer sheath of rigid and pliable sections—for example, outer sheath rigid section 3208 and outer sheath rigid section 3210 and outer sheath pliable section 3212). Coolant channel 3216 provides coolant for HTS solenoid coils.

In some embodiments. HTS tethers (e.g., tether 3200) use segments of individual HTS Solenoid coil segments (e.g., HTS solenoid coil 3202, HTS solenoid coil 3204, and HTS solenoid coil 3206) with solid magnetic cores encased in tensile load bearing cable casing (e.g., outer sheath rigid sections and outer sheath pliable sections) along with coolant channels (e.g., coolant channel 3216), if needed. Each HTS Solenoid has its own external current source (e.g., via electrical connection 3214). Control over the magnetic strength and polarity of each solenoid forms part of the 4D Control of Heat and Micro-magnetic Field of the entire HTS system. The cable casing around individual HTS Solenoids with magnetic cores can be rigid (e.g., outer sheath rigid section 3208 and outer sheath rigid section 3210). But the cable casing between segments would be a pliable but strong tensile load bearing material (e.g., outer sheath pliable section 3212). Under normal conditions, the tether would be kept rigid by the strength of opposing HTS Solenoid magnetic poles causing tension in the cable casing. This tension would be especially attractive for use in outer space where gravity cannot be relied upon for natural cable tension and where cold temperatures minimize the need for cooling systems.

HTS Tethers have the advantage of natural shock absorption. Stresses and strains are addressed by magnetic fields rather than physical cable material. In physical material flexing (stress-strain hysteresis) eventually causes cracking and failure.

Figure 33:
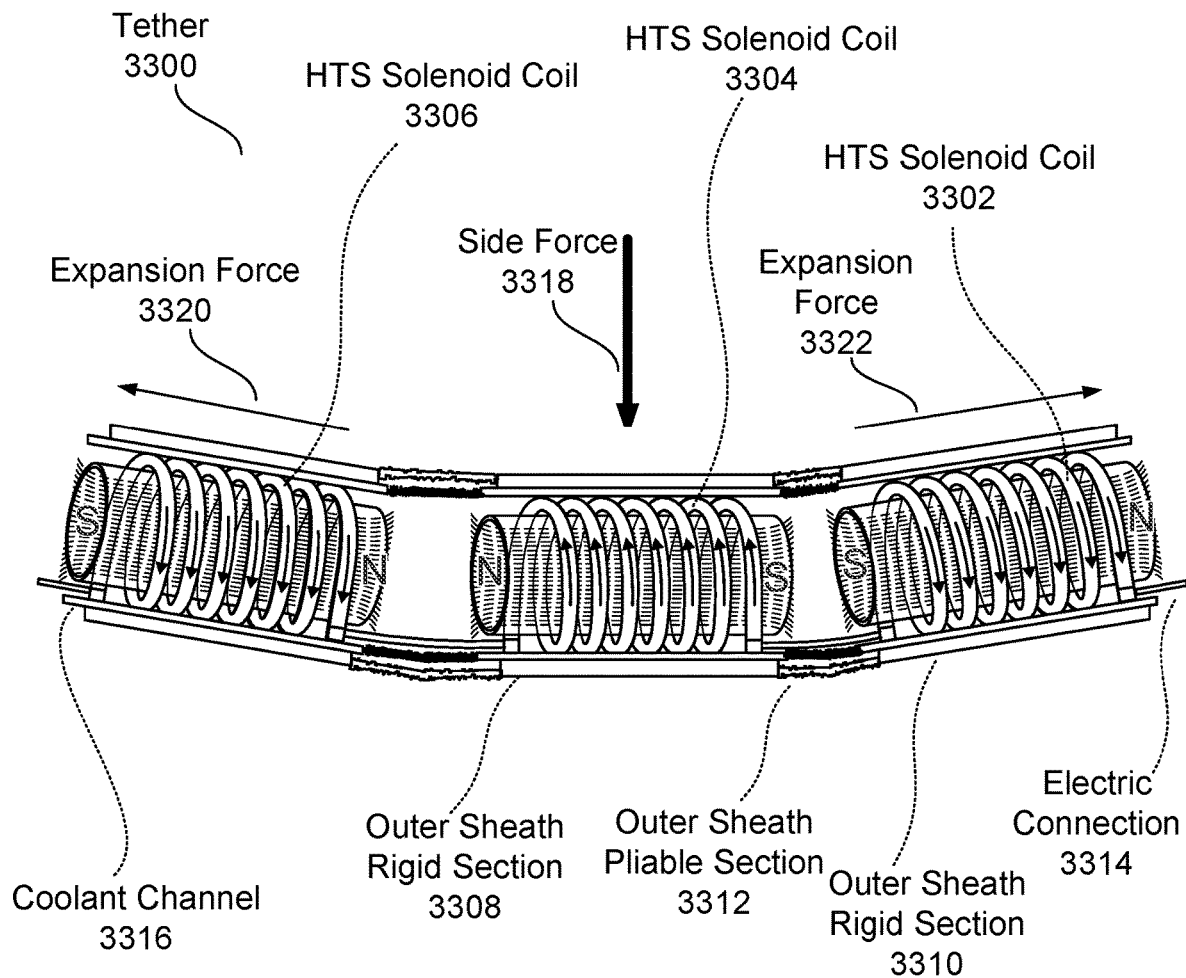
FIG. 33 is a diagram illustrating an embodiment of a tether.

FIG. 33 is a diagram illustrating an embodiment of a tether. In the example shown, tether 3300 under side force 3318 and expansion force 3320 and expansion force 3322. Tether 3300 is kept rigid by tension from opposing magnetic solenoid coil segments (e.g., HTS solenoid coil 3302, HTS solenoid coil 3304, and HTS solenoid coil 3306). Outer sheath rigid sections (e.g., outer sheath rigid section 3308 and outer sheath rigid section 3310) are a load bearing material for tether 3300 that are coupled together by outer sheath pliable sections (e.g., outer sheath pliable section 3312) that are made of a strong tensile load bearing material. HTS solenoid coil 3302, HTS solenoid coil 3304, and HTS solenoid coil 3306 are connected using electric connection 3314 that includes multiple connections enabling selectively activating the HTS solenoid coils. HTS solenoid coil 3302, HTS solenoid coil 3304, and HTS solenoid coil 3306 are arranged with opposing polarities to provide force to make tether 3300 rigid with the outer tension sheath (e.g., an outer sheath of rigid and pliable sections—for example, outer sheath rigid section 3308 and outer sheath rigid section 3310 and outer sheath pliable section 3312). Coolant channel 3316 provides coolant for HTS solenoid coils.

Figure 34:
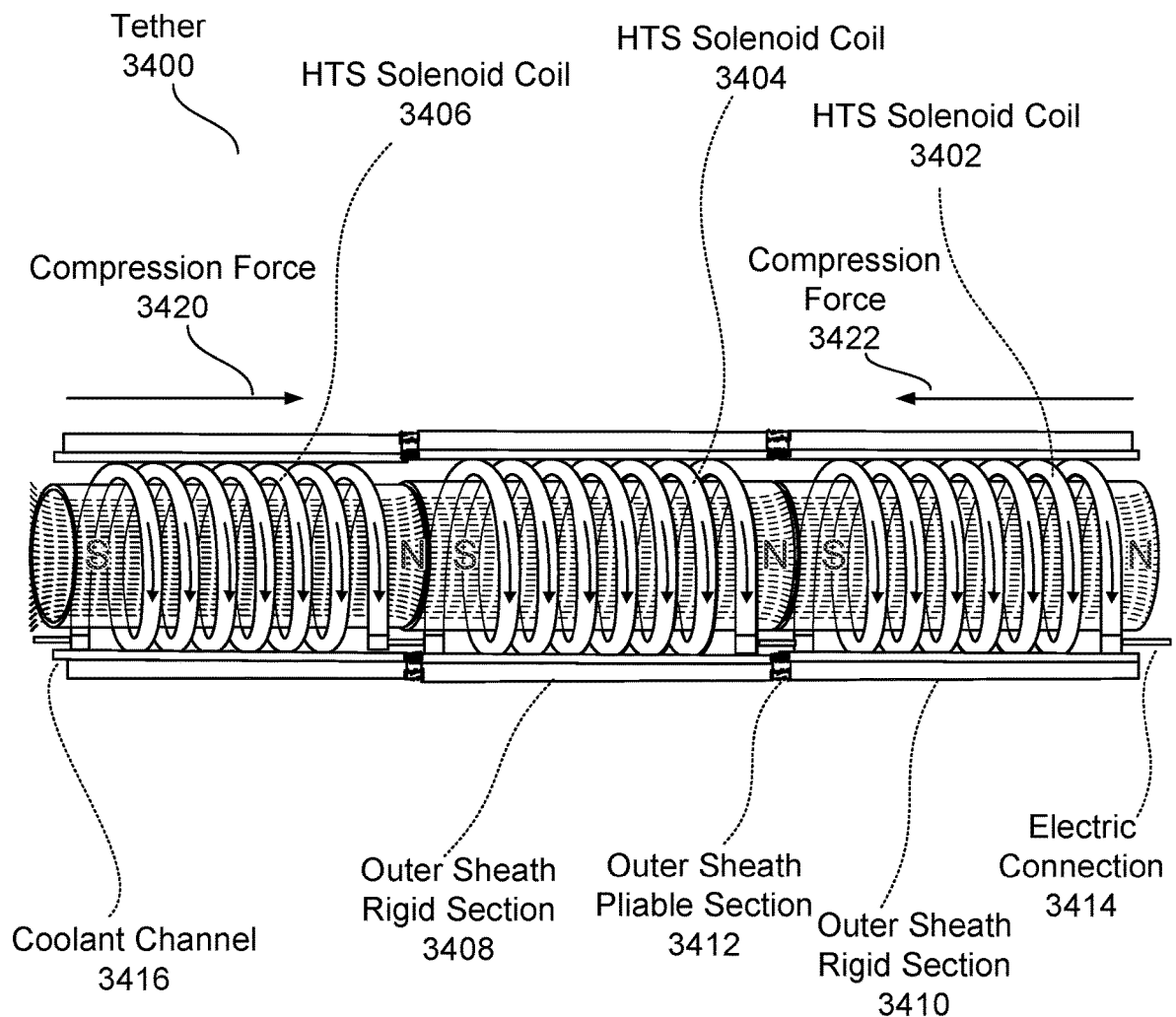
FIG. 34 is a diagram illustrating an embodiment of a tether.

FIG. 34 is a diagram illustrating an embodiment of a tether. In the example shown, HTS tethers (e.g., tether 3400) can also act like a rod in parts or in whole by changing the magnetic polarities of selected solenoids by reversing their external electric currents. This will cause magnetic attraction linking solenoid magnetic cores together. Tether strength would now be compressive allowing exceptional force and stiffness for tasks requiring "pushing". In case of emergencies, this compressive mode also allows the entire Tether to be locked down into a stable rod of solenoid cores. Tether 3400 is shown under compression force 3420 and compression force 3422. Tether 3400 is kept rigid by attracting magnetic solenoid coil segments (e.g., HTS solenoid coil 3402, HTS solenoid coil 3404, and HTS solenoid coil 3406). Outer sheath rigid sections (e.g., outer sheath rigid section 3408 and outer sheath rigid section 3410) are a load bearing material for tether 3400 that are coupled together by outer sheath pliable sections (e.g., outer sheath pliable section 3412) that are made of a strong tensile load bearing material. HTS solenoid coil 3402, HTS solenoid coil 3404, and HTS solenoid coil 3406 are connected using electric connection 3414 that includes multiple connections enabling selectively activating the HTS solenoid coils. HTS solenoid coil 3402, HTS solenoid coil 3404, and HTS solenoid coil 3406 are arranged with the same polarities to provide force to make tether 3400 rigid. Coolant channel 3416 provides coolant for HTS solenoid coils.

Figure 35:
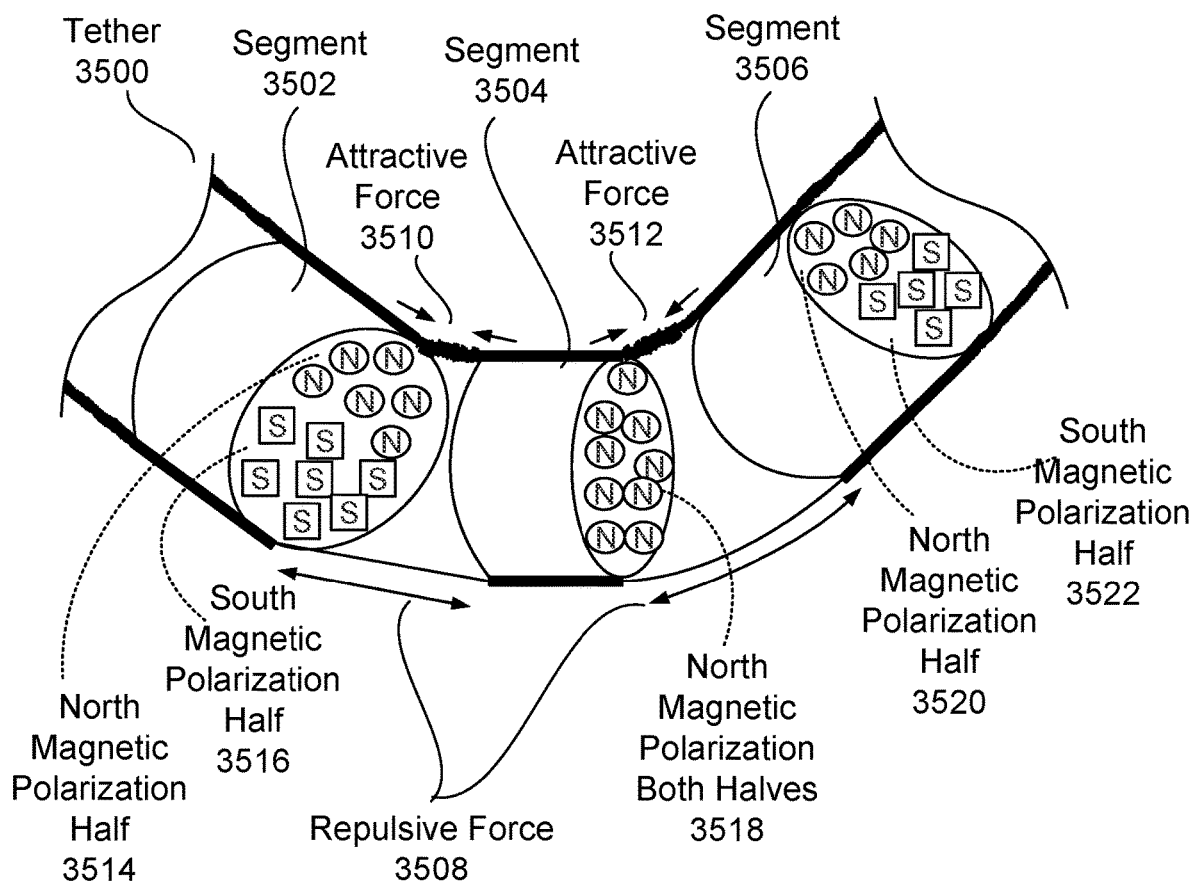
FIG. 35 is a diagram illustrating an embodiment of a segmented tether.

FIG. 35 is a diagram illustrating an embodiment of a segmented tether. In the example shown, tether 3500 includes segment 3502, segment 3504, and segment 3506. Each segment includes a set of HTS solenoid coils. The set of HTS solenoid coils can be selectively magnetically polarized—for example, a bending force on tether 3500 can be introduced by spatially selecting magnetic polarization to cause repulsive forces (e.g., repulsive force 3508) and attractive forces (e.g., attractive force 3510 and attractive force 3512) that cause an overall bending force on tether 3500. In the example shown, segment 3502 has a top half of magnetic polarization (e.g., north magnetic polarization half 3514) different from a bottom half (e.g., south magnetic polarization half 3516). Segment 3504 has both halves with the same magnetic polarization (e.g., north magnetic polarization both halves). Segment 3506 has a top half of magnetic polarization (e.g., north magnetic polarization half 3520) with a different from a bottom half (e.g., south magnetic polarization half 3522). In various embodiments, different fractions of the bundled solenoids are polarized to create different strengths of force and/or different strength currents/field strengths are created in the halves to create different strengths of force. By bundling HTS solenoids in parallel together in cable segments (e.g., segment 3502, segment 3504, and segment 3506), the magnetic profile of segment faces can be 4D micro-controlled. The mix of attractive and repulsive magnetic forces across opposing segment faces will allow active bending of an HTS Tether at any segment point. This allows the Tender to be manipulated like a tentacle providing similar functions to a robotic arm.

In some embodiments, strain and motion sensors on each segment will provide real time information on the condition of HTS Tether segments. This information can be processed with 4D Control of Heat and Micro-magnetic Field to respond automatically and immediately to unusual Tether conditions by locking down, flexing or increasing pliability. This will protect from unexpected events both for the HTS Tether as well as the objects it is tethered to. For example, if something comes too close to an HTS Tether, the Tether can react by flexing away from it, becoming pliant, or locking down for impact.

The disclosed features/characteristics of HTS Tethers are a) they are made by placing HTS Solenoids with magnetic cores and/or parallel arrays of HTS Solenoids with magnetic cores end to end within tensile strong sheaths, b) stresses and strains are absorbed by magnetic fields which do not deteriorate like physical materials, c) each solenoid has its own external electric current source which allows control over its magnetic strength and polarity, d) this control by external current over a HTS Solenoid's magnetism adds to 4D Control of Heat and Micro-magnetic Fields through HTS reinforcing fiber, e) 4D Control allows the HTS Tether to be locked down in parts or in whole into a solid rod of magnetic cores as well manipulated like a tentacle, and f) strain and motion sensors combined with 4D Control allow the monitoring of and automatic response to changes in Tender conditions.

HTS Earth-Space Tethers/Space Elevators

Figure 36:
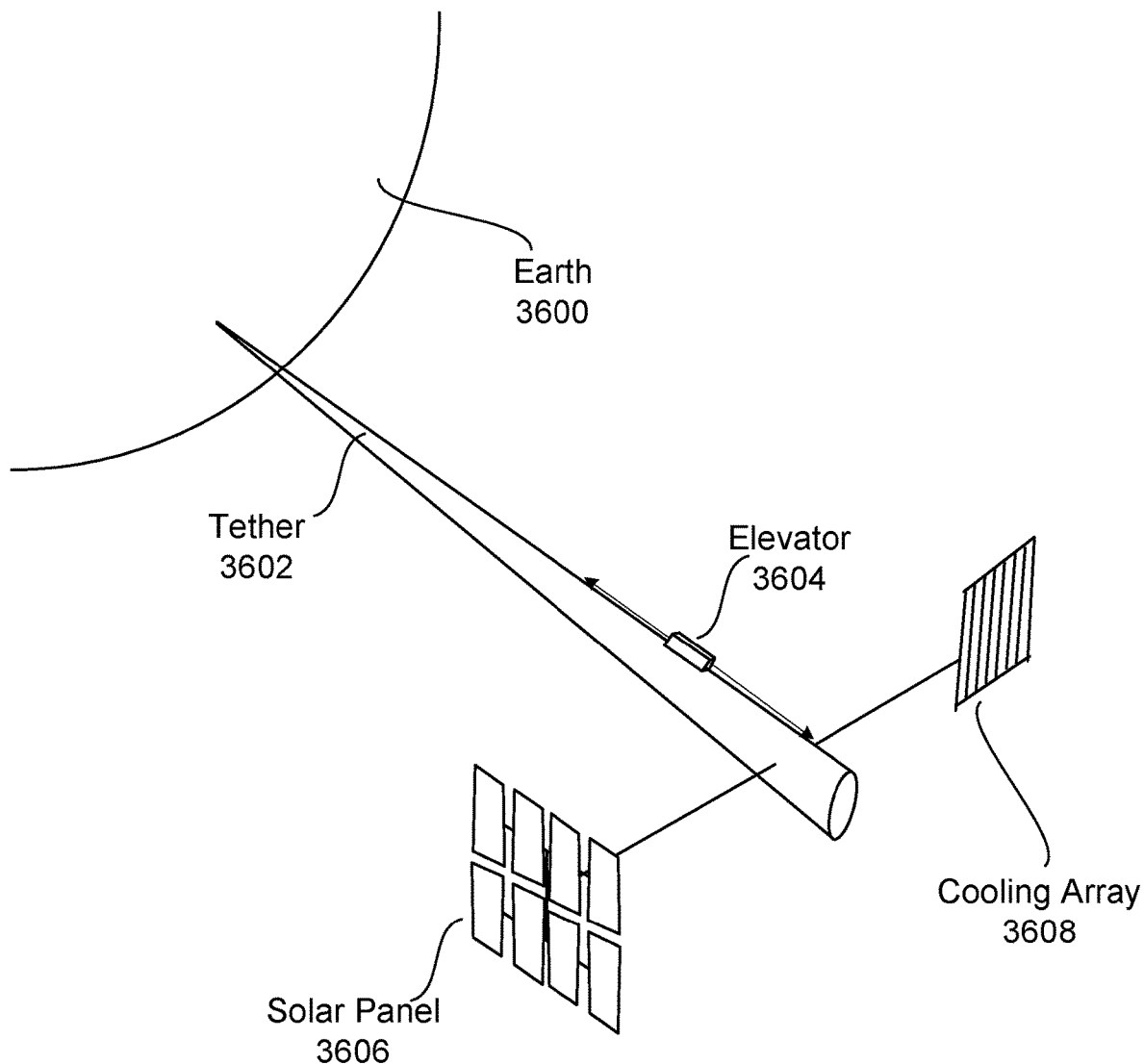
FIG. 36 is a diagram illustrating an embodiment of a tether and elevator.

FIG. 36 is a diagram illustrating an embodiment of a tether and elevator. In the example shown, tether 3602 extends away from earth 3600 and includes elevator 3604 that travels along tether 3602. Tether 3602 is coupled to solar panel 3606 that provide power to HTS solenoids in tether 3602. Tether 3602 is coupled to cooing array 3608 that provides cooling to coolant for HTS solenoids in tether 3602. HTS Earth-Space Tether (e.g., tether 3602) and Space Elevators (e.g., elevator 3604) can be efficiently built using HTS Tethers. Earth-Space Tethers/Space Elevators can be under strong tension and subject to the challenging stresses of weather near the earth's surface. The magnetic strength of HTS Tethers utilizes this tension to provide natural shock absorption of weather stresses and strains better than physical materials. This causes longer usable life which significantly reduces amortization costs boosting viability.

HTS Earth-Space Tethers/Space Elevators are sustainable and efficient with extremely low operating costs because outer space will be used to make the temperature of coolant (liquid N) below superconductivity levels. The coolant will be circulated from space through tether 3602 then back up to space for re-cooling (e.g., using cooling array 308) with power provided for free by space solar panels (e.g., solar panels 3606).

4D Control of Heat and Micro-magnetic Fields allows physical control of the Space Tether (e.g., tether 3602) including partial lock down as a solid rod, temporary flexibility or even limited manipulation.

Strain and motion sensors along with 4D micro-control can monitor and provide automatic response to conditions along the Tether/Elevator. For example unusual strains caused by weather turbulence are sensed then automatically respond to with stronger magnetic fields, increased flexibility, or lock down in parts of the Tether/Elevator as needed.

The disclosed features/characteristics of HTS Earth-Space Tethers/Space Elevators are a) a tether can be built from Earth's surface to outer space using a series of HTS Solenoids with magnetic cores, b) the Solenoids use magnetic forces to maintain the Tether's tensile strength and withstand weather stresses and strains much more efficiently and durably that physical materials, c) strain and motion sensors combined with 4D Control of Heat and Micro-magnetic Fields allows automatic monitoring and immediate response to external weather conditions with more or less Tether flexibility, stronger magnetic fields and locking down into a solid rod of magnetic cores in parts or in whole, d) Tether(s) will be built with transport Space Elevators which carry goods and people to and from Earth's surface to outer space, e) the Tether(s) will also conduct electricity collected efficiently from space solar panels back to Earth, and f) Tether/Space Elevator operations will be highly efficient with coolant maintained at low temperatures in outer space, pumped through the Tether to cool HTS, then pumped from Earth back to Space for cooling with power provided by space solar panels.

Propulsion in Fluids

Figure 37A:
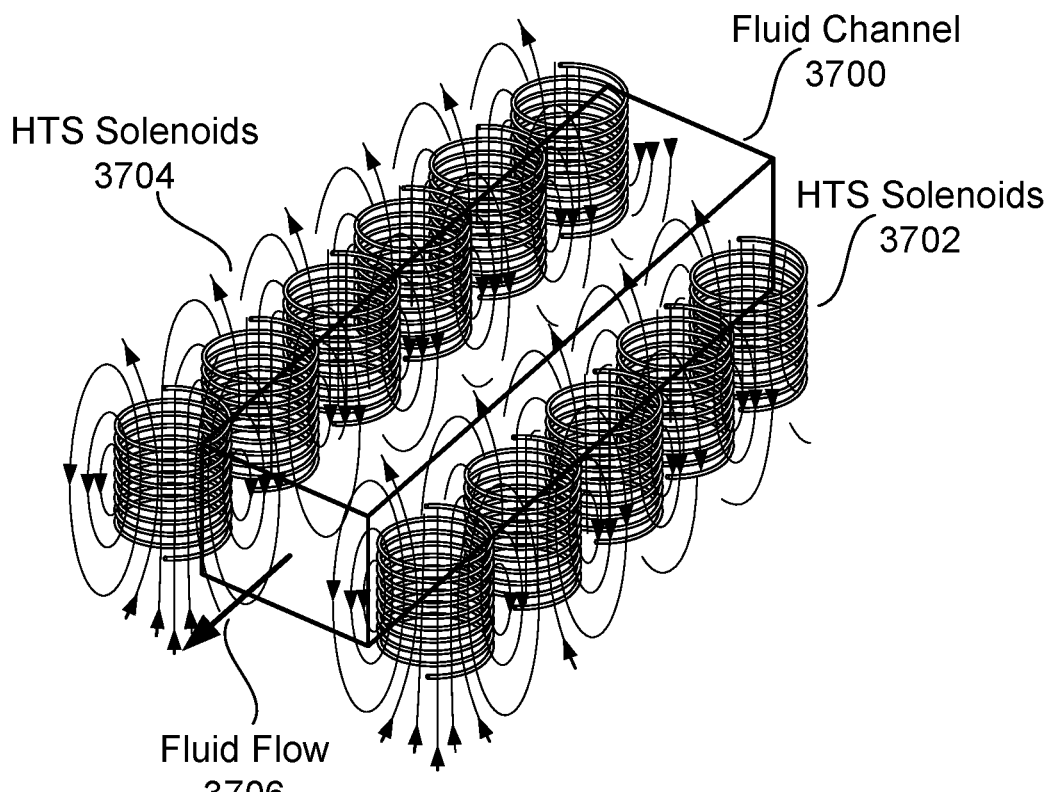
FIGS. 37A-B are diagrams illustrating embodiments of a propulsion system.
Figure 37B:
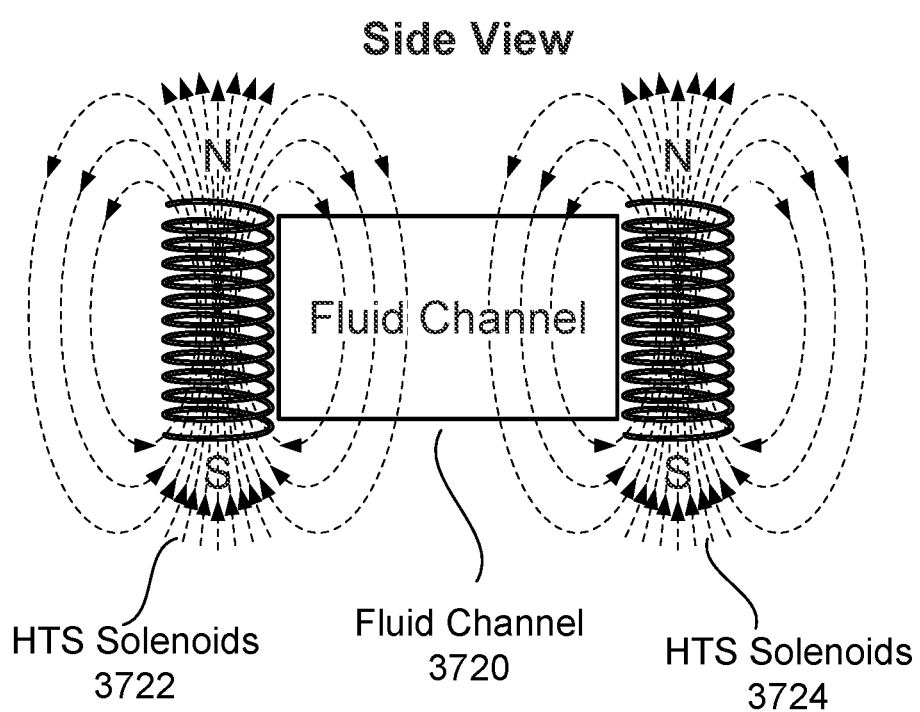

FIGS. 37A-B are diagrams illustrating embodiments of a propulsion system. In the example shown in FIG. 37A, fluid channel 3700 has HTS solenoids 3702 and HTS solenoids 3704 lining two sides. HTS solenoids 3702 and HTS solenoids 3704 enable creating a strong magnetic field in Fluid channel 3700 that can be moved by sequentially flowing current in opposite pairs of solenoids and then having the pairs that are activated be positioned sequentially along fluid channel 3700. A buoyant magnet in fluid channel 3700 would then experience a force as the wave of magnetic field is moved along fluid channel 3700. Direction of fluid flow 3706 is shown of fluid channel 3700. In the example shown in FIG. 37B, fluid channel 3720 has HTS solenoids 3722 and HTS solenoids 3724 lining two sides.

In some embodiments, reinforced HTS can drive submersibles more efficiently in fluids than propellers. Rows of HTS Solenoids with the same polarities are placed on either side of a fluid flow channel along the submersible's or boat's axis. This creates a consistent, controllable magnetic field through which fluid flows along the submersible's or boat's length.

Figure 38A:
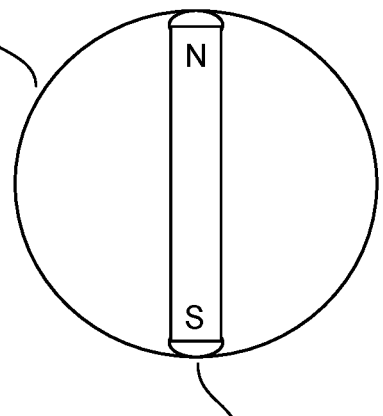
FIG. 38A-B are diagrams illustrating embodiments of a buoyant magnet.
Figure 38B:
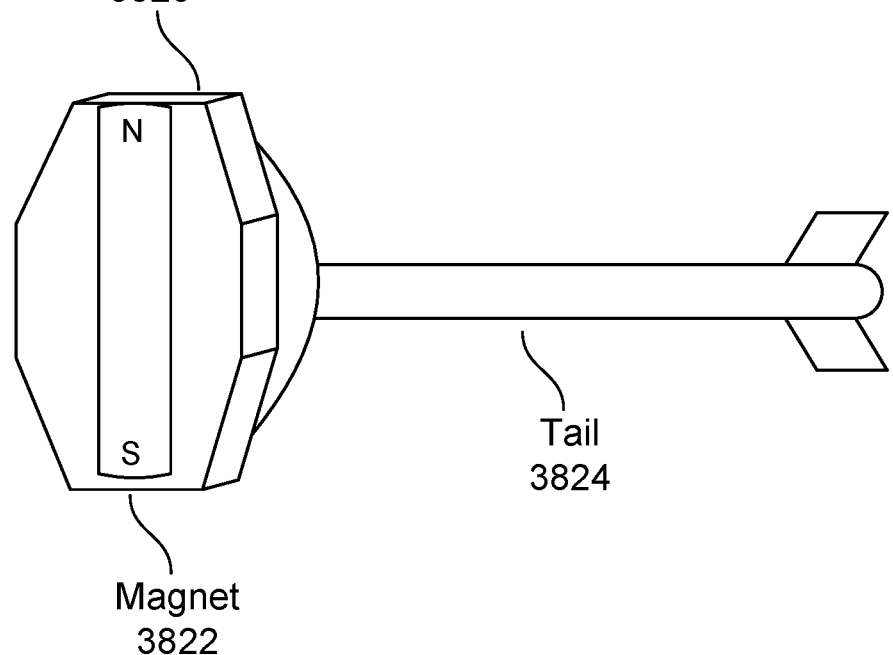

FIG. 38A-B are diagrams illustrating embodiments of a buoyant magnet. In the example shown in FIG. 38A, magnetic propulsion ball 3800 includes magnet 3802 with N-S poles disposed in a ball. The remaining interior space is filled or not filled with material to make magnetic propulsion ball slightly buoyant, neutrally buoyant, slightly non-buoyant, or any other appropriate density relation to the fluid surrounding magnetic propulsion ball. In the example shown in FIG. 38B, magnetic propulsion plate 3820 includes magnet 3822 with N-S poles disposed in a ball. In various embodiments, magnet 3822 comprises a ferromagnetic material, a rare earth magnetic material, or any other magnetic material. The remaining interior space of face plate 3820 and tail 3824 are filled or not filled with material to make magnetic propulsion plate slightly buoyant, neutrally buoyant, slightly non-buoyant, or any other appropriate density relation to the fluid surrounding magnetic propulsion plate. Tiny magnetized propulsion balls or plates with stabilizing tails are distributed in the fluid channels. Individual balls/plates can be neutral or slightly +/− buoyant to aid retrieval.

Figure 39:
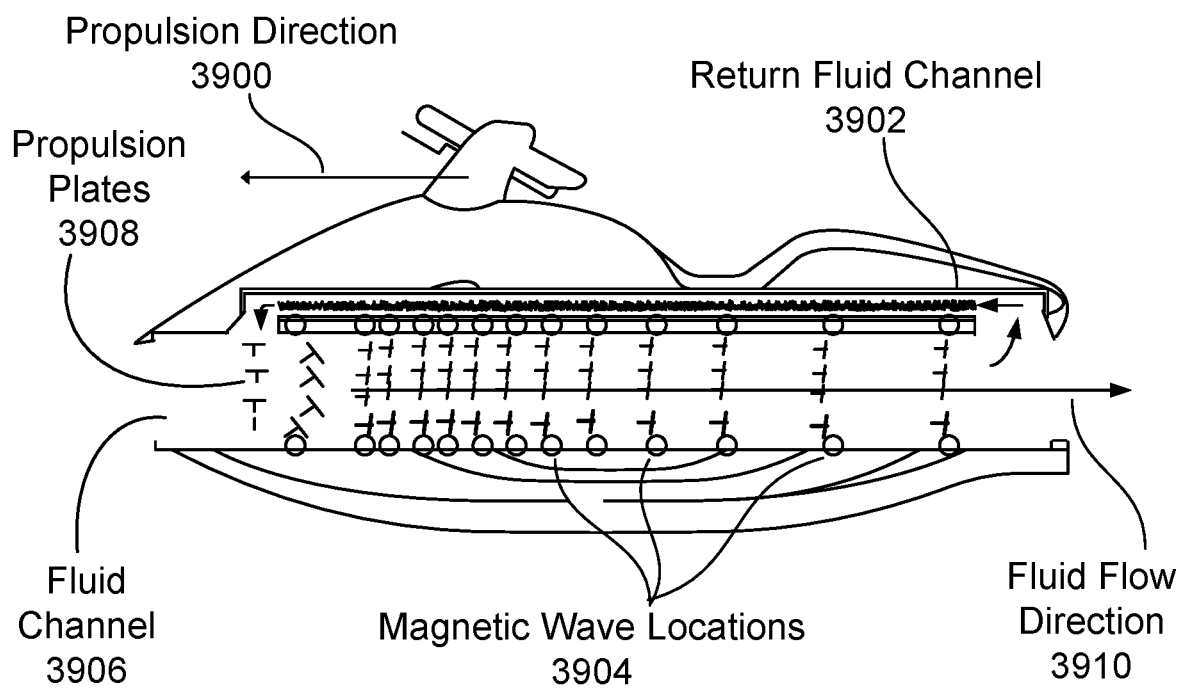
FIG. 39 is a diagram illustrating an embodiment of a propulsion system.

FIG. 39 is a diagram illustrating an embodiment of a propulsion system. In the example shown, a water craft includes fluid channel 3906 in which propulsion plates 3908 are moved through fluid channel 3906 by moving magnetic wave locations 3904 to cause fluid to flow in fluid flow direction 3910. Propulsion plates 3908 return by return fluid channel 3902 that is magnetically shielded to be used again for propulsion in propulsion direction 3900.

In some embodiments, propulsion balls and/or plate faces (e.g., of propulsion plates 3908) will align when in a magnetic field. When a magnetic field is pulsed by turning on/off successive pairs of solenoids in the rows, the pulse wave forces the balls/plates against the fluid, pushing it out to the stern. This will create propulsion driving the submersible or watercraft forward. The balls/plates are kept aligned by a) the briefness of the pulse which compresses the balls/plates together, and b) inter-ball/plate attraction from induced magnetic polarity. At the stern, where the magnetic field stops, the balls/plates will demagnetize, lose alignment and disperse. They will be collected with electro-magnets/buoyancy for transport and reuse back to the bow through a 2nd magnetically shielded fluid channel (e.g., return fluid channel 3902) powered by backwash from main fluid channel (e.g., fluid channel 3906).

The disclosed features/characteristics of HTS Propulsion in Fluids are a) submersibles can move in fluids without propellers, b) rows of HTS Solenoids arrayed along the submersible are used with a number of small Magnetic Propulsion Balls and/or Plates in a bow to stern fluid channel to c) create synchronized magnetic pluses through 4D Magnetic Control which drive the Balls/Plates from bow to stern along the fluid channel pushing the fluid back and the submersible forward, and d) the Balls/Plates are collected at the stern then returned to the bow through a fluid back channel for reuse.

HTS Projectile Launching

Figure 40:
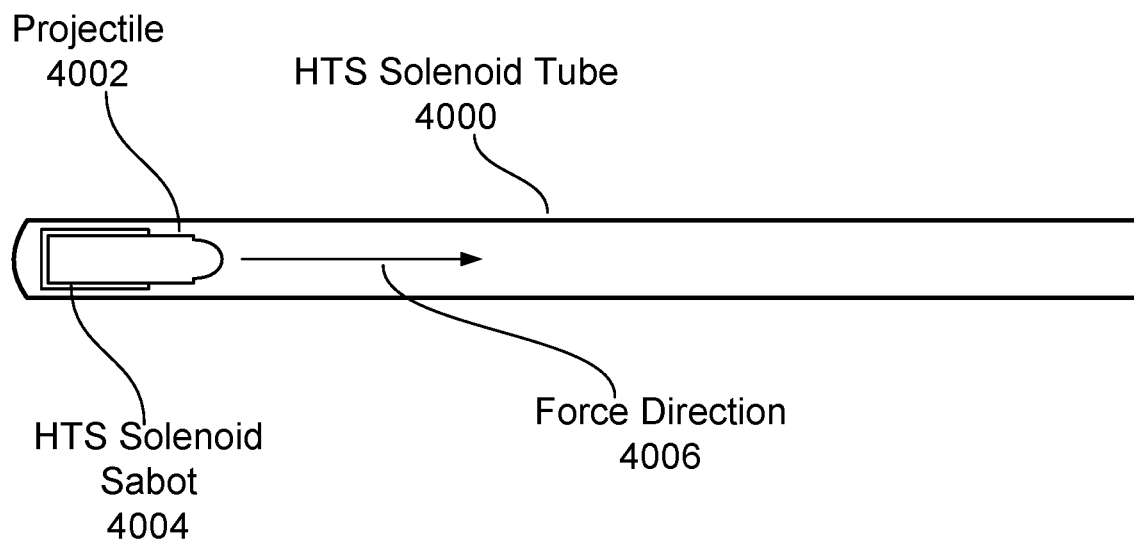
FIG. 40 is a diagram illustrating an embodiment of a projectile launching system.

FIG. 40 is a diagram illustrating an embodiment of a projectile launching system. In the example shown, HTS solenoid tube 4000 comprises a hollow tube with projectile 4002 in HTS solenoid sabot 4004 comprising a HTS solenoid. Reinforced HTS Solenoids (e.g., HTS solenoid tube 4000 and HTS solenoid sabot 4004) can be used to fire projectiles out of a tube without explosives. This involves building HTS solenoid tube 4000 out of a hollow, rifled HTS solenoid and placing projectile 4002 in HTS solenoid sabot 4004 made out of another hollow HTS Solenoid. 4D Control of Micro-magnetic fields is used to generate magnetic fields with opposite polarity between the two HTS Solenoids. The controlled magnetic repulsion between the two HTS Solenoids will force projectile 4002 out of HTS solenoid tube 4000 at high speed. This embodiment would be especially useful in outer space where temperatures are naturally low enough for superconductivity, and where one-time use rocket fuel/chemical explosives are expensive to transport, and/or in confined areas where explosive propulsion is dangerous such as in submersibles, ships, and vehicles. In some embodiments, HTS solenoid tube 4000 and/or HTS solenoid sabot 4004 include a current source for maintaining a current to create a magnetic field.

The disclosed features/characteristics of HTS Projectile Launching are a) using HTS magnetic fields to launch projectiles rather than chemical explosives by b) placing a projectile in an HTS Solenoid coil sabot within a long rifled HTS Solenoid tube, c) using 4D Control of Micro-Magnetic fields to create strong magnetic fields with opposing polarities between the two HTS Solenoids, which will d) force the Projectile out of the tube at great speed.

Figure 41:
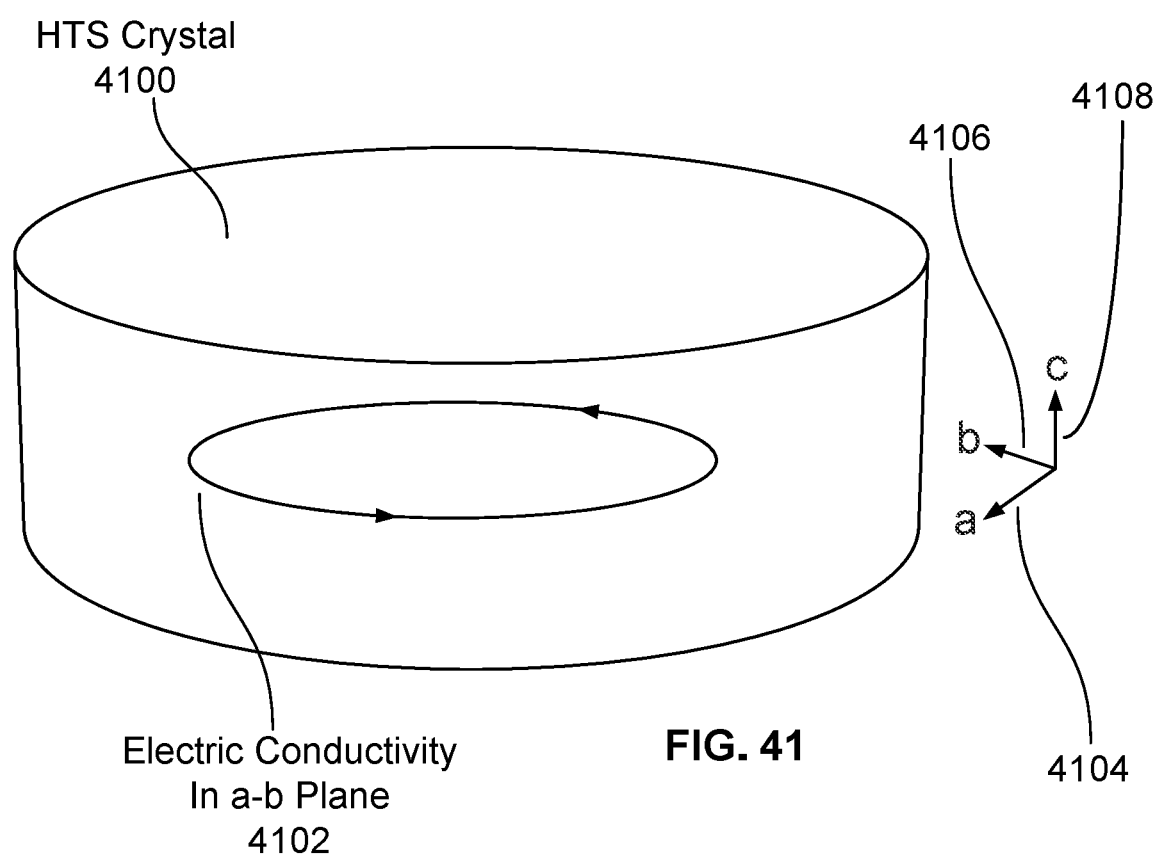
FIG. 41 is a diagram illustrating an embodiment of a HTS crystal.

A Method to Create Superconductors with Long Conducting Axis Using Longitudinal Seed Crystals FIG. 41 is a diagram illustrating an embodiment of a HTS crystal. In the example shown, HTS crystal 4100 has three axes (e.g., a-axis 4104, b-axis 4106, and c-axis 4108). Superconductivity for HTS crystal 4100 occurs only in an a-b plane (e.g., electric conductivity in a-b plane 4102).

For most HTS applications superconductivity along a longitudinal axis is needed similar to how electric currents travels along a metallic wire. But current bulk HTS batch processing production relies on crystal growth from a seed crystal along its c-axis.

Figure 42:
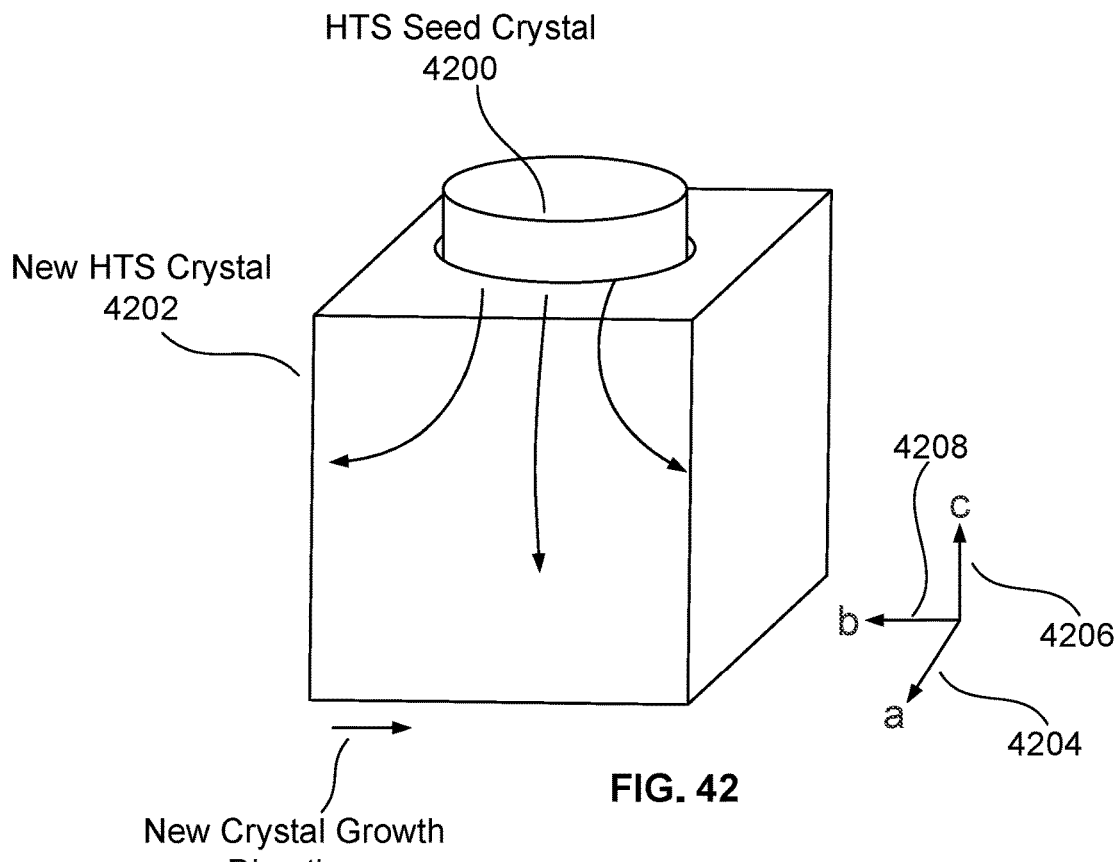
FIG. 42 is a diagram illustrating an embodiment of a seed crystal placed along c-axis.

FIG. 42 is a diagram illustrating an embodiment of a seed crystal placed along c-axis. In the example shown, HTS seed crystal 4200 is placed on top (e.g., above new HTS crystal 4202 along c-axis 4206) of the growing new HTS Crystal 4202. Crystal growth in the example is in new crystal growth direction 4210. Superconducting current travels in the planes defined by a-axis 4204 and b-axis 4208.

Continuous production methods described previously create a long HTS crystal with a longitudinal c-axis. Superconductivity is limited to the short radial distance from the crystal's center to its sides as shown by the red arrows below—in other words within a given a-b plane.

Figure 43:
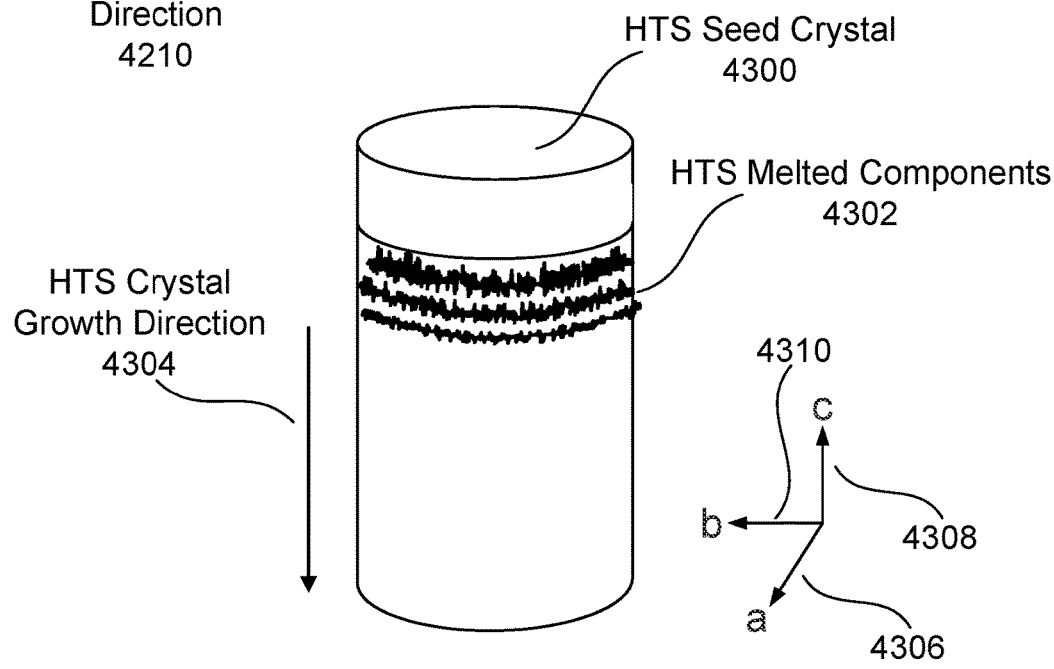
FIG. 43 is a diagram illustrating an embodiment of a seed crystal placed along c-axis.

FIG. 43 is a diagram illustrating an embodiment of a seed crystal placed along c-axis. In the example shown, HTS seed crystal 4300 is placed on top (e.g., above HTS melted components 4302 along c-axis 4308) of the growing new HTS Crystal. Crystal growth in the example is in HTS crystal growth direction 4304. Superconducting current travels in the planes defined by a-axis 4306 and b-axis 4310.

Figure 44:
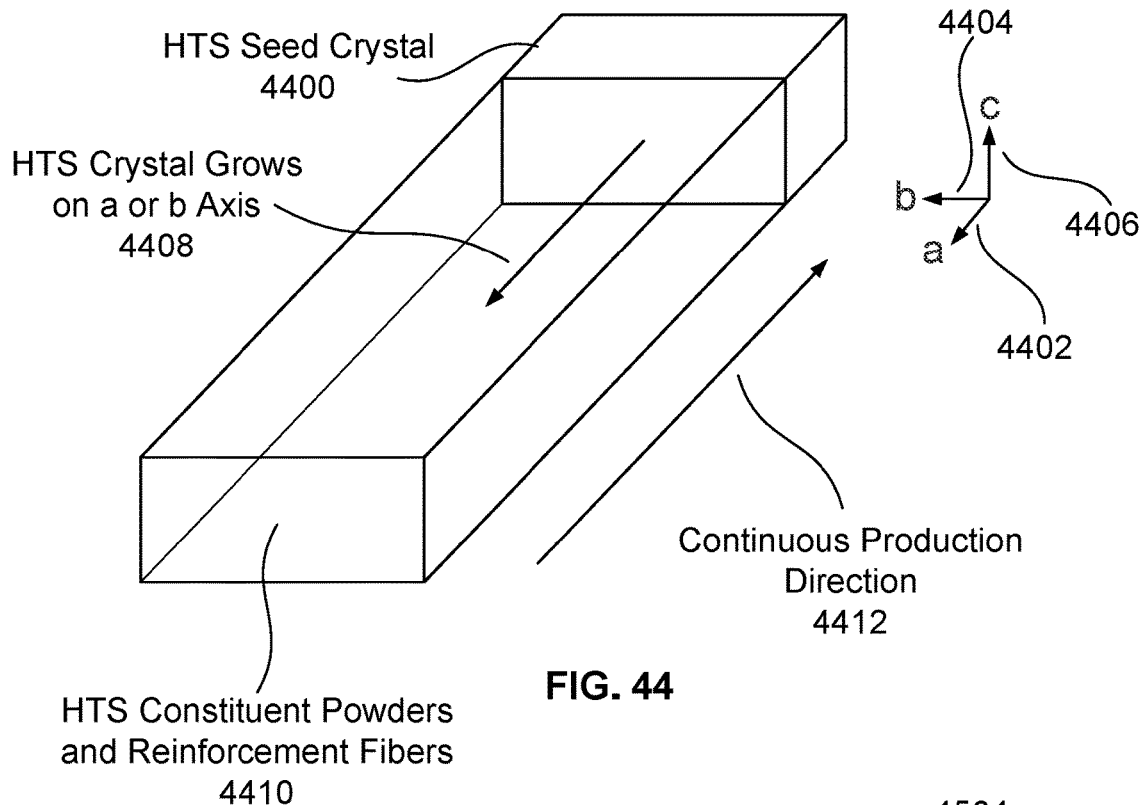
FIG. 44 is a diagram illustrating an embodiment of a seed crystal placed along a axis or b axis.

FIG. 44 is a diagram illustrating an embodiment of a seed crystal placed along a axis or b axis. In the example shown, a fiber reinforced HTS crystal (e.g., HTS crystal grows on a or b axis 4408 from HTS constituent powders and reinforcement fibers 4410 in continuous production direction 4412) is grown with a longitudinal a-b plane (e.g., where a-b plane is defined along a-axis 4402 and b-axis 4404) by placing a longitudinal seed crystal (e.g., HTS seed crystal 4400) at one lateral end of the intended crystal with conducting a-b plane in the lateral plane of intended crystal growth. The seed crystal's c-axis (e.g., along direction of c-axis 4406) would be perpendicular to the plane of intended crystal growth. The resulting HTS wire/tape will be much stronger for physical manipulation such as winding, and can carry much more current than exiting solutions using Powder-in-tube (PIT) or Coated HTS materials.

Figure 45:
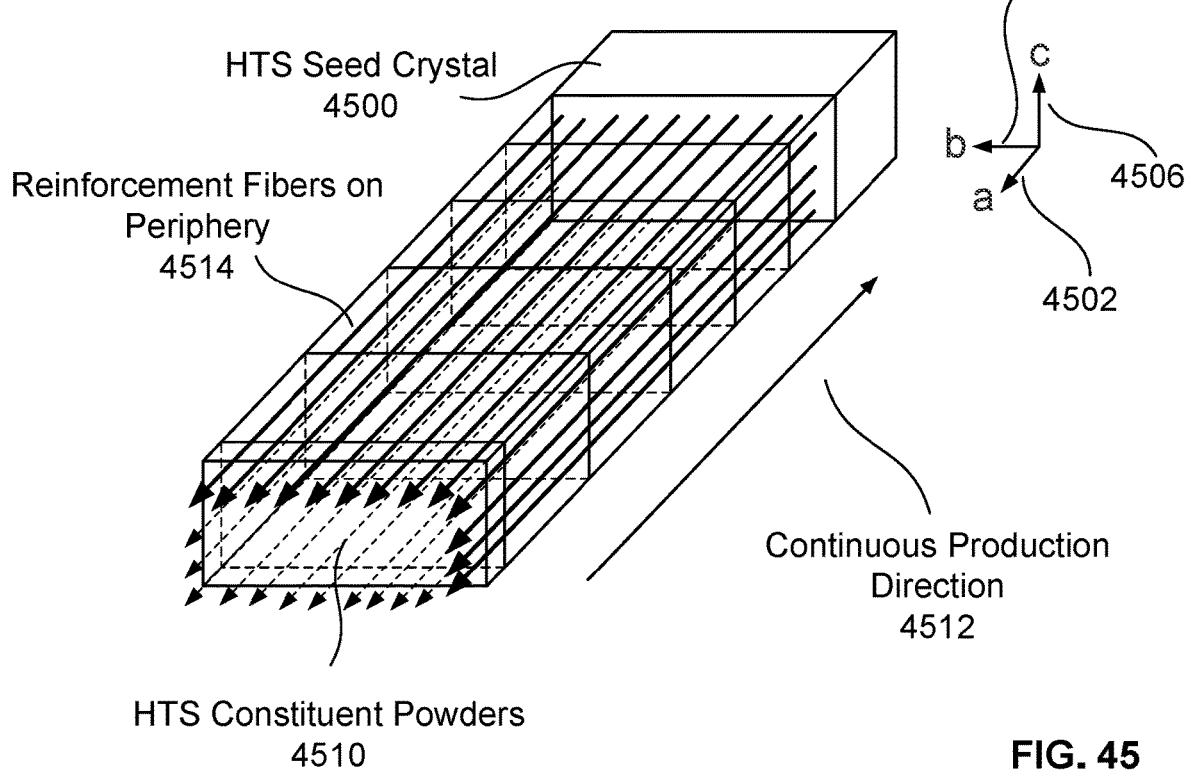
FIG. 45 is a diagram illustrating an embodiment of a seed crystal placed along a axis or b axis.

FIG. 45 is a diagram illustrating an embodiment of a seed crystal placed along a axis or b axis. In the example shown, a fiber reinforced HTS crystal (e.g., HTS crystal grows on a or b axis from HTS constituent powders 4510 and reinforcement fibers on periphery 4514 in continuous production direction 4512) is grown with a longitudinal a-b plane (e.g., where a-b plane is defined along a-axis 4502 and b-axis 4504) by placing a longitudinal seed crystal (e.g., HTS seed crystal 4500) at one lateral end of the intended crystal with conducting a-b plane in the lateral plane of intended crystal growth. The seed crystal's c-axis (e.g., along direction of c-axis 4506) would be perpendicular to the plane of intended crystal growth. The longitudinal seed crystal (e.g., HTS seed crystal 4500) also permits fiber reinforcement of HTS along the edges or periphery of the HTS crystal (e.g., reinforcement fibers on periphery 4514). This will allow HTS production even at high fiber densities which normally interfere with crystal formation. This is because HTS crystal will grow in the interior where there are few or no fibers to interfere with crystal growth. Yet the fibers placed densely on the edges will give the HTS the benefits of strength and internal heat/current conduction properties from fiber reinforcement.

Longitudinal seed crystal and fiber reinforcement will allow HTS to be produced by continuous production. This will lower HTS cost leading to wider use in applications.

The disclosed features/characteristics of creating superconductors with long conducting axis using longitudinal seed crystal are: a) using a seed crystal with conducting a-b axes parallel to the intended direction/plane of intended HTS crystal growth, b) which allows fiber reinforcement at HTS edges at densities above that which may interfere with crystal formation, c) HTS can be produced continuously as crystal is automatically seeded from the proceeding formed crystal and d) the HTS will be cheaper, stronger, higher capacity, and more capable of 4D Control of Heat and Micro-magnetic Fields than PIT and Coated HTS wires and tapes.

Methods to Support Earth-Space Tethers

Efforts to build Earth-Space Tethers which connect geostationary satellites, platforms, and other structures are prevented by the need for the Tether to support the force of Earth's gravitation on its own weight until geostationary altitude at approximately 36,000 km. This requires materials with high specific strength (ratio of strength to weight). It also requires that the diameter of the Tether be much larger at geostationary altitude than at the Earth's surface. Nearly all known materials do not have sufficient specific strength for a Tether that will not result in an impractically large Tether diameter at geostationary altitude.

Carbon nanotubes and other variants of carbon graphene (henceforth referred to collectively as graphene) have been suggested as theoretically having sufficient specific strength to do support its own weight up to geostationary altitude without an impractically large magnification in diameter. However so far no graphene have been made longer than one meter, far short of the 36,000 km. required.

A number of applications for the support of a Tether connecting Earth's surface with objects in geostationary orbit are disclosed.

Previous studies assumed that a Space Tether would be supported by the specific tensile strength of graphene alone requiring a continuous graphene crystal tether from earth to the 36,000 km altitude of geo-stationary orbit. Short segments of carbon nanotubes and other graphene materials can be used to build an Earth-Space Tether if the weight of the Tether could be partially supported by means other than the tensile strength of the Tether itself. This would offset part of the gravitational weight of the Tether reducing the tensile strength required through the Tether. This would both reduce the specific strength of the Tether material, as well as allow the use of joined segments of graphene since the joints would need to support less tensile strength.

Figure 46:
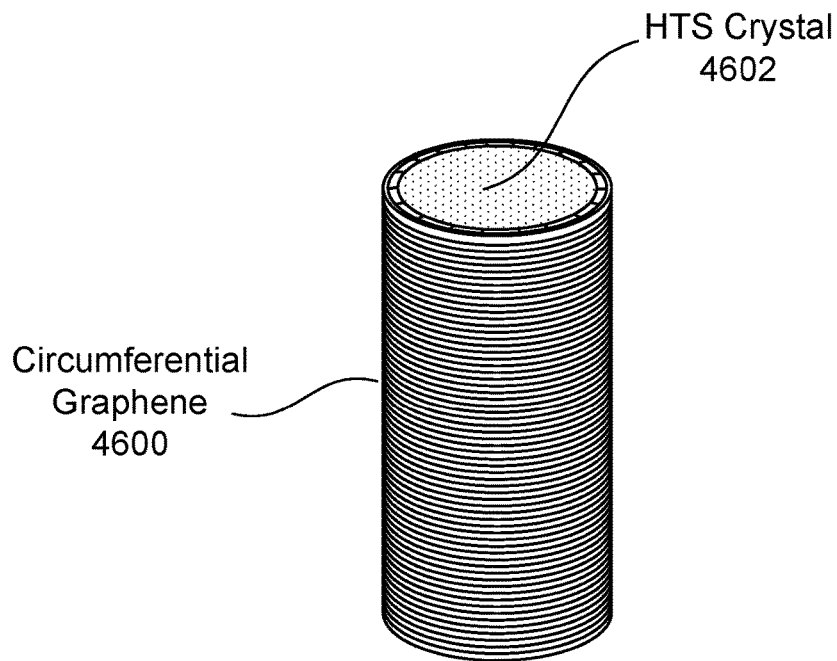
FIG. 46 is a diagram illustrating an embodiment of a tether.

FIG. 46 is a diagram illustrating an embodiment of a tether. In the example shown, HTS crystal 4602 is within circumferential graphene 4600. Graphene has high tensile strength but low compression strength. Ceramics such as High Temperature Superconductors (HTS) have high compression strength but low tensile strength.

Figure 47:
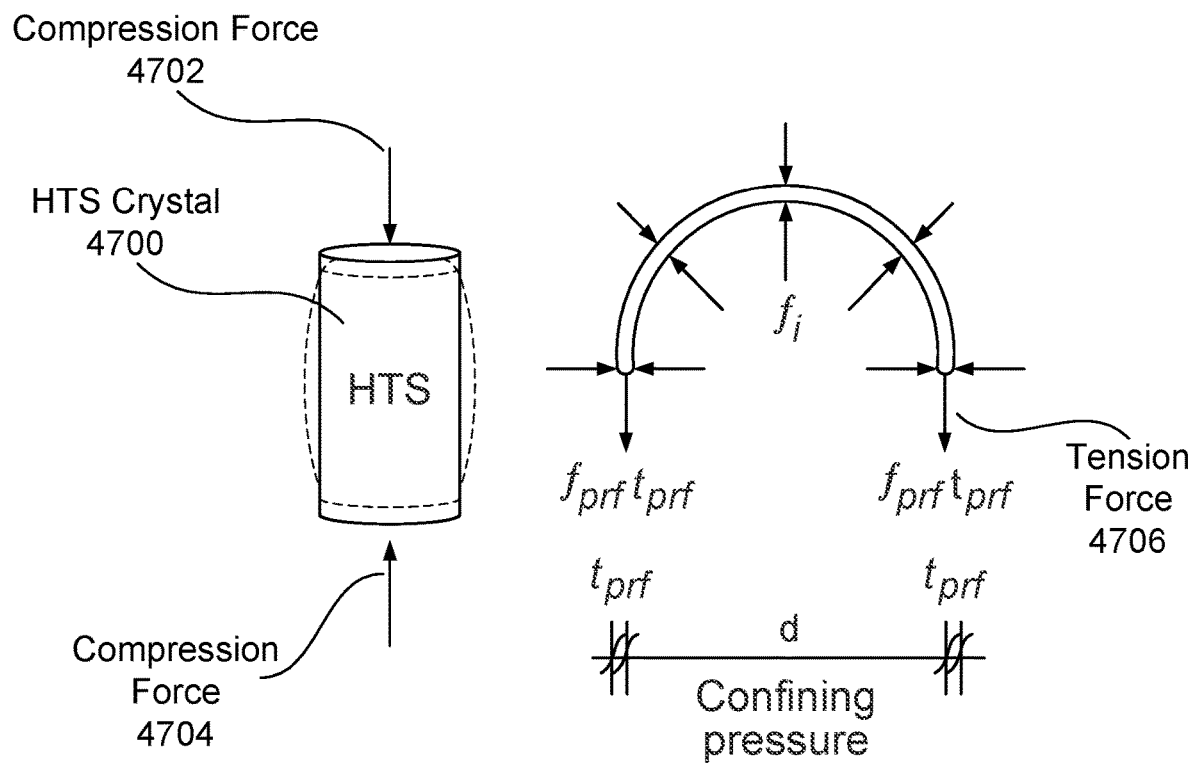
FIG. 47 is a diagram illustrating an embodiment of a tether.

FIG. 47 is a diagram illustrating an embodiment of a tether. In the example shown, HTS crystal 4700 is within circumferential graphene. When HTS crystal 4700 is placed vertically in circumferential graphene that forms a tube surrounding HTS crystal 4700, the weight of HTS crystal 4700 causes the diameter of HTS crystal 4700 to expand pushing out against circumferential graphene (e.g., compression force 4702 and compression force 4704 causes outward force ($f_t$) from HTS crystal 4700). This causes circumferential tension in the graphene (e.g., tension force 4706). The graphene's tensile strength acts to prevent the HTS crystal 4602 from expanding thus allowing HTS crystal 4602 to support more weight through compression.

HTS compression relieves some of the weight the graphene needs to support through tension along its length, allowing graphene segments to be used to build Space Tethers.

HTS conducts electric power efficiently with near zero resistance and low weight allowing the transmission of electricity from space to earth. The coldness of space reduces the cost to maintain HTS at superconducting temperatures. HTS compression strength and electricity conductivity will allow geosynchronous structures to be used to generate Space-based Solar Power.

Space-based Solar Power will in turn generate income to finance Earth-Space Tethers, Space Elevators, geosynchronous Space Station and other structures with space exploration, space tourism, climate control as bonuses.

Figure 48:
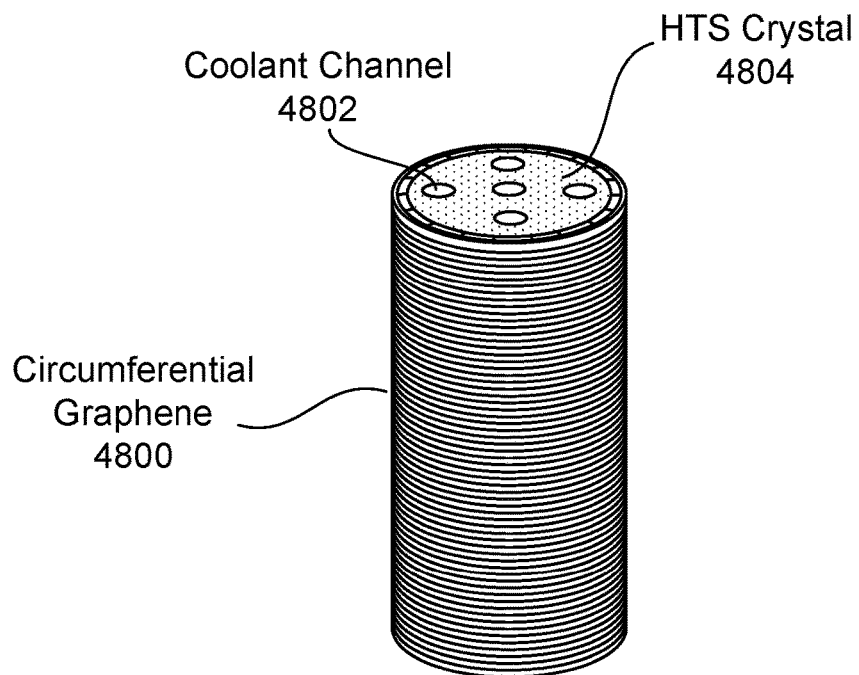
FIG. 48 is a diagram illustrating an embodiment of a tether.

FIG. 48 is a diagram illustrating an embodiment of a tether. In the example shown, HTS crystal 4804 is within circumferential graphene 4800 and also has coolant channels (e.g., coolant channel 4802). In various embodiments, coolant channels 4802 comprise graphene and/or carbon or a carbon compound based heat conducting materials, or any other appropriate heat conducting material. HTS crystal 4804 can be cooled by the flow of coolant such as liquid Nitrogen (N) through vertical channels (e.g., coolant channel 4802) lined with graphene. Liquid N can be cooled in outer space, then pumped down coolant channels to the earth's surface, then recycled back to outer space for re-cooling in a recovery channel. The power needed for liquid N flow can be provided from a space-based solar panel allowing the entire system to be self-sufficient with minimal expenses except for maintenance.

Although in general HTS ceramic is denser than liquid N, confined liquid N will also have compressive strength which will also help support Tether weight especially closer to earth. Liquids do not bond to solids strongly. So freely flowing liquids in a Space Tether will neither be supported by the tensile strength of graphene, nor the compressive strength of HTS crystal 4804 and other solid fillers. Thus as the Tether approaches earth, liquid coolant pressure will rise greatly. At some point this pressure may even surpass the compressive pressure on solid fillers such as HTS crystal 4804, if the HTS crystal 4804 is also supported by graphene tensile strength.

Figure 49:
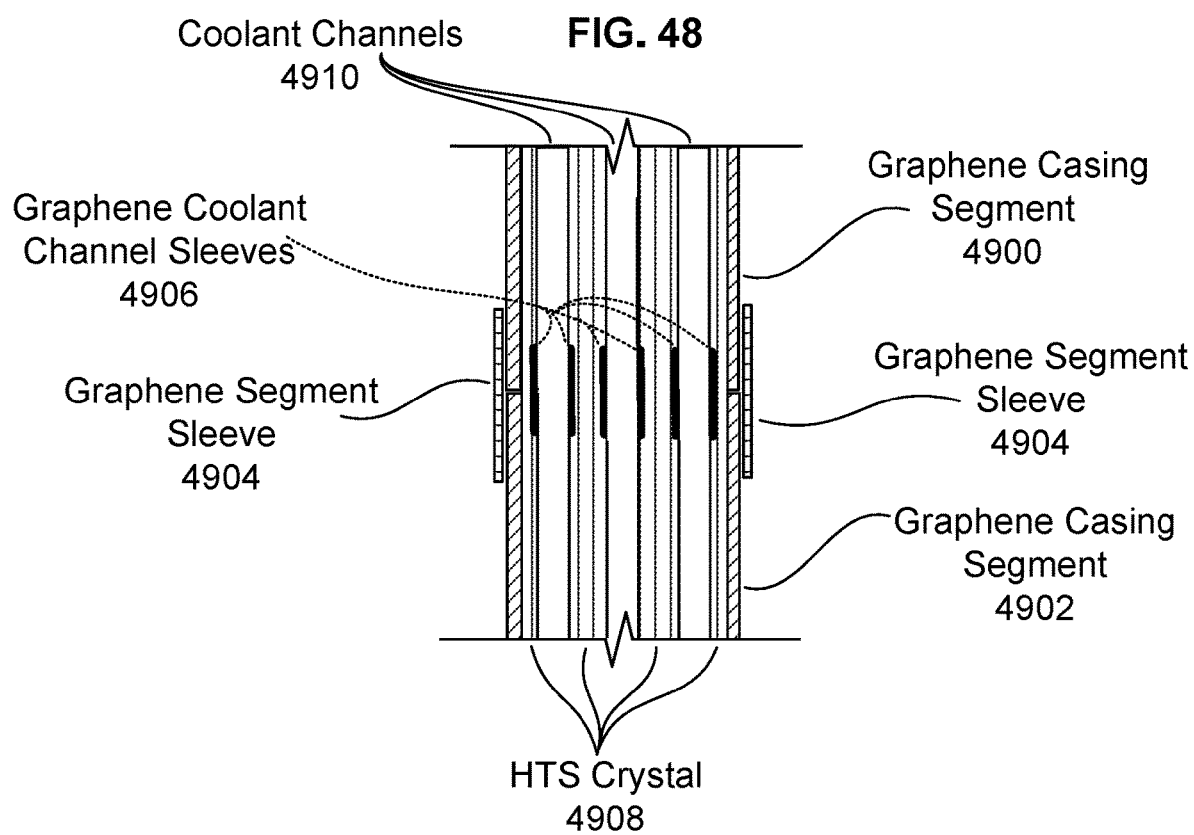
FIG. 49 is a diagram illustrating an embodiment of a tether.

FIG. 49 is a diagram illustrating an embodiment of a tether. In the example shown, HTS crystal 4908, graphene casing segment 4900, and graphene casing segment 4902 are shown in a slice view of the tether. HTS crystal 4908 with coolant channels 4910 is encased within graphene casing segment 4900 and graphene casing segment 4902, which are joined using graphene segment sleeve 4904 on the outer diameter of the circumferential graphene layer. In various embodiments, coolant channels 4910 have no lining between HTS crystal 4908 and the space inside coolant channels 4910, have a lining between HTS crystal 4908 and the space inside coolant channels 4910, have a graphene lining between HTS crystal 4908 and the space inside coolant channels 4910, have a graphene lining with graphene coolant channel sleeves 4906 between HTS crystal 4908 and the space inside coolant channels 4910, or any other lining or lack of lining for coolant channels 4910. Previous studies assumed that a Space Tether would be supported by the specific tensile strength of graphene alone requiring a continuous graphene crystal tether from earth to the 36,000 km altitude of geo-stationary orbit. Compression Strength will offset or partly offset the need for the Tether to be supported by graphene tensile strength alone. There will be less stress on the Tether which will allow it to be constructed out of shorter segments as long as the attachment of each segment to another is of sufficient strength to bear the Tether stress at that point. Attachments of sufficient strength can be made using sleeves of graphene (e.g., graphene segment sleeve 4904) to connect segments. In some embodiments, the attaching material between the graphene sleeve (e.g., graphing segment sleeve 4904) and casing (e.g., graphene casing segment 4900 or graphene casing segment 4902) could be atomic carbon or other substances.

The disclosed features/characteristics are a) that Compression Strength can be used to reduce the need for continuous, long graphene to build Earth-Space Tethers for Space Elevators, geosynchronous Space Stations and other structures by allowing the use of graphene segments, b) the use of HTS Compression Strength also allows the efficient transmission of electric power from space to earth, which c) will improve the feasibility of building Space Elevators for geosynchronous Space Stations and other structures.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device, comprising:
a tether comprising a plurality of HTS solenoids and a tensile load bearing outer sheath, wherein a solenoid of the plurality of HTS solenoids comprises a high temperature superconducting material and reinforcing fiber, wherein the outer sheath comprises a plurality of alternating outer sheath rigid sections and outer sheath pliable sections, wherein the plurality of HTS solenoids are encased within the outer sheath rigid sections.

2. A device of claim 1, wherein the plurality of HTS solenoids are alternately of opposing polarity.

3. A device of claim 1, wherein the plurality of HTS solenoids are aligned in polarity.

4. The composition of claim 1, wherein the high temperature superconducting material of the solenoid comprises one or more of the following: a ceramic material, a copper oxide material, a rare earth copper oxide material (RE)BCO (e.g., $(RE)Ba_2Cu_3O_7$), an iron arsenide material, an iron selenide material, a LaBaCuO material, a LaSrCuO material, a LaSrCaCuO material, a YBaCuO material, a BiSrCaCuO material, a TiBaCaCuO material, a HgBACaCuO material, a HgTiBaCaCuO material, a LnFeAs(O,F) material, a (Ba, K, Li, Na)FeAs material, a FeSe material, a MgB material, a BKBO material, a RbCsC material, a YbPdBC material, and/or a NbGe material.

5. The composition of claim 4, wherein a reinforcing fiber of the solenoid comprises one or more of the following: Silicon (Si), Silicon Carbide (SiC), Silicon Nitride ($Si_3N_4$), Silicates including Silicon Dioxide (SiO2), Boron (B), Boron Carbide ($B_4C$), Boron Nitride (BN), Chromium (Cr), Chromium Carbides ($Cr_3C_2$, $Cr_7C_3$, $Cr_{23}C_6$), Chromium Nitrides (CrN, $Cr_2N$), Hafnium Carbide (HfC), Zirconium Carbide (ZrC), Zirconium Nitride (ZrN), Zirconium Diboride ($ZrB_2$), Titanium (Ti), Titanium Carbide (TiC), Titanium nitride (TiN), Tungsten Carbide (WC), Aluminum (Al), Alumina ($Al_2O_3$), Aluminum Carbide ($Al_4C_3$), Aluminum Nitride (AlN), Titanium Aluminum Nitride (TiAlN), and/or Aluminum Titanium Nitride (AlTiN).

6. A device of claim 1, wherein the tether comprises a plurality of segments, wherein a segment of the plurality of segments comprises an HTS solenoid of the plurality of HTS solenoids, wherein the tether is configured for a bending force to be introduced by selective magnetic polarization of a pair of adjacent solenoids, and wherein the bending force causes an overall bending of the tether.

7. A device of claim 6, wherein the tether further comprises bending sensors.

8. A device of claim 7, wherein the tether further comprises feedback control of the bending using the bending sensors.

9. A device of claim 1, further comprising coolant pathways.

10. A device of claim 1, further comprising electrical conductors for power transmission.

11. A device of claim 1, wherein the tether is coupled to a cooling array.

12. A device of claim 1, wherein the tether is coupled to a solar panel.

\* \* \* \* \*